(12) United States Patent
Perry et al.

(10) Patent No.: US 12,184,001 B2
(45) Date of Patent: Dec. 31, 2024

(54) ULTRA SLIM MODULE FORM FACTOR AND CONNECTOR ARCHITECTURE FOR INLINE CONNECTION

(71) Applicant: Intel Corporation, Santa Clara, CA (US)

(72) Inventors: Richard S. Perry, Portland, OR (US); Robert Schum, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 858 days.

(21) Appl. No.: 17/134,098

(22) Filed: Dec. 24, 2020

(65) Prior Publication Data

US 2021/0119361 A1    Apr. 22, 2021

(51) Int. Cl.
| | | |
|---|---|---|
| *H01R 12/00* | (2006.01) | |
| *H01R 12/70* | (2011.01) | |
| *H01R 12/71* | (2011.01) | |
| *H01R 13/6581* | (2011.01) | |
| *H01R 13/6595* | (2011.01) | |

(52) U.S. Cl.
CPC ....... *H01R 12/714* (2013.01); *H01R 12/7047* (2013.01); *H01R 12/7052* (2013.01); *H01R 12/7082* (2013.01); *H01R 13/6581* (2013.01); *H01R 13/6595* (2013.01)

(58) Field of Classification Search
CPC .. H05K 5/0026; H01R 12/74; H01R 12/7047; H01R 12/7052; H01R 12/7082; H01R 12/6581; H01R 12/6595
See application file for complete search history.

(56) References Cited

U.S. PATENT DOCUMENTS

| | | | |
|---|---|---|---|
| 6,612,851 B1 | 9/2003 | Goodwin et al. | |
| 8,690,589 B2 * | 4/2014 | Ngo | H01R 12/721 439/79 |
| 9,172,165 B1 | 10/2015 | Sass et al. | |
| 11,445,610 B2 * | 9/2022 | Seo | H05K 1/142 |

(Continued)

FOREIGN PATENT DOCUMENTS

| | | |
|---|---|---|
| CN | 203660127 U | 6/2014 |
| CN | 205355308 U | 6/2016 |

(Continued)

OTHER PUBLICATIONS

Extended European Search Report for Patent Application No. 21198687.2, Mailed Mar. 16, 2022, 13 pages.

*Primary Examiner* — Hoa C Nguyen
(74) *Attorney, Agent, or Firm* — Compass IP Law PC

(57) ABSTRACT

A board-to-board connector includes electrical leads to bridge from one board to another board, to interconnect pads on one surface of the boards. The boards can interconnect while aligned in substantially the same plane with an inline connector. The connector includes a lead frame having the electrical leads and the connector includes an alignment frame to hold the lead frame. The connector includes a conductive case to secure over the alignment frame. The connector includes screw holes to allow screws to secure the connector in place against the boards and ensure electrical connection between the pads on the two boards through the electrical leads of the connector. The alignment frame includes posts to mate with alignment holes in the boards.

31 Claims, 32 Drawing Sheets

(56) References Cited

U.S. PATENT DOCUMENTS

| | | | | |
|---|---|---|---|---|
| 2016/0047844 A1* | 2/2016 | Wang | ............... | H05K 3/225 |
| | | | | 29/837 |
| 2017/0005422 A1 | 1/2017 | So et al. | | |
| 2019/0317567 A1 | 10/2019 | Schnell et al. | | |
| 2020/0089289 A1 | 3/2020 | Keilers et al. | | |
| 2023/0125645 A1* | 4/2023 | Yin | ............... | H01R 12/716 |
| | | | | 439/108 |

FOREIGN PATENT DOCUMENTS

| | | |
|---|---|---|
| EP | 1715552 A1 | 10/2006 |
| EP | 2555600 A1 | 2/2013 |
| WO | 2009111441 A1 | 9/2009 |
| WO | 2010094007 A1 | 8/2010 |

* cited by examiner

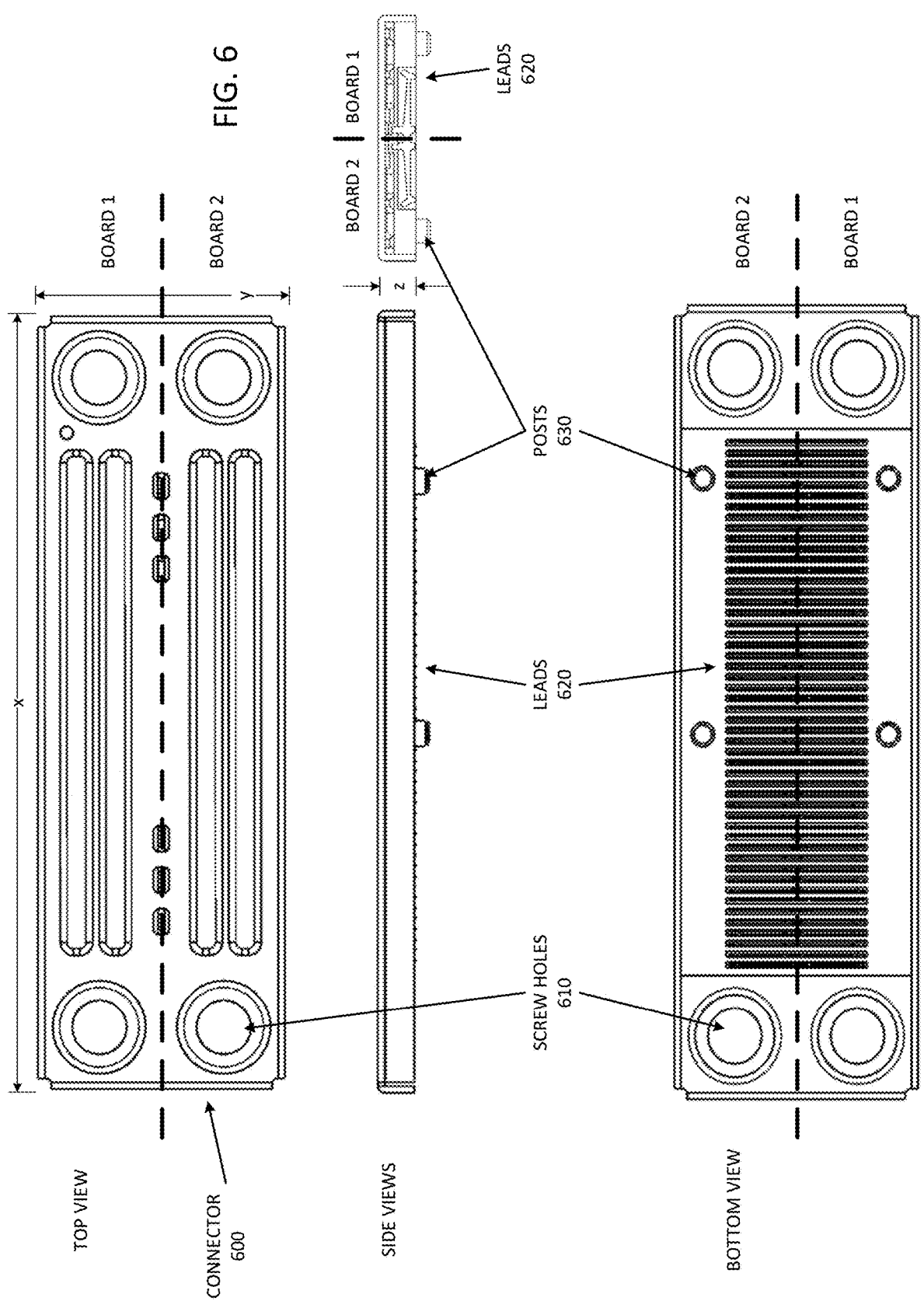

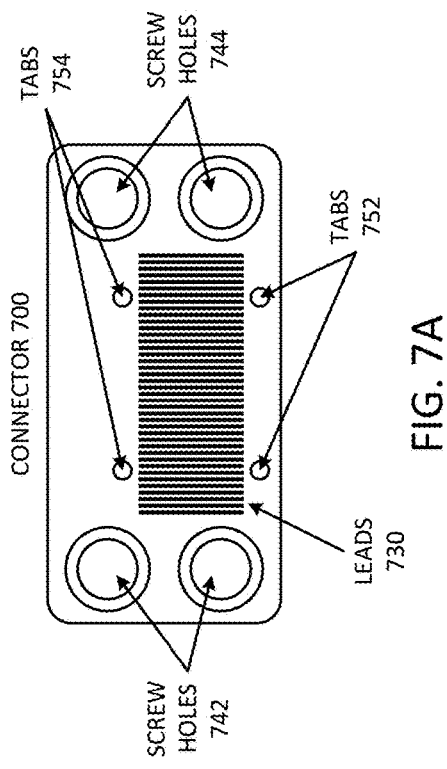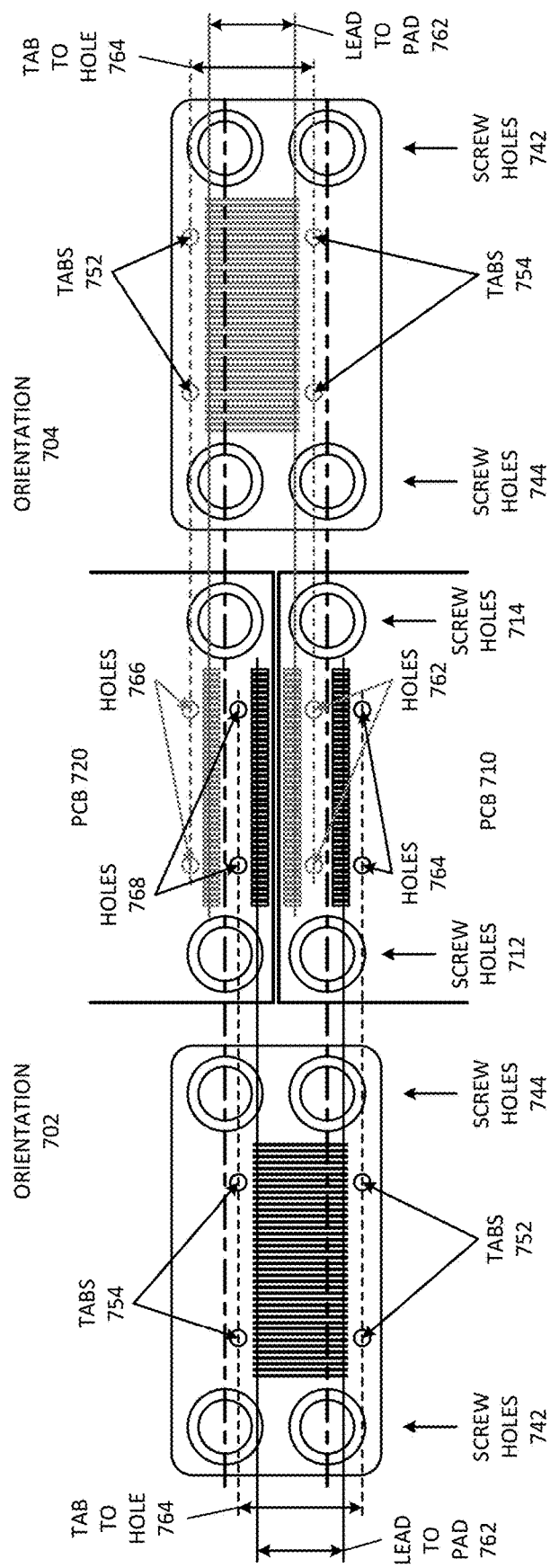
FIG. 7A
FIG. 7B

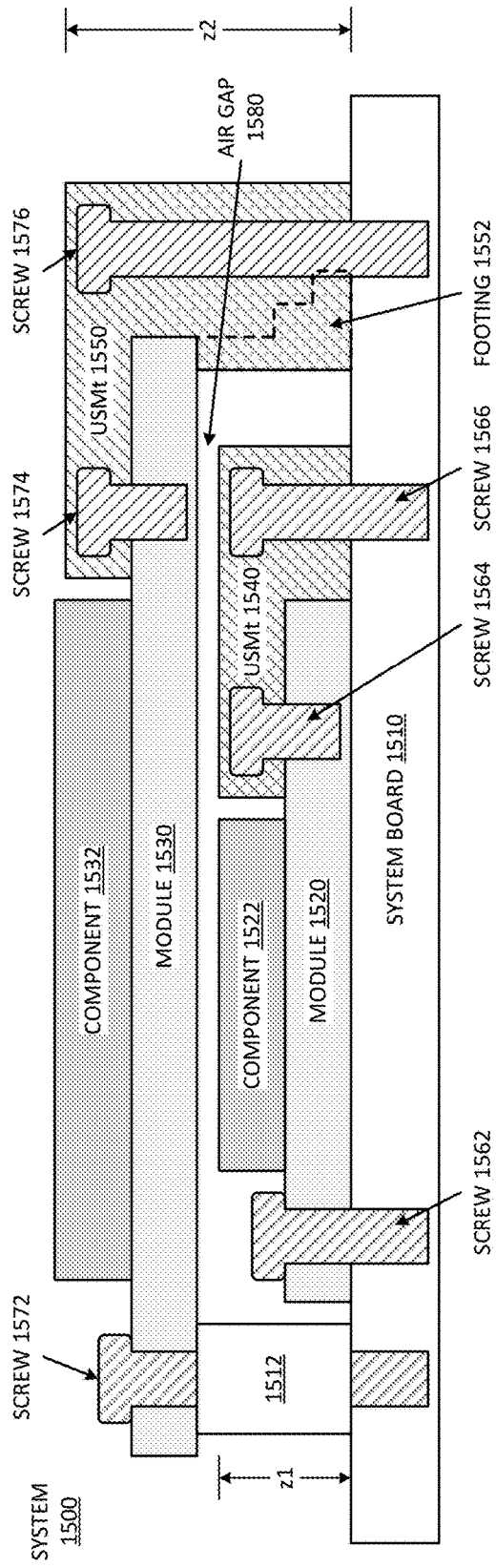
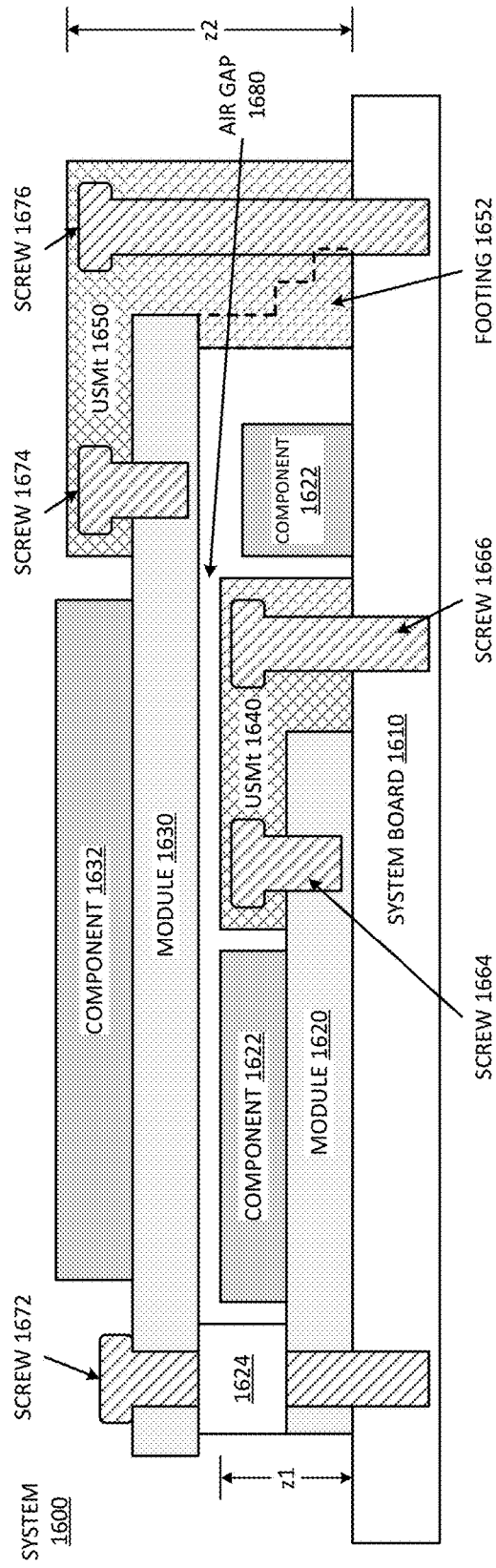

ULTRA SLIM MODULE FORM FACTOR AND CONNECTOR ARCHITECTURE FOR INLINE CONNECTION

FIELD

Descriptions are generally related to interconnects, and more particular descriptions are related to architectures for an ultra slim board to board connector.

BACKGROUND

Consumer demand is increasing for smartphone, tablet, and very slim computing devices. The demand is even driving traditional laptop design to adopt sleeker profiles. Such devices have been designed with a motherboard or primary system printed circuit board (PCB) that includes the host processor and system memory, and add-in boards to provide certain peripherals. The use of add-in boards allows a more modular design to use different components for different models of devices (e.g., the amount of storage or the type of wireless connectivity).

Connecting the add-in boards to the motherboard has traditionally led to unwanted system EMF (electromagnetic frequency) discharge, which complicates system compliance. Traditional solutions for connecting the add-in boards limits the z-dimension or height (e.g., thickness) of the computing device. To the extent such solutions exist, they tend to be custom and costly to manufacture, which is in tension with the desires of high volume manufacturing.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 6 is an example of a representation of an inline USM connector with offset keying features.

FIGS. 7A-7B are diagrams of an example of an inline USM connector that connects to different electrical pads by reversing the USM connector.

FIG. 15 is an example of a system configuration with a top mount USM connector to mount an add-in board above another add-in board directly against a system board with another top mount USM connector.

FIG. 16 is an example of a system configuration with a top mount USM connector to mount an add-in board above another add-in board directly against a system board with another top mount USM connector, where both add-in board are secured with a common mounting screw.

Descriptions of certain details and implementations follow, including non-limiting descriptions of the figures, which may depict some or all examples, and well as other potential implementations.

DETAILED DESCRIPTION

As described herein, in one example, a board-to-board connector is an inline ultra slim module connector (USMi) that has a very low profile to interconnect add-in boards in a computing device. The connector includes electrical leads to bridge from one board to another board, to interconnect pads on one surface of the boards. In one example, the interconnect pads are only on one side of the boards. The boards can interconnect with the inline USM connector while aligned in substantially the same plane.

As described herein, in one example, a board-to-board connector is a top mount ultra slim module connector (USMt) that has a very low profile to interconnect add-in boards in a computing device. The connector includes electrical leads to bridge from one board to another board, to interconnect pads on one surface of the boards. In one example, the interconnect pads are only on one side of the boards. The boards can interconnect when one board is not co-planar with the other board, but has one surface offset from the surface of the board to connect to. The offset can be a thickness of the board or a thickness of the board plus additional space for air gaps or components.

Both the inline USM connector and the top mount USM connector include a lead frame including the electrical leads and an alignment frame to hold the lead frame. Both connectors include a conductive case to secure over the alignment frame. The connectors include screw holes to allow screws to secure the connector in place against the boards and ensure electrical connection between the pads on the two boards through the electrical leads of the connector. The alignment frame includes posts to mate with alignment holes in the boards to key the connectors to the boards and ensure proper alignment of the connector leads with the pads on the boards.

Figure 1A:
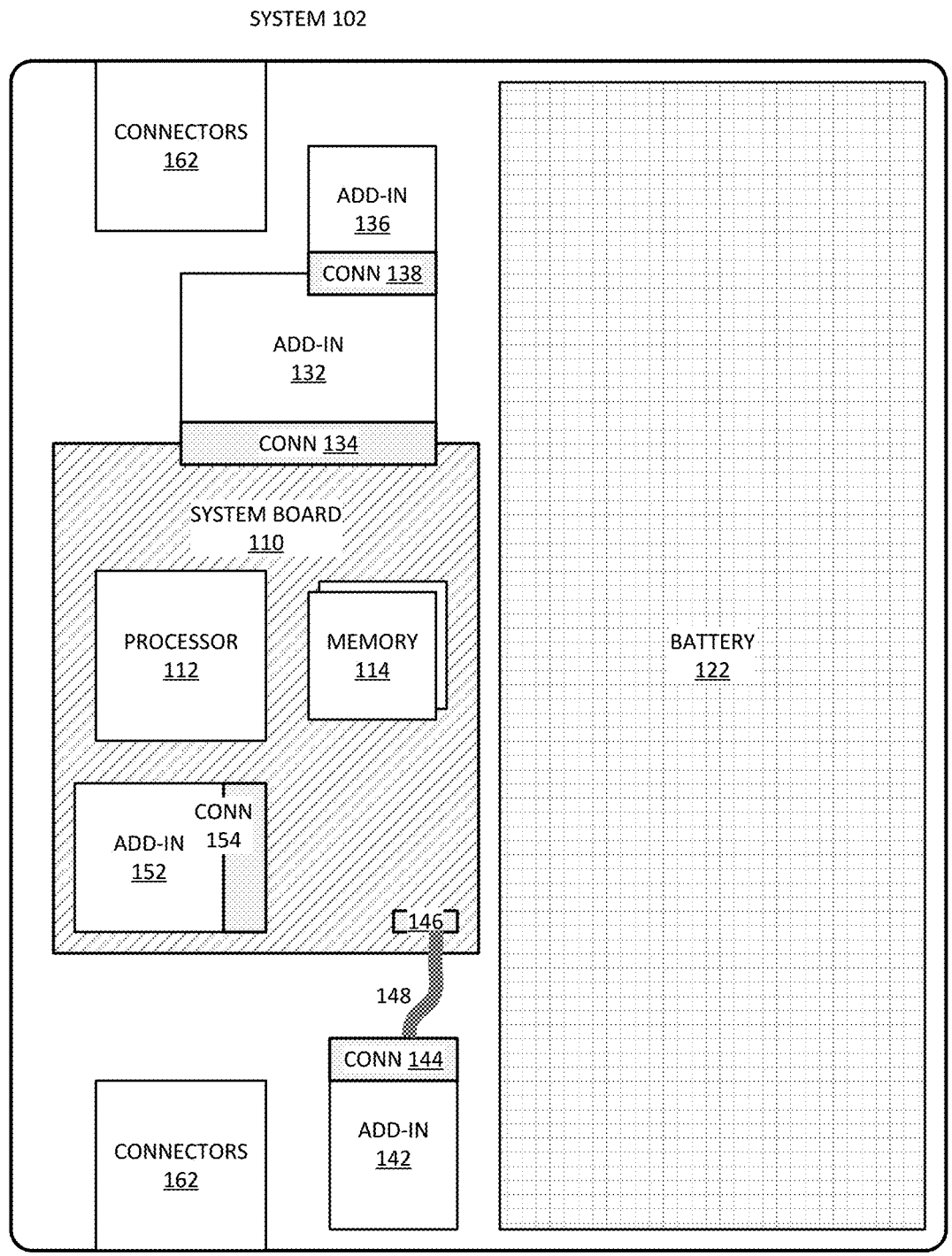
FIG. 1A is a block diagram of an example of a computer system with ultra slim module (USM) add-in connectors mounted to a planar system board.

FIG. 1A is a block diagram of an example of a computer system with ultra slim module (USM) add-in connectors. System 102 represents a computing system or a computing device. For example, system 102 can be a laptop computer, a tablet computer, or a two-in-one device. The display for the device is not explicitly shown in system 102, but can be a screen that covers device, or can be a display that connects via hinge, built on top of the chassis of system 102, or connect with some other connector.

In one example, system 102 has a clamshell design, where the processing elements and keyboard are fixed to the display element. In one example, system 102 is a detachable computer, where the processor and display are part of a common unit has a detachable keyboard.

System 102 includes system board 110, which represents a primary printed circuit board (PCB) to control the operation in system 102. System board 110 can be referred to as a motherboard in certain computer configurations. System board 110 represents a rectangular system board, which is a traditional system board configuration, with a length and a width (x and y axis, not specifically labeled for orientation in system 102) that are both at least twice a width or length dimension of the primary processor or host processor.

System board 110 includes processor 112, which represents a host processor or main processing unit for system 102. Processor 112 can be a central processing unit (CPU) or system on a chip (SOC) that includes a CPU or other processor. In one example, processor 112 can include a graphics processing unit (GPU), which can be the same as the primary processor, or separate from the primary processor.

System board 110 includes memory 114, which represents operational memory for the computing device. The operational memory can be referred to as system memory. The operational memory generally is, or includes, volatile memory, which has indeterminate state if power is interrupted to the memory. Processor 112 utilizes memory 114 to control operation of system 102. System 102 includes battery 122 to power the system.

System 102 includes one or more add-in cards connected to system board 110. Reference to an add-in board or add-in card refers to a card or board that connects to the primary board that includes the system processor and provides functionality to the system processor through the card. The card could alternatively be referred to as an add-on card or add-on board, an extension module, or some other term.

System 102 illustrates four add-in boards, add-in 132, add-in 136, add-in 142, and add-in 152. System 102 may include a single add-in board or can include multiple add-in boards. The add-in boards specifically illustrated show different types of add-in connection to system board 110. Other types of connections are possible as described in more detail below. In one example, system 102 includes add-in boards that are stacked over other add-in boards, or stacked on other add-in boards, neither of which is not explicitly illustrated in system 102.

The add-in boards can be included in system 102 to provide functionality that is user selectable for different system configurations. For example, computer systems commonly offer different amounts of nonvolatile storage or hard drive size. Nonvolatile storage refers to memory that maintains determinate state even when power is interrupted to the memory. Nonvolatile memory can be offered as a solid state drive (SSD) of different sizes, depending on user-selected system configuration. In one example, one or more of the add-in boards represents an SSD.

The add-in boards can be included in system 102 to provide functionality that is controlled for electromagnetic frequency (EMF) radiation or noise. In one example, one or more of the add-in boards represents a wireless communication card. Wireless communication cards have compliance requirements, and so are typically implemented as stand-alone modules to prevent having to separately test every device design. For example, the add-in board can implement wireless communication, such as WiFi, Bluetooth (BT), WWAN (wireless wide area network) such as cellular, or other wireless communication.

In one example, add-in 132 is connected to system board 110 with connector (CONN) 134. Connector 134 represents an inline USM connector that can provide a wide bandwidth connection to add-in 132. In one example, add-in 136 connects indirectly to system board 110 through add-in 132. More specifically, add-in 136 connects to add-in 132 through connector (CONN) 138, which represents a USM connector (and could be either an inline or top mount USM connector). In one example, connector 138 has a narrower bandwidth than connector 134. Connector 134 can provide a pass-through connection to add-in 136 through connector 138. The connection of add-in 136 through add-in 132 to system board 110 can be referred to as a daisy-chained connection. In one example, add-in 132 can connect through a top mount USM connector 134. Thus, boards can be daisy-chained or extended through inline or top mount low profile connectors.

Add-in 152 connects to system board 110 through connector (CONN) 154, which represents a top mount USM connector. Add-in 152 illustrates that system 102 can include one or more add-in cards mounted on or over system board 110 with top mount connectors. The top mount connect includes some vertical offset relative to the inline board connections, which can still be lower than traditional connectors in addition to providing improved signaling and heat transfer to enable higher speed connections.

Add-in 142 connects to system board 110 through connector (CONN) 144, as well as through cable 148 and connector 146. Connector 146 is a connector directly on system board 110, which could be a USM connector, but which is not necessarily a USM connector. In one example, connector 146 is not a USM connector. Connector 146 can be a different low profile connector, such as a ribbon connector for an implementation where cable 148 is a ribbon cable. Cable 148 can be a wire cable with a corresponding connector 146. There can be any number of possible connection configurations for cable 148 and add-in 142. For example, on the end of cable 148 that faces add-in card 142, the cable includes a hardware interface to interface with connector 144, which is a USM connector. In another example, system 102 could include a small PCB with a connector similar to connector 146 mounted to the PCB, with signal lines to a USM connector, whether inline or top mount, to connect to connector 144. which represents a top mount USM connector. Add-in 142 illustrates that system 102 can include one or more add-in cards mounted to system board 110 with cables in addition to USM connector.

System 102 includes connectors 162, which represent I/O (input/output) connectors to devices external to system 102. For example, connectors 162 can be or include USB (universal serial bus) connectors. System 102 can also include a display device. System 102 can include a network interface coupled to processor 112.

Figure 1B:
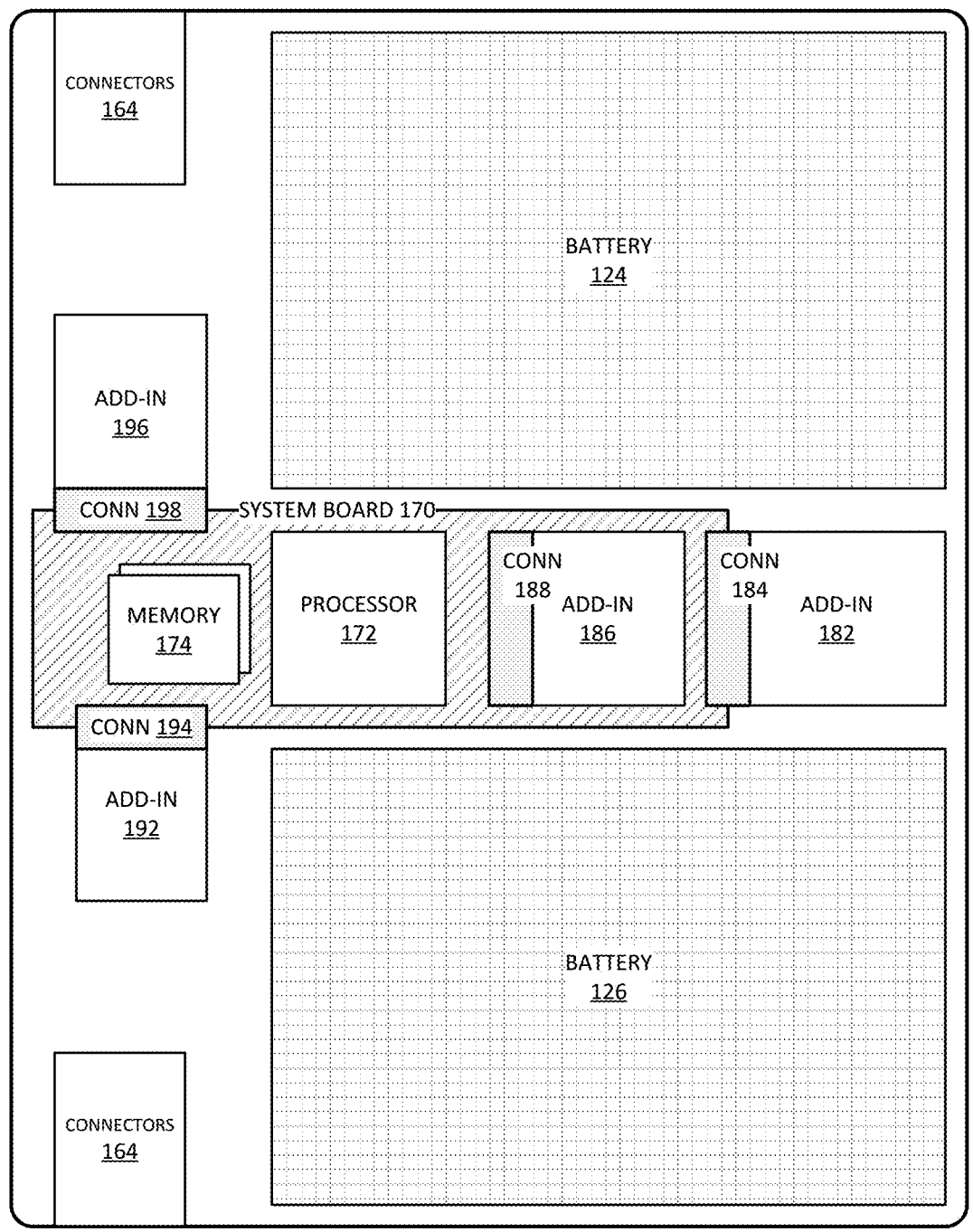
FIG. 1B is a block diagram of an example of a computer system with ultra slim module (USM) add-in connectors mounted to a ruler board.

FIG. 1B is a block diagram of an example of a computer system with ultra slim module (USM) add-in connectors mounted to a ruler board. System 104 represents a computing system or a computing device. For example, system 104 can be a laptop computer, a tablet computer, or a two-in-one device. The display for the device is not explicitly shown in system 104, but can be a screen that covers device, or can be a display that connects via hinge, built on top of the chassis of system 104, or connect with some other connector.

In one example, system 104 has a clamshell design, where the processing elements and keyboard are fixed to the display element. In one example, system 104 is a detachable computer, where the processor and display are part of a common unit has a detachable keyboard. System 104 can be an alternate example to system 102 of FIG. 1A, with similar internal components but with a different system board design.

System 104 includes system board 170, which represents a primary printed circuit board (PCB) to control the operation in system 104. System board 170 can be referred to as a motherboard in certain computer configurations. System board 170 represents a ruler board, with a length substantially longer than its width (or a width substantially longer than its length, depending on how the x axis and y axis are oriented in system 104). Typically, a ruler board will have a first dimension that is less than double a width or length dimension of the primary processor or host processor, and a second dimension that is at least many multiples (e.g., at least 3 or 4) of the first dimension.

System board 170 includes processor 172, which represents a host processor or main processing unit for system 104. Processor 172 can be a central processing unit (CPU) or system on a chip (SOC) that includes a CPU or other processor. In one example, processor 172 can include a graphics processing unit (GPU), which can be the same as the primary processor, or separate from the primary processor. System board 170 includes memory 174, which represents operational memory for the computing device. Processor 172 utilizes memory 174 to control operation of system 104.

System 104 includes a battery to power the system. System 104 is illustrated with multiple separate battery components that straddle system board 170. Battery 124 can represent one portion or segment of the battery and battery 126 can represent another portion or segment of the battery. While illustrated as substantially the same shape and size, there is no requirement for the different battery segments to be symmetrical or symmetrically configured within the chassis of system 104. In one example, system 104 can have more than two battery segments.

System 104 includes one or more add-in cards connected to system board 170. System 104 illustrates four add-in boards: add-in 182, add-in 186, add-in 192, and add-in 196. System 104 may include a single add-in board or can include multiple add-in boards. The add-in boards specifically illustrated show different types of add-in connection to system board 170. Other types of connections are possible as described throughout. System 104 does not illustrate a cable connection to an add-in board, but can include a similar connection to that shown in system 102. System 104 also does not illustrate daisy-chained add-in board, which can be implemented in system 104 in various implementations. In one example, system 104 includes add-in boards that are stacked over other add-in boards, or stacked on other add-in boards, neither of which is not explicitly illustrated in system 104.

The add-in boards can be included in system 104 to provide functionality that is user selectable for different system configurations. For example, computer systems commonly offer different amounts of nonvolatile storage or hard drive size. Nonvolatile storage refers to memory that maintains determinate state even when power is interrupted to the memory. Nonvolatile memory can be offered as a solid state drive (SSD) of different sizes, depending on user-selected system configuration. In one example, one or more of the add-in boards represents an SSD.

The add-in boards can be included in system 104 to provide functionality that is controlled for electromagnetic frequency (EMF) radiation or noise. In one example, one or more of the add-in boards represents a wireless communication card. Wireless communication cards have compliance requirements, and so are typically implemented as standalone modules to prevent having to separately test every device design. For example, the add-in board can implement wireless communication, such as WiFi, Bluetooth (BT), WWAN (wireless wide area network) such as cellular, or other wireless communication.

In one example, add-in 182 is connected to system board 170 with connector (CONN) 184. Connector 184 represents an inline USM connector that can extend the ruler board with an add-in module at the end of the board. Thus, a configurable component can be provided space at a long end of the ruler board, allowable configuration of the system with different component features through add-in 182, connected with connector 184. Add-in 186 connects to system board 170 through connector (CONN) 188, which represents a top mount USM connector. Add-in 182 illustrates that system 104 can include one or more add-in cards mounted on or over system board 170 with top mount connectors.

Add-in 192 connects to system board 170 through connector (CONN) 194. Add-in 196 connects to system board 170 through connector (CONN) 198. Add-in 192 and add-in 196 are illustrated as being across system board 170 from each other, illustrating that add-in boards can be connected to different edges or other portions of system board 170. Connector 194 and connector 198 can be inline or top mount connectors.

System 104 includes connectors 164, which represent I/O (input/output) connectors to devices external to system 104. For example, connectors 164 can be or include USB (universal serial bus) connectors. System 104 can also include a display device. System 104 can include a network interface coupled to processor 172.

Figure 2B:
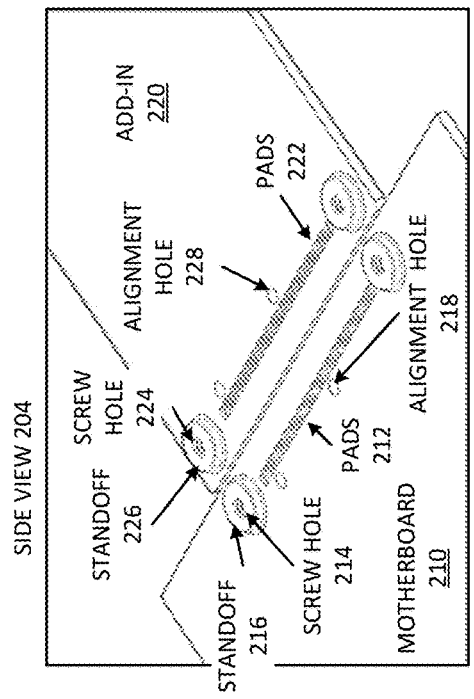
FIGS. 2A-2C are block diagrams of an example of connecting an add-in to a motherboard with a USM connector.
Figure 2C:
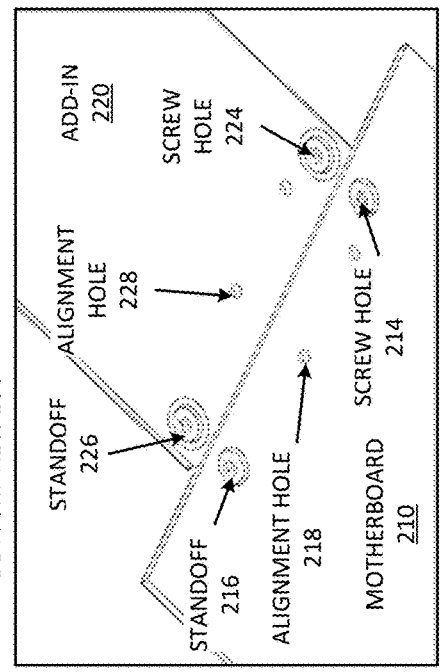
Figure 2A:
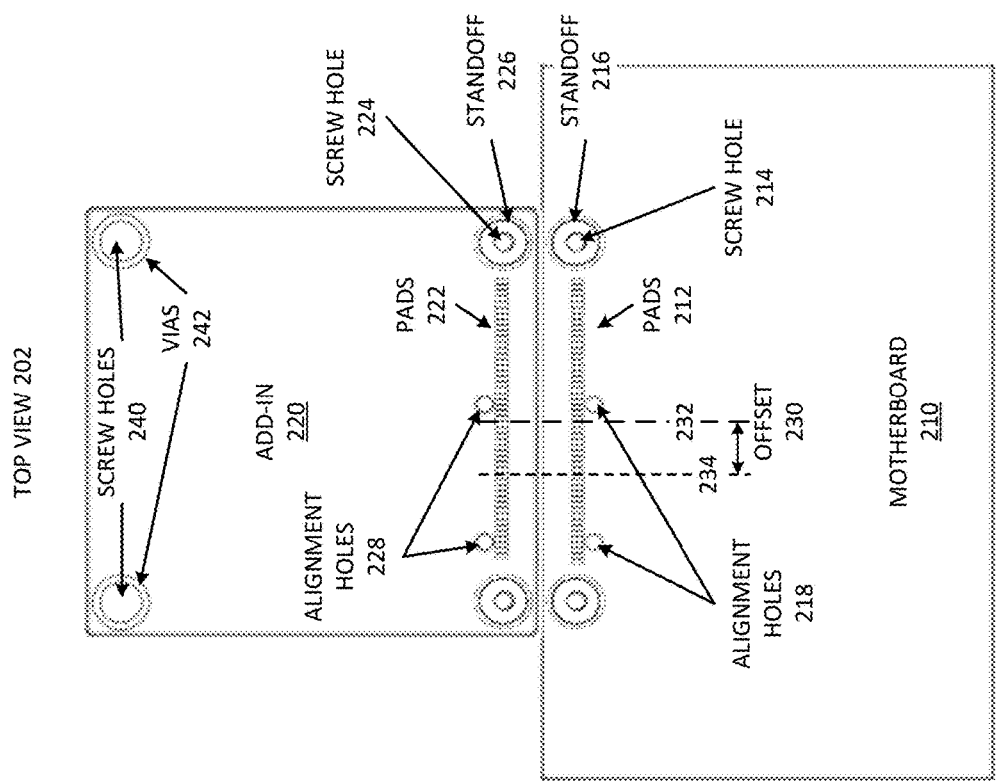

FIGS. 2A-2C are block diagrams of an example of connecting an add-in to a motherboard with a USM connector. Motherboard 210 represents a primary system board, which will include the primary system processor. Add-in 220 represents an extension board to be connected to a system board, identified in the diagrams as motherboard 210. The size and scale of the boards is not necessarily to scale. The relative sizes of the system board or motherboard 210 and add-in 220 can be representative of one example implementation.

Referring to FIG. 2A, top view 202 illustrates a top view of motherboard 210 and add-in 220. Motherboard 210 includes pads 212, which represents a row of pads between screw holes 214. In one example, the row of pads 212 is a single row of connectors for motherboard 210. Add-in 220 includes pads 222, which mirror pads 212 of motherboard 210. Pads 222 correspond to pads 212, where signals sent to pads 212 are extended to pads 222 through a USM connector (not explicitly shown).

Pads 212 and pads 222 represent exposed connector on the boards. Other connectors are covered by one or more layers of the PCB or covered by surface material of the board. Pads allow connection to a connector or to a chip on the board.

As with motherboard 210, in one example, add-in 220 includes pads 222 disposed between two screw holes 224, one on either side of the row of pads 222. Screw holes 214 include standoffs 216 and screw holes 224 include standoffs 226. Standoffs 216 and standoffs 226 include threading on the interior or inner surface. Thus, the screw holes provide an opening in the boards to receive screws that will secure a connector to the boards, as described in more detail below.

Motherboard 210 includes alignment holes 218. Add-in 220 includes alignment holes 228. In one example, alignment holes 218 and alignment holes 228 are mirror images on the boards when they are configured to connect to each other. In one example, alignment holes 218 of motherboard 210 and alignment holes 228 of add-in 220 are not aligned with each other.

As illustrated in top view 202, alignment holes 218 and alignment holes 228 are aligned with each other, and have a center that is offset from the connector center. Dashed line 232 (long dashes) illustrates a connector center, or a center line that intersects the middle of pads 212 and pads 222. Dashed line 234 (short dashes) intersects the middle of alignment holes 218 and alignment holes 228. Offset 230 represents an offset from center of the alignment holes. In one example, the alignment holes are centered on center line 232.

Add-in 220 is illustrated with screw holes 240, which can be the same as screw holes 224. Screw holes 224 are located on add-in 220 by the edge of the board that will be proximate motherboard 210 when the boards are connected, and screw holes 240 are located on an opposite edge of add-in 220. Another identifier for the screw holes is that screw holes 224 are located by pads 222 to connect to motherboard 210, and screw holes 240 do not have pads that will connect with motherboard 210. Screw holes 240 could include pads to connect to another board, as described below. Alternatively, add-in 220 may not have any pads near screw holes 240. Screw holes 240 can enable the connection of add-in 220 to a system chassis for added support for the connection of the add-in board.

Screw holes 240 illustrate vias 242, which represent through-hole connections for the screw holes. It will be understood that screw holes 224 and screw holes 214 also include similar vias, which are mostly obscured in top view 202. The vias include metal lining to the holes in the boards. Typically, alignment holes 218 and alignment holes 228 are bare holes in the respective PCBs. A lined hole connects to a signal line on at least two layers of the board, or connects to a ground plane or power plane.

Referring to FIG. 2B, side view 204 illustrates a side view of the components of top view 202. Observation of side view 204 shows the threading of screw holes 214 of motherboard 210 and screw holes 224 of add-in 220. Side view 204 also illustrates that standoffs 216 and 226 provide additional depth to allow the screw holes to receive screws to secure a USM connector to the boards.

In one example, screw holes 214 and screw holes 224 are through-hole holes or through-hole openings in the boards, which are lined with metal. The metalized through hole openings allow standoffs 216 and standoffs 226, respectively, to be soldered into the screw holes, connecting the screw holes to a ground plane in motherboard 210 and to a ground plane in add-in 220, respectively. Connecting the screw holes to the ground planes can ground the connector, as described in more detail below. The use of threaded standoffs allows for assembly of the add-in card to the motherboards in a post-SMT (surface mount technology) assembly process.

Alignment holes 218 and alignment holes 228 provide keying and accurate alignment of a USM connector that will connect to the boards. The USM connector includes contacts to electrically connect pads 212 to pads 222 when the connector is secured to the boards with screw holes 214 and screw holes 224. The improved accuracy from a pair of keying alignment holes enables narrower pitch between pads relative to traditional add-in board interconnects.

While illustrated and described as standoffs, standoffs 216 and standoffs 226 can alternatively be spacers. The use of standoffs 216 and standoffs 226 provides threading to secure screws for a connector to connect motherboard 210 to add-in 220. A spacer may not need to a threaded spacer that includes threading, as the screw can extend to a threaded post in the system chassis to secure the screw. A spacer may be preferable if the connector screw will be connected to the system chassis, as the threading of a standoff may not align perfectly with the threading of the chassis standoff.

Referring to FIG. 2C, bottom view 206 illustrates a bottom view of the components of top view 202. It will be observed from bottom view 206 that motherboard 210 and add-in 220 do not include pads on the bottom side of the boards. In one example, the interconnection with the USM connector provides for connection on only one side of the boards. Thus, the surface with the pads (the top surface as illustrated) can be substantially in the same plane or inline with each other. Thus, the I/O (input/output) can be on only one side or on one surface of the PCB. The connector can then just connect the pads on the one surface to provide the interconnection between the boards, which can improve vertical usage of the board space.

In bottom view 206, in one example, standoffs 216 and standoffs 226 may come all the way through screw holes 214 and screw holes 224, respectively, or may only extend part way into the screw holes. The connector (not shown) can include posts or tabs that extend all the way into alignment holes 218 and alignment holes 228, or only part way into the alignment holes, or all the way through the alignment holes to extend out the bottom side.

FIGS. 3A-3D are block diagrams of an example of an inline USM connector. The diagrams illustrate the interconnection of a first PCB to a second PCB. In one example, the first PCB is a motherboard and the second PCB is an add-in module. In one example, both the first PCB and the second PCB are add-in boards. The different views of illustrate elements of the connector as though looking through layers of the connector while it is connecting the two boards.

Figure 3A:
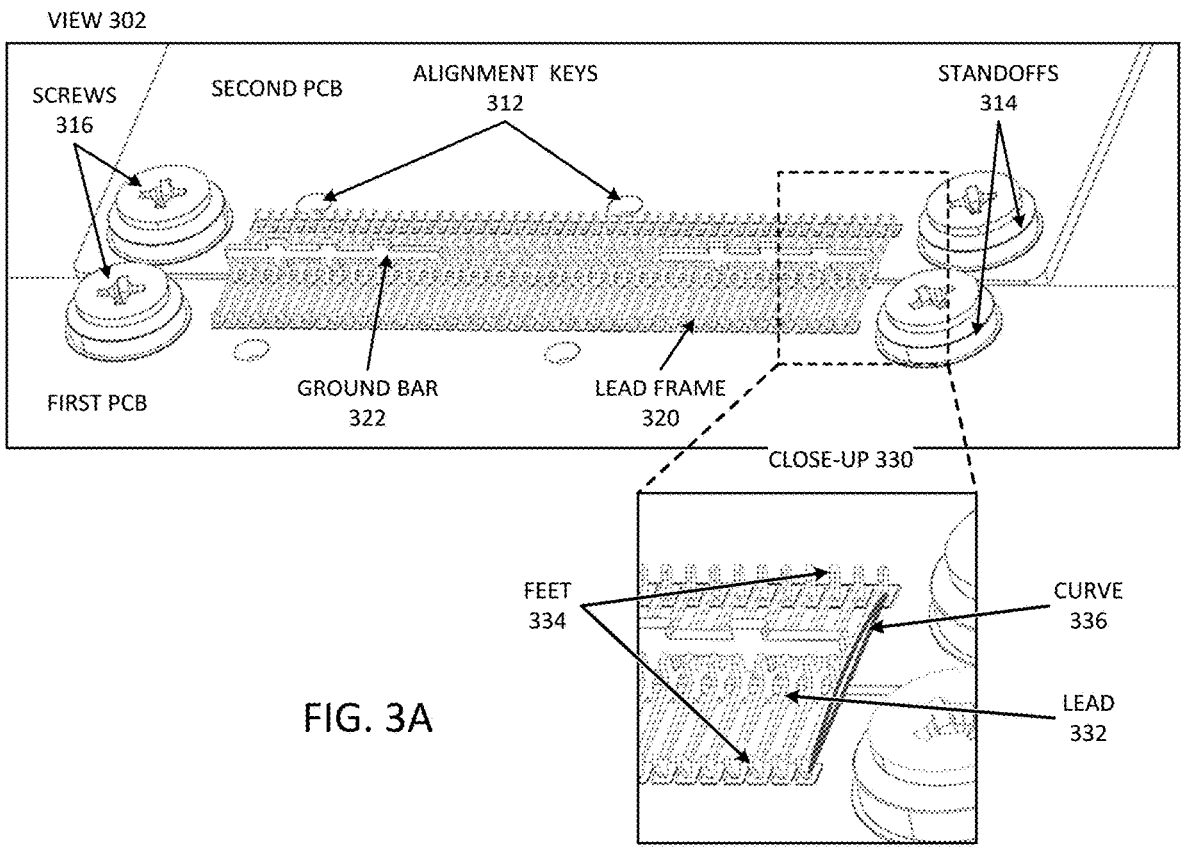
FIGS. 3A-3D are block diagrams of an example of an inline USM connector.

Referring to FIG. 3A, view 302 illustrates a pin assembly or a frame of leads to connect from pads on the first PCB with pads on the second PCB. Lead frame 320 represents the electrical leads or electrical connectors that make electrical connection between the pads on the first PCB with the pads on the second PCB when the connector is secured. The leads span the two rows of the connecting PCBs.

The electrical leads can also be referred to as pins or beam contacts. The leads or pins of lead frame 320 are bridges between the pads of the two devices or two boards. In one example, the pins are spring contacts that push against the upper plate of the connector (described below as case or cover 350). Close-up 330 illustrates an end of lead frame 320. Lead frame 320 is made up of multiple individual leads 332, which include feet 334. One foot makes contact with a pad on the first PCB and the other foot make contact with a corresponding pad on the second PCB. A straight line and curved line are illustrated and referenced as curve 336. The straight line illustrates the surface plane of the surfaces of the first PCB and the second PCB. The arc illustrates the curvature of one of the leads 332.

Thus, when engage in the connector and secured by screws, the connector pushes lead frame 320 onto the PCB pads to bridge between corresponding pads. Depending on the makeup of the leads, the lead frame assembly could exert a relatively significant amount of force (collectively, multiple pounds of force could be applied against the connector case, and thus into the screws. Such a force can provide a good engagement force to hold the first PCB to the second PCB, and ensure the electrical connection of the pads. Such a connection enables high speed signaling, even as the connector design enables a low-cost lead frame that holds an add-in card to another add-in card, or holds an add-in card to a motherboard edge.

Alignment keys 312 (or alignment holes) illustrate keying or alignment structures to be engaged by an alignment frame of the connector. In one example, standoffs 314 electrically connect to a ground plane within the PCBs. In one example, screws 316 engage with standoffs 314. Alternatively, standoffs 314 could be replaced by spacers, which could electrically connect to a ground plane of the PCBs, or alternatively, simply provide a guide for screws through bare through holes in the boards for screws 316 to engage with the chassis. Standoffs 314 can include threading to it into a screw hole and provide a threaded structure to secure screws 316.

In any configuration, screws 316 can electrically connect to a board ground or a system ground, grounding the connector. Screws 316 also provide a thermal path for the connection, allowing the transfer of heat, which can also enable higher signaling rates. In one example, the connector includes grounding bar 322 (which could alternatively be referred to as a grounding bar). Ground bar 322 can selectively connect to ground pins of lead frame 320. The connection of ground bar 322 to ground pins can ensure that each pin has a strong path to ground. If the connector cover is metal, ground bar 322 can physically contact the metal cover, providing a strong ground path through screws 316 and standoffs 314 to ground.

Figure 3B:
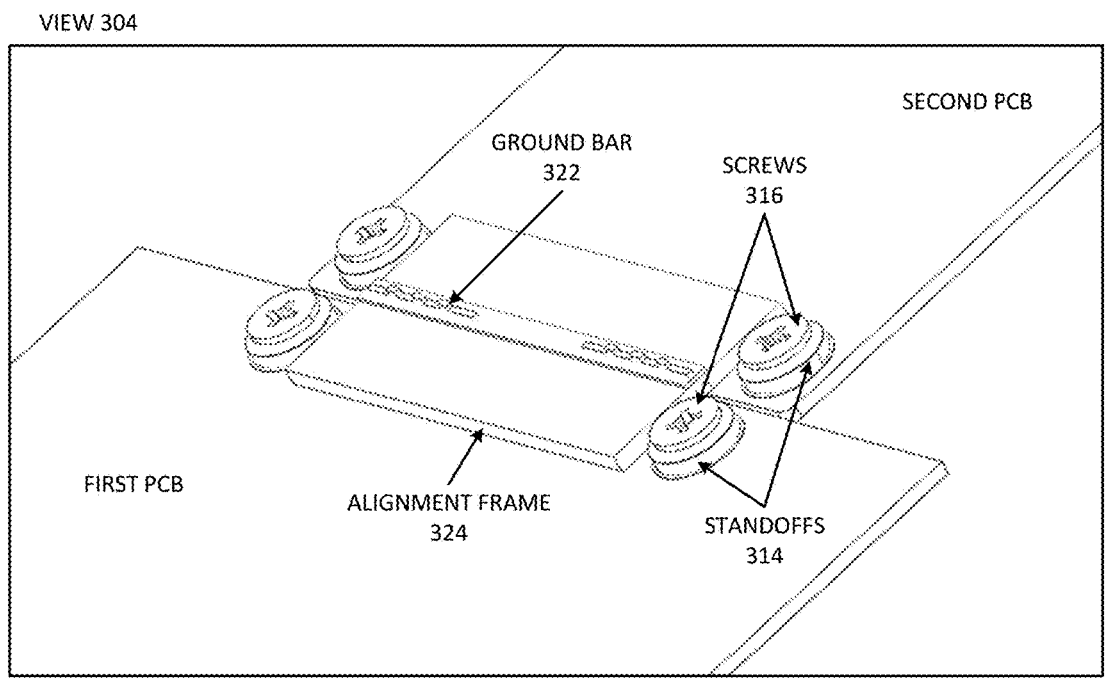

Referring to FIG. 3B, view 304 illustrates the inclusion of alignment frame 324 over lead frame 320, which is not explicitly seen in view 304, because it is covered by alignment frame 324. In one example, alignment frame includes mechanical support for ground bar 322 to be included in the connector. The mechanical support can include spacing and structural features to allow ground bar 322 to be used. The structural features can include gaps in the frame body or frame molding to allow the ground bar to extend through to physically contact the leads and physically contact the external cover of the connector.

Alignment frame 324 secures lead frame 320, to hold the leads in place. Additionally, alignment frame 324 includes posts, tabs, or other structures to engage with alignment keys in the first PCB and the second PCB. The alignment keys are not seen in view 304, because they are covered by alignment frame 324. In one example, ground bar 322 extends through alignment frame 324, and provides a beam contact for ground, which connects to the cover.

In one example, alignment frame 324 is a plastic frame. The plastic frame can be a low-cost plastic mold piece, which can be 3D (three-dimensional) printed, injection molded, or machined. Alignment frame 324 can provide high accuracy to the lead spacing (e.g., distance between adjacent leads), which supports the lead frame design to achieve high accuracy alignment of contacts to PCB pads. In addition to the construction of the alignment frame itself holding the leads, the alignment or keying features engaging with alignment holes in the PCBs ensure the high accuracy alignment of the leads with the pads.

Figure 3C:
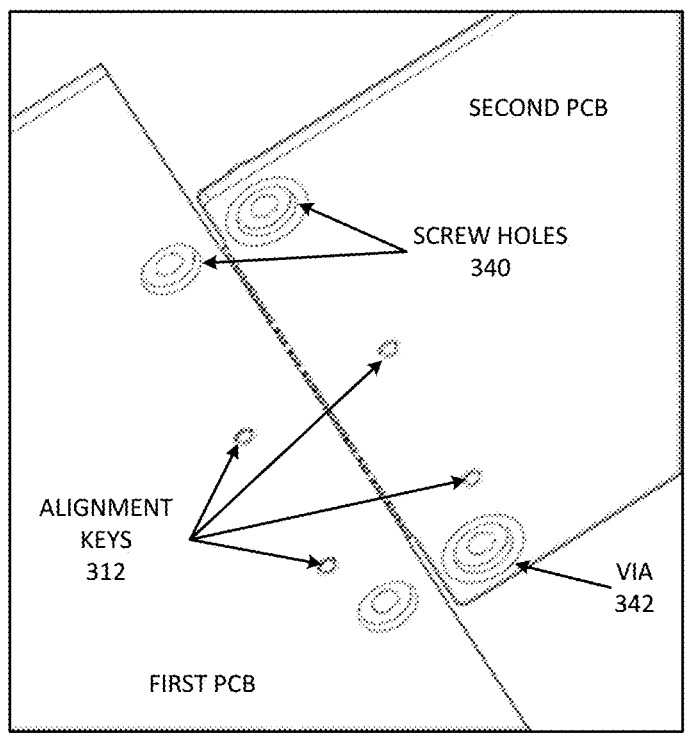

Referring to FIG. 3C, view 306 illustrates a back side or under side of the first PCB and the second PCB when engaged by the connector. Screw holes 340 can be holes in the PCBs to enable the use of the screws, which could be with spacers or standoffs, or without spacers or standoffs, depending on the system design. In one example, screw holes 340 are lined with metal to connect to a ground plane in the PCBs, and are illustrated as vias 342 to represent the electrical connection of the screw holes to a ground plane in the boards.

There is an advantage to grounding the screw holes to the PCB ground planes, in ensuring good ground, as well as providing good electrical grounding and a thermal path for heat from the connector. Alignment keys 312 are filled in with posts or tabs from alignment frame 324, which align with and engage with the holes in the PCBs. As mentioned previously, the posts in the connector can be offset relative to a center of the lead frame, or can be centered on the center of the lead frame. The alignment features of alignment frame 324 can include a first pair of posts to mate with a pair of first alignment holes of the first PCB and a second pair of posts to mate with a pair of second alignment holes of the second PCB.

Figure 3D:
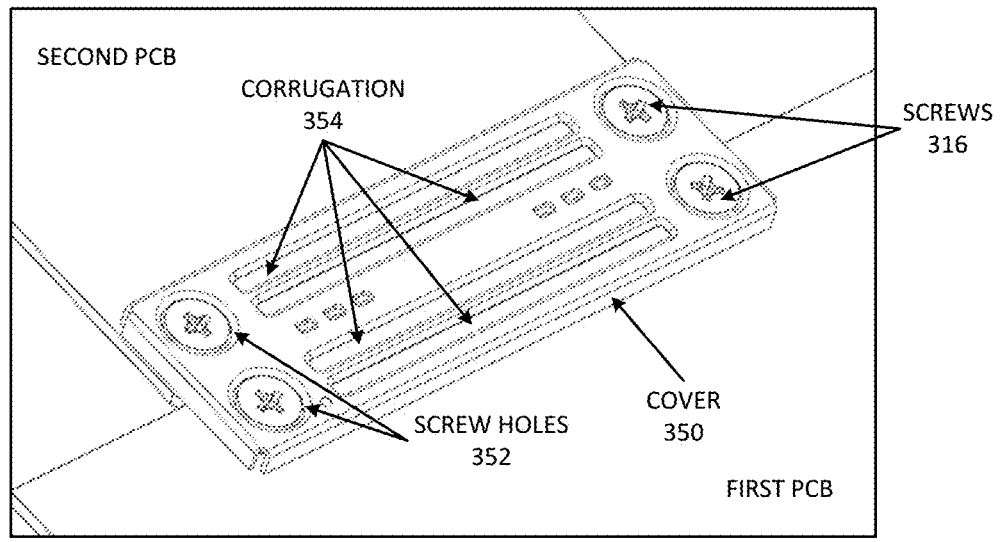

Referring to FIG. 3D, view 308 illustrates the complete connector, with cover 350 enclosing alignment frame 324, which in turn encloses lead frame 320. Cover 350 includes screw holes 352 to receive screws 316. Screw holes 352 represent features in cover 350 that will allow screws 316 to be inserted through the connector and when engaged with a threading (e.g., a standoff on the boards or a standoff on the chassis) will hold the connector against the first PCB and the second PCB. The holding of the connector against the PCBs can also work to hold the PCBs together with the connector.

In one example, cover 350 includes corrugation features 354. Corrugation features 354 represent alternating peak surfaces and depressed features in the cover to improve structural stiffness. Corrugation reduces the likelihood of folding or creasing in an axis orthogonal to the alignment of the corrugation. Thus, screws 316 on opposite sides of the corrugation features, with the corrugation lengthwise across a rectangular outline of the connector can increase stiffness across the connection from one pair of screws to the other.

In one example, cover 350, which could alternatively be referred to as a case or top shield, is electrically conductive. In one example, cover 350 is metal or metallic, with the material selected to provide electrical conductivity as well as thermal conductivity. Grounding the connector through cover 350 can provide improved signal integrity, as cover 350 provides EMF (electromagnetic frequency) shielding over the signal lines or leads of lead frame 320. Grounding ground bar 322 and the ground pins to cover 350 can improve the signal integrity and noise suppression.

In one example, screws 316 and standoffs 314 are selected of metal material that provides high thermal conductivity and high electrical conductivity, which when engaged with cover 350 can provide good thermal and electrical paths for the connector.

The connector including lead frame 320, alignment frame 324, and cover 350 provides a connector architecture for connecting add-in cards in a computer system. The PCI-SIG M.2 standard available from PCI-SIG (Peripheral Component Interconnect Special Interest Group), originally released in December 2013, significantly decreased the z-axis or height of systems due to connection standards for modules connecting with PCI (peripheral component interconnect), mSATA (mini serial advanced technology attachment), and USB (universal serial bus). PCI-SIG M.2 includes contacts or pads on both sides of a board, which can be a limiting factor for height in emerging computing devices. The M.2 standard is limited to 2.4 mm height, or even 2.75 mm for high speed PCIe 4 (PCI express generation 4) connectors. A connector in accordance with views 302, 304, 306, and 308 can provide a total connector height of 1.3 mm.

Grounding options enable maintaining the same height even with high speed signaling connections. Thus, the connector can provide very low profile interconnection for WiFi, BLUETOOTH, WWAN, SSD modules, or other peripheral modules. The simple post PCB processing installment of the modules with the described connector can enable very thin form factor computing systems without increasing total system development cost for different system configurations. The connector can allow the use of modules that are already emissions compliant, reducing or eliminating the need to test for EMI (electromagnetic interference) noise for different system configurations.

Figure 4A:
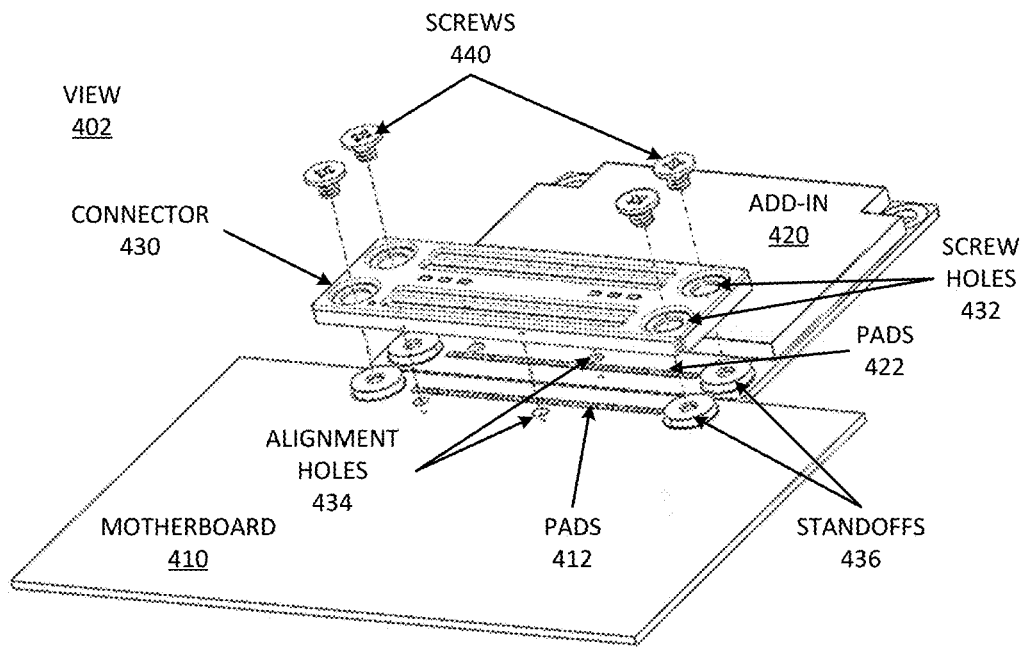
FIGS. 4A-4C are block diagrams of an example of securing an add-in board to a motherboard with an inline USM connector.
Figure 4B:
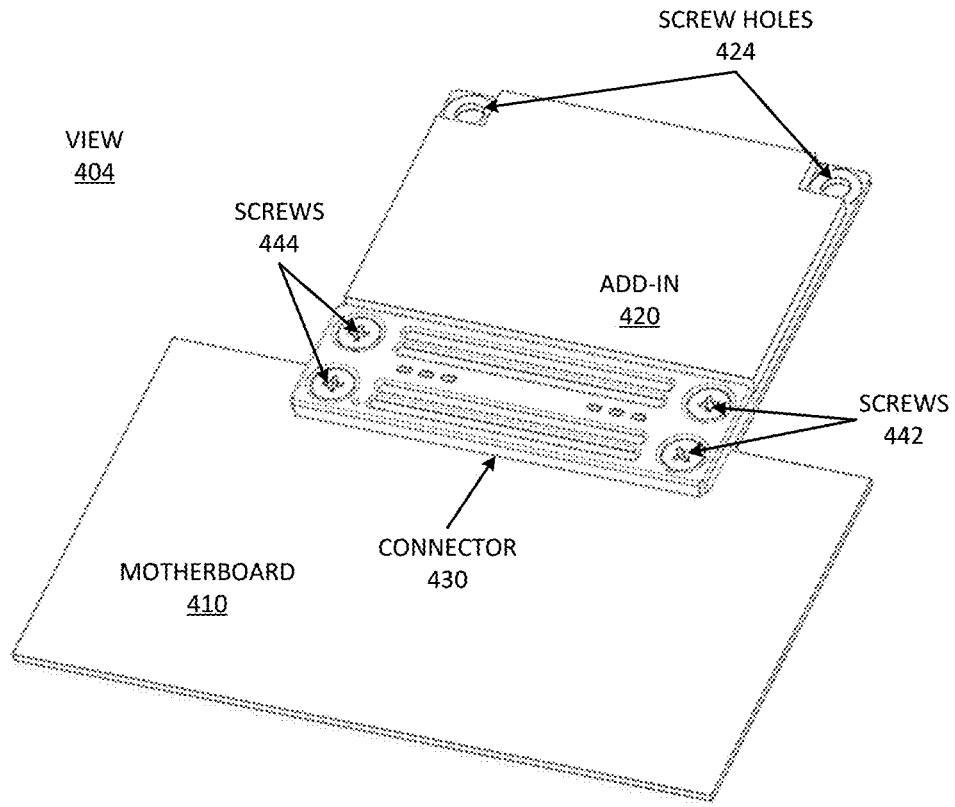
Figure 4C:
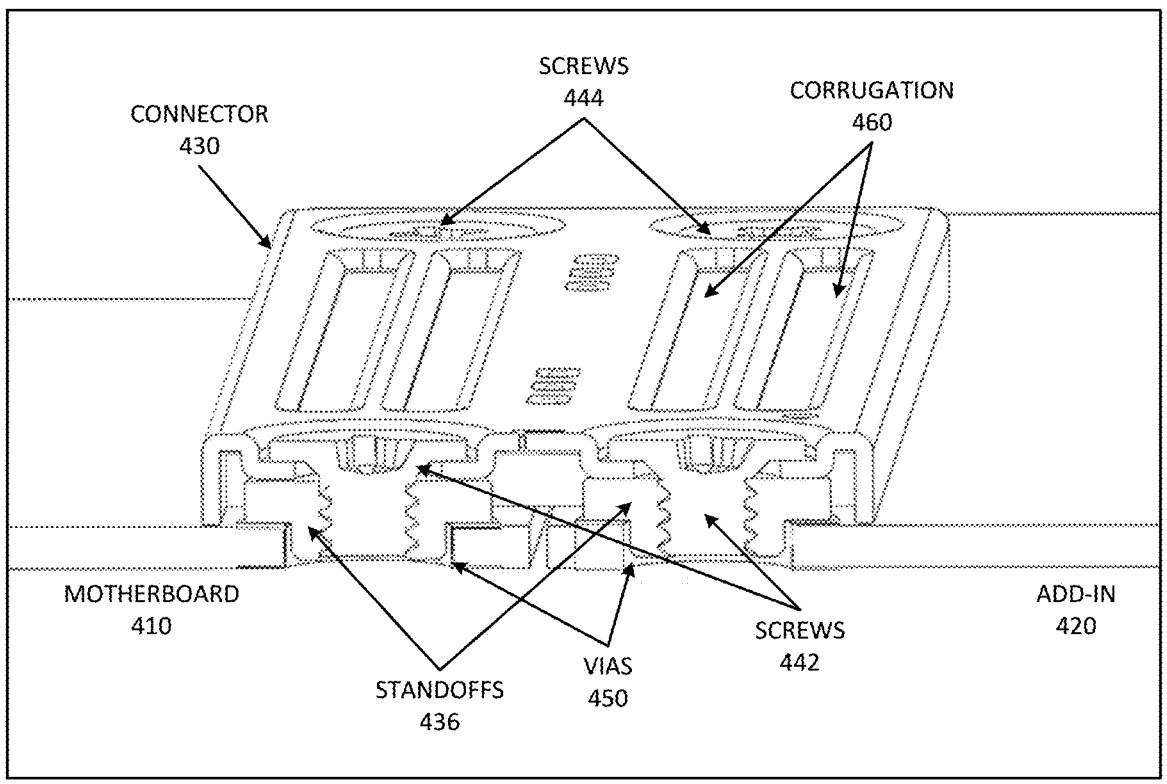

FIGS. 4A-4C are block diagrams of an example of securing an add-in board to a motherboard with an inline USM connector. These diagrams illustrate a combination of the connector in accordance with an example of views 302, 304, 306, and 308 with an example of a PCB configuration in accordance with views 202, 204, and 206.

Referring to FIG. 4A, view 402 illustrates motherboard 410 and add-in 420, which represent the two PCBs to be connected. Motherboard 410 includes pads 412 and add-in 420 includes pads 422. Alignment holes 434 on motherboard 410 and add-in 420 provide keying for connector 430.

Connector 430 includes screw holes 432 to receive screws 440. Connector 430 rests on or over standoffs 436 on motherboard 410 and add-in 420, aligning screw holes 432 in connector 430 with corresponding screw holes or holes in motherboard 410 and add-in 420. Screws 440 secure connector 430 to motherboard 410 and add-in 420, which causes leads of connector 430 to interface with pads 412 and pads 422.

Connector 430 can be considered a board-to-board connector. While not visible in view 402, connector 430 includes a lead frame to provide electrical contact between pads 412 and pads 422, an alignment frame to hold the lead frame and align with alignment holes 434, and an external case or cover to receive screws 440 and secure the alignment frame and lead frame.

Referring to FIG. 4B, view 404 illustrates connector 430 engaged with motherboard 410 and add-in 420 with screws 440. More specifically, the screws are identified in view 404 as screws 442 and screws 444. Screws 442 can be referred to as one pair of screws to secure one side of connector 430. It will be observed that connector 430 has a generally rectangular outline, with pairs of screws on opposite short edges of the connector. Screws 442 are on one short edge of connector and screws 444 are on the other short edge of connector 430.

For screws 442, one of the screws connects to motherboard 410 and the other to add-in 420. Similarly, for screws 444, one of the screws connects to motherboard 410 and the other to add-in 420. Screws 442 can be considered one pair of screws on one end of the row of leads of connector 430, and screws 444 would be considered another pair of screws on the other end of the row of leads.

In one example, add-in 420 includes screw holes 424, which will receive screws (not shown) to secure add-in 420 to a system chassis (not shown). In view 404, add-in 420 includes screw holes to receive one of screws 442 and one of screws 444 in holes closest to motherboard 410. Add-in 420 also includes screw holes 424 on a far end of the board from motherboard 410, to receive additional screws to secure the back end of add-in 420 to the system chassis for added structural support.

Referring to FIG. 4C, view 406 represents a cutaway view of connector 430 to illustrate the connection of the connector and the boards. In one example, motherboard 410 and add-in 420 include vias 450 in the boards, with holes in the board that are lined with conductor and electrically connected to ground planes of the respective boards. In one example, standoffs 436 are soldered to vias 450. Thus, standoffs 436 are grounded to the boards.

Screws 442 are shown in a cutaway view, secured to standoffs 436. Screws 444 are also seen securing the other end of connector 430 to motherboard 410 and add-in 420. View 406 illustrates corrugation features 460 in connector 430, which increases stiffness of the connector in an axis orthogonal to the bridging of the leads of connector 430.

Screws 442 and screws 444 can provide a strong, secure connector to add-in 420 and motherboard 410. When standoffs 436 are grounded and the screws are electrically and thermally conductive, screws 442 and screws 444 add a robust conduit for thermal and electrical ground between the systems of motherboard 410 and add-in 420. Grounding connector 430 can provide improved signal integrity, as the metal shield, cover, or case that encloses the signal lines of the connector is grounded, which should suppress EMI.

Figure 5A:
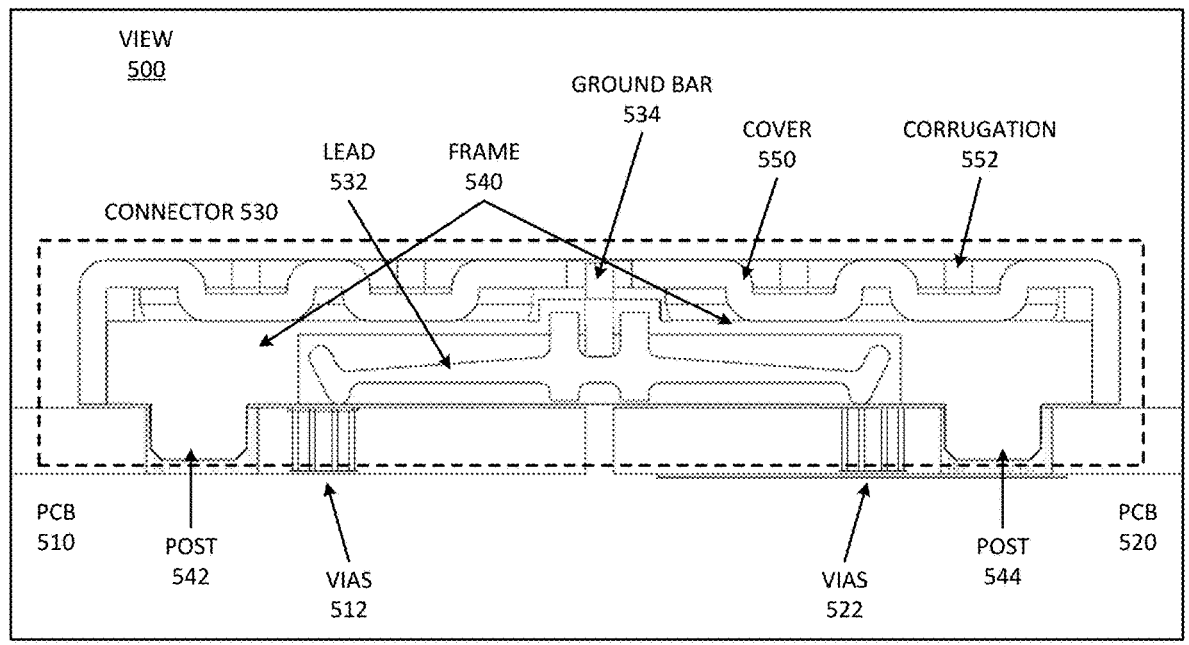
FIG. 5A is a cutaway diagram of an example of an inline USM connector.

FIG. 5A is a cutaway diagram of an example of an inline USM connector. View 500 illustrates a cutaway view of connector 530 connecting PCB 510 to PCB 520. PCB 510 can be a motherboard or an add-in card. PCB 520 is an add-in card.

Connector 530 is represented by the features surrounded by the dashed line. Connector 530 includes leads 532. While not specifically labeled, it will be observed that lead 532 includes one foot to contact pads on PCB 510 and another foot to contact pads on PCB 520. View 500 illustrates lead 532 having a curved form, which can provide a spring force when connector 530 is secured by screws (not shown). More specifically, leads 532 can be implemented as an arch-shaped spring, which has some flex due to force applied from cover 550, which leads 532 oppose with equal and opposite force. Thus, the securing of cover 550 to the PCBs applies a force on leads 532 to push the contact points of the leads against pads on the PCBs when connector 530 is secured with screws. The force on leads 532 applied by the connector can displace the arch shape by approximately 0.15 mm.

In one example, leads 532 include arms extending from a middle point to each side to the foot that physically and electrically contacts the signal pad. In one example, leads 532 include arms that extend vertically up around a central area. When the spring of leads 532 is engaged, the arms that extend vertically will tend to pinch towards the center. In one example, connector 530 includes ground bar 534, which runs down the middle between the vertical arms of leads 532. It will be understood that ground bar 534 includes tabs that extend down between the vertical arms for leads to be selectively contacted, and does not include tabs for signal lines not to be connected to ground. The spring action of leads 532 can operate to ensure secure physical and electrical contact between ground leads and ground bar 534.

Connector 530 includes frame 540, which is shown as two separate pieces in the cutaway view. In practice, frame 540 may preferably be one solid piece, although it could be implemented as two separate pieces. Frame 540 secures leads 532. In one example, frame 540 includes post 542 and post 544, which represent posts or tabs or extensions of the frame to extend into or through the PCBs. Post 542 represents a pair of keying features to align with keying holes in PCB 510. Post 544 represents a pair of keying features to align with keying holes in PCB 520.

Connector 530 includes cover 550 to enclose the leads and frame 540. Connector 530 includes screw holes (not shown) to secure connector to PCB 510 and to PCB 520. In one example, cover 550 includes corrugation features 552 as stiffening features. Corrugation 552 enables cover 550 to withstand the stress of the forces of the spring action of leads 532.

View 500 illustrates vias 512 in PCB 510 and vias 522 in PCB 520. Vias 512 and vias 522 represent electrical vias to connect signal line pads on the PCBs to connect to the ground plane on the respective PCBs. Thus, the ground leads can be connected to the ground plane through pads on the surfaces of the PCBs, through vias to the ground plane, and also to cover 550, which can also connect to the ground planes through screws.

Figure 5B:
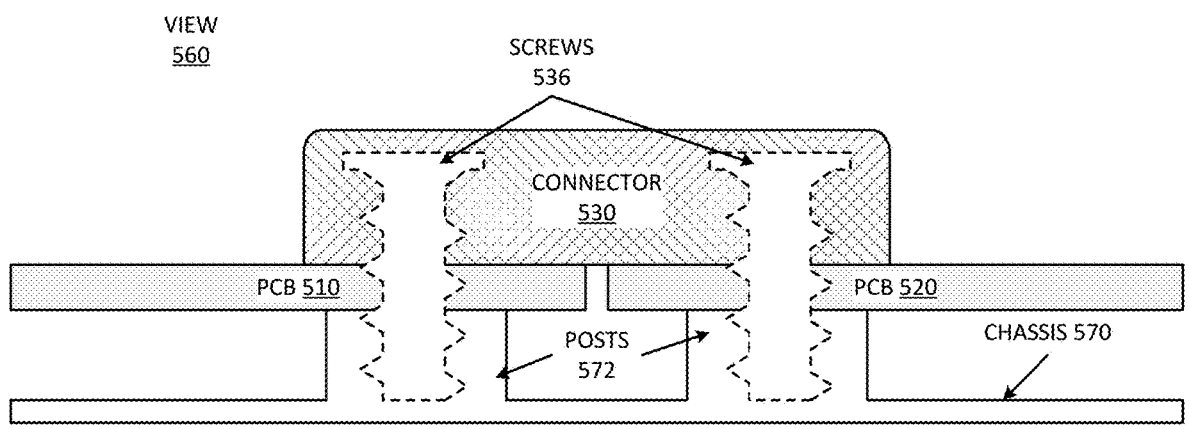
FIG. 5B is a diagram of an example of an inline USM connector connecting to a system chassis.

FIG. 5B is a diagram of an example of an inline USM connector connecting to a system chassis. View 560 illustrates a view of connector 530 with screws 536 securing the connector to PCB 510 and PCB 520.

In one example, connector 530 secures to PCB 510 and to PCB 520 via standoffs, which are threaded or having threading to enable the securing of the connector with the screws. View 560 illustrates screws 536 extending through connector 530 and through PCB 510 to connect to chassis 570. Screws 536 also extend through connector 530 and through PCB 520 to connect to chassis 570. While not specified in view 560, screws 536 could connect to chassis 570 through spacers.

Chassis 570 represents a chassis or system enclosure for a computing system in which PCB 510 and PCB 520 are incorporated. In one example, chassis 570 includes posts 572 to extend up from the inner surface of chassis 570 to interconnect with screws 536. Posts 572 are to be distinguished from the posts extending down from frame 540 to key to alignment holes. Posts 572 are illustrated as having threading to match screws 536. It will be understood that the threading on screws 536 and the inside of posts 572 is not necessarily to scale. The relative heights and proportions of the other components are also not necessarily to scale.

In one example, posts include metal rings to extend into the through holes of PCB 510 and PCB 520. This, the PCBs can rest on the posts, with the through holes aligned to, and resting on a lip around posts 572. Then screws 536 can secure connector 530, and PCB 510 and PCB 520 to the posts.

FIG. 6 is an example of a representation of an inline USM connector with offset keying features. Connector 600 is illustrated from a top view, side views, and bottom view.

Connector 600 includes screw holes 610 to receive screws to secure the connector to PCBs. The side views and the bottom view illustrate leads 620, which extend below the bottom surface of the connector to contact with pads on the PCBs to be connected. The side views and bottom view also illustrate posts 630, which represent alignment features of connector 600. They extend from the bottom of connector 600 to extend into alignment holes the boards to be connected.

The top view illustrates a dashed line to indicate that Board 1 will connect to the top half (as oriented in the diagram) of connector 600 and Board 2 will connect to the bottom half. It will be observed from the side view of the long edge of connector 600 and from the bottom view that posts 630 can be offset relative to a center of the electrical leads.

In the side view of the short edge of connector 600, it can be seen that Board 1 and Board 2 will be connected with symmetric distances for electrical pads and for alignment holes. Symmetry between the leads is not necessarily required. Symmetry between the alignment features is not necessarily required. One example of an asymmetric design is provided below with respect to FIG. 8.

It will be understood that connector 600 is merely one example, and differences in shape, corrugations, shape and size of the corrugations, outline of the connector case, and other differences are possible. Furthermore, examples of dimensions are provided, which are example, and can be changed proportionally or changed in a way that changes the proportions or ratios of the connector dimensions. Thus, there are merely non-limiting examples.

Consider the dimensions for a 50-pin connector 600. Dimensions can change proportionally along the x-axis for 30-pin, 40-pin, or 60-pin connectors. In one example, the x-dimension (e.g., length) can be approximately 29-30 mm, such as 29.3 mm or 29.8 mm. The y dimension (e.g., width) can be approximately 8-10 mm, such as 8.0 mm or 9.5 mm. The z dimension (e.g., height) can be approximately 1-1.5 mm, such as 1.2 mm or 1.3 mm. For a 50-pin configuration, connector 600 can have approximately 0.4 mm of pitch between the pins or contacts. The dimension between the points of leads 620 can be approximately 5-5.5 mm, such as 5.0 mm or 5.3 mm. The dimension between posts 630 along the y-axis can be approximately 7-7.5 mm, such as 7.1 mm or 7.25 mm. The dimension between posts 630 along the x-axis can be approximately 12 mm, such as 11.9 mm. The dimensions between the screw holes along the y-axis can be approximately 4.5-5.0 mm, such as 4.5 mm or 4.8 mm, and along the x-axis can be approximately 25-26 mm, such as 25.1 or 25.7 mm.

FIGS. 7A-7B are diagrams of an example of an inline USM connector that connects to different electrical pads by reversing the USM connector. Connector 700 illustrates an asymmetrical connector. The asymmetry can be useful for applying the connector to different types of add-in boards.

Referring to FIG. 7A, connector 700 is illustrated and described. The outline of connector 700 is illustrated as generally rectangular, with shorter edges and longer edges. The screw holes, alignment features, and leads are illustrated for purposes of describing the ability of connector 700 to be used reversibly. The view can be considered as looking at the top of the connector, and through the connector to the features relevant for purposes of discussion here.

Connector 700 includes tabs 752 and tabs 754, which represent alignment features that extend from the connector to mate with alignment holes of the boards to be connected. Connector 700 includes screw holes 742 and screw holes 744 to receive mounting screws to secure the connector to the boards. The tabs are labeled in pairs that are paired lengthwise or along the long edge of connector 700, with each pair to connect to a different board. The screw holes are labeled in pairs that are paired along the short edge of connector 700, with each pair to connect the two boards together.

Referring to FIG. 7B, the middle diagram illustrates board layouts for PCB 710 and optional layouts for PCB 720. PCB 710 includes two rows of pads, as illustrated, with one row closer to the edge of PCB 710 and another row farther away from the edge. PCB 720 includes one row of pads, either the row closer to the edge of PCB 720, or the row farther from the edge of PCB 720, but not both rows. Thus, PCB 710 includes both rows of pads and PCB 720 includes one or the other.

In orientation 702, connector 700 will connect the row of pads farther from the edge of PCB 710 to a PCB 720 with a row of pads closer to the edge. In orientation 704, connector 700 is rotated 180 degrees to connect the row of pads closer to the edge of PCB 710 to a PCB 720 with a row of pads farther from the edge.

The dark dashed lines illustrate that in both orientations, screw holes 742 and screw holes 744 align with the screw holes in PCB 710 and in PCB 720 along the long axis of connector 700. For purposes of describing the orientation of connector 700, the screws holes of PCB 720 and PCB 710 on one side of leads 730 are designated as screw holes 712, and the screw holes on the opposite side of leads 730 are designated as screw holes 714.

In orientation 702, screw holes 742 of connector 700 align with screw holes 712 and screw holes 744 align with screw holes 714. In orientation 704, connector 700 is rotated and screw holes 744 align with screw holes 712 and screw holes 742 align with screw holes 714.

Additionally, in orientation 702, tabs 752 align with holes 764 of PCB 710 and tabs 754 align with holes 768 of PCB 720. In orientation 704, tabs 752 align with holes 766 of PCB 720 and tabs 754 align with holes 762 of PCB 710. In one example, tabs 752 and tabs 754 are spaced symmetrically with respect to a center of leads 730. In an alternate implementation, the tabs could be offset from center, but not aligned with each other. Thus, if tabs 752 were offset toward screw holes 742, tabs 754 would be offset the same amount toward screw holes 744. The corresponding holes in the PCBs would need to be adjusted to match the tab offsets.

Figure 8:
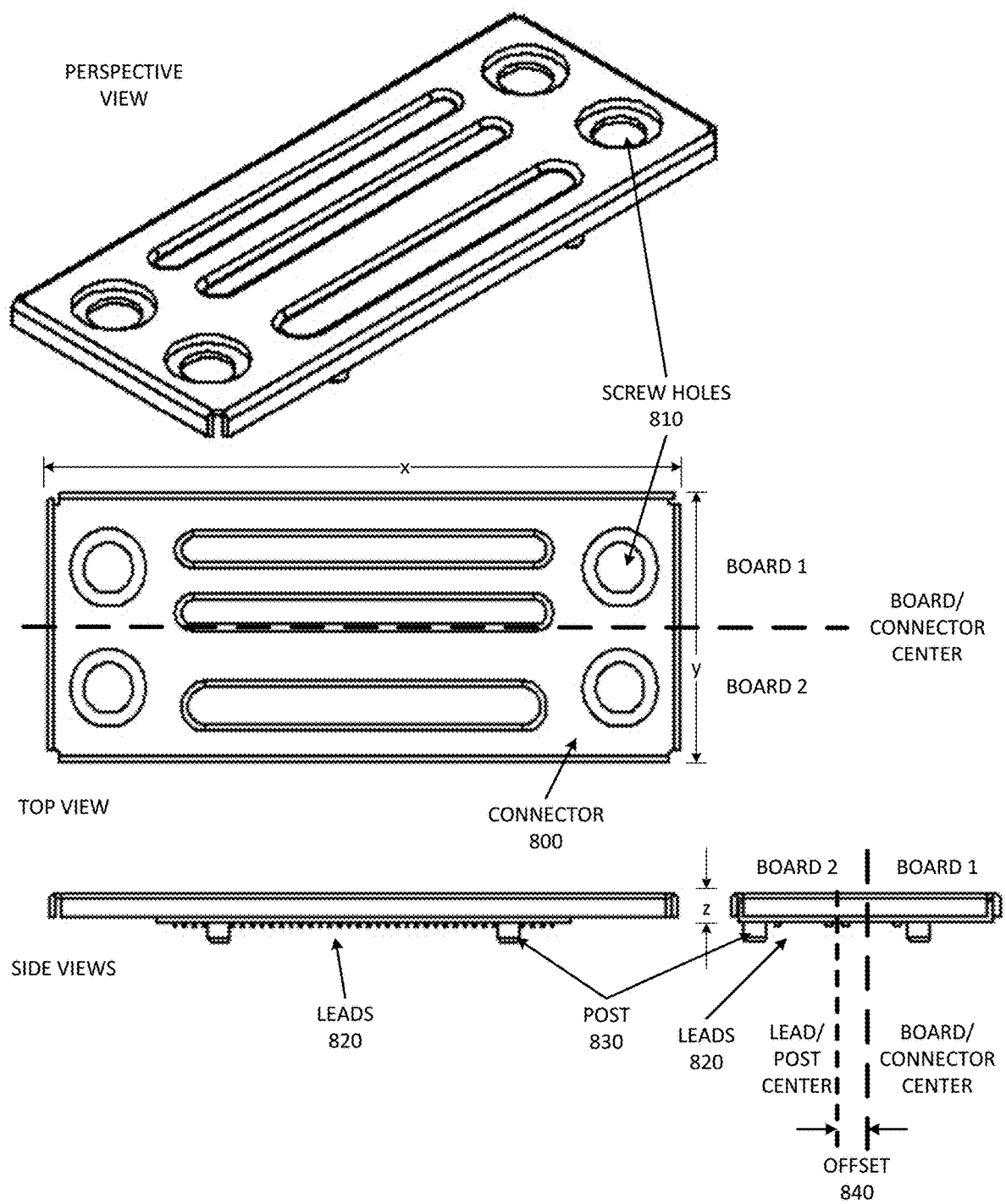
FIG. 8 is an example of a representation of an inline USM connector that connects to different rows of electrical pads by reversing the connector orientation.

FIG. 8 is an example of a representation of an inline USM connector that connects to different rows of electrical pads by reversing the connector orientation. Connector 800 is illustrated from a perspective view, a top view, and side views.

Connector 800 includes screw holes 810 to receive screws to secure the connector to PCBs. The side views illustrate leads 820, which extend below the bottom surface of the connector to contact with pads on the PCBs to be connected. The side views also illustrate posts 830, which represent alignment features of connector 800. They extend from the bottom of connector 800 to extend into alignment holes the boards to be connected.

The top view illustrates a dashed line to indicate that Board 1 will connect to the top half (as oriented in the diagram) of connector 800 and Board 2 will connect to the bottom half. It will be observed from the side view of the short edge of connector 800 that posts 830 can be offset relative to a center of connector 800 by offset 840.

In the side view of the long edge of connector 800, it can be seen that posts 830 can be symmetric with respect to leads 820. As described above, posts 830 do not necessarily need to be symmetric with respect to the leads, as long as they have the same offset when connector 800 is rotated by 180 degrees.

It will be understood that connector 800 is merely one example, and differences in shape, corrugations, shape and size of the corrugations, outline of the connector case, and other differences are possible. Furthermore, examples of dimensions are provided, which are example, and can be changed proportionally or changed in a way that changes the proportions or ratios of the connector dimensions. Thus, there are merely non-limiting examples.

In one example, connector 800 illustrates a 40-pin connector example. Dimensions can change proportionally for other numbers of leads, such as 30-pin, 50-pin, or 60-pin connectors. In one example, the x-dimension (e.g., length)

can be approximately 25-30 mm, such as 26.0 mm. The y dimension (e.g., width) can be approximately 10-12 mm, such as 10.75 mm. The z dimension (e.g., height) can be approximately 1-1.5 mm, such as 1.2 mm or 1.3 mm. For a 40-pin configuration, connector 800 can have approximately 0.4 mm of pitch between the pins or contacts. The dimension between the points of leads 820 can be approximately 4-5 mm, such as 4.3 mm. The dimension between posts 830 along the y-axis can be approximately 6-7 mm, such as 6.5 mm. The dimension between posts 830 along the x-axis can be approximately 10-15 mm, such as 13 mm. The dimensions between the screw holes along the y-axis can be approximately 4-6 mm, such as 5.0 mm, and along the x-axis can be approximately 20-24 mm, such as 21.25 mm.

Figure 9:
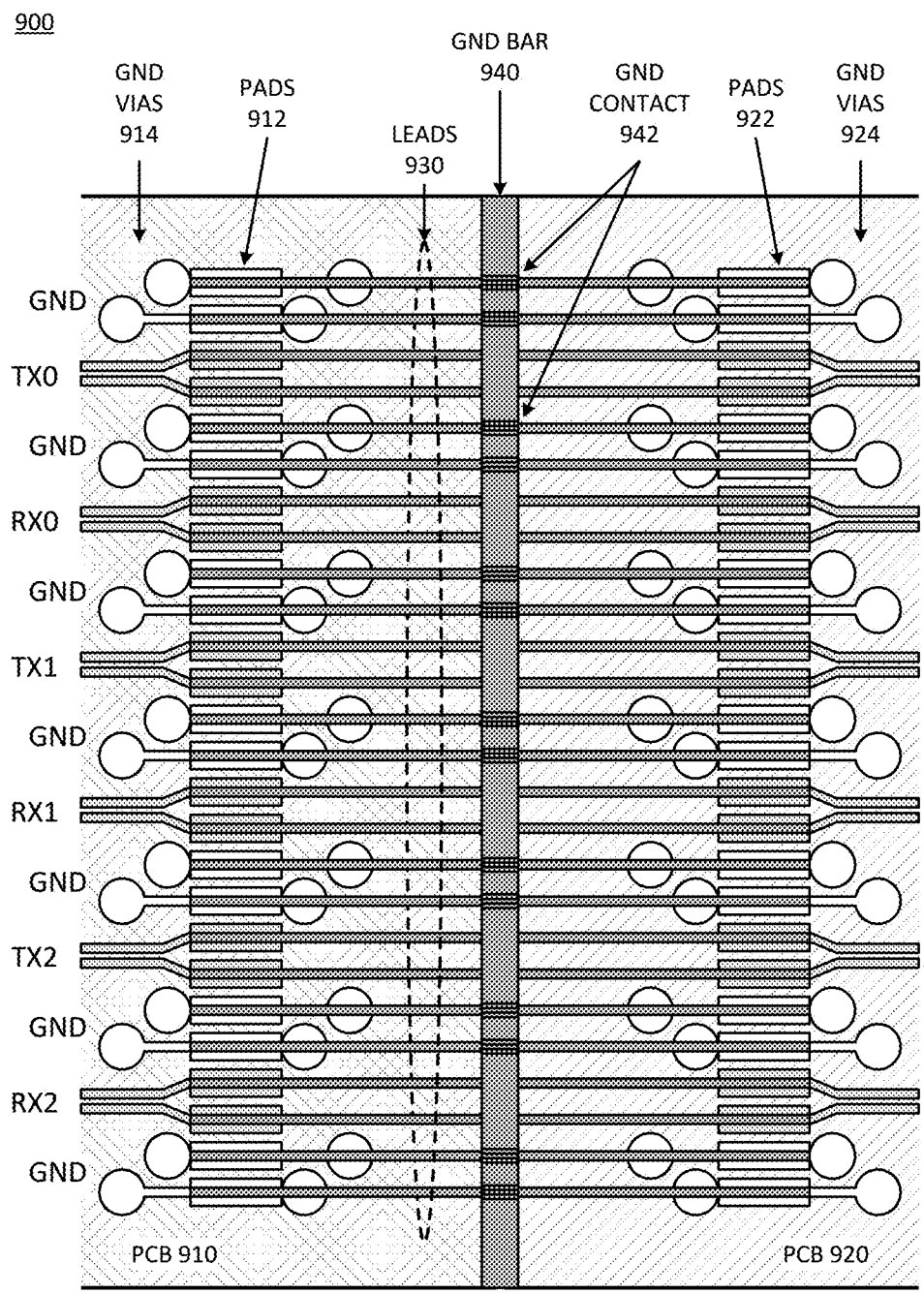
FIG. 9 is an example of a layout of boards to be connected by a USM connector.

FIG. 9 is an example of a layout of boards to be connected by a USM connector. Diagram 900 more specifically illustrates an overlay of leads or contacts from a connector over the layout of signal pads for a system to use a USM connector. The layout excludes the alignment holes, which could change the routing, either of ground vias, or of signal lines, or of both ground vias and signal lines.

Diagram 900 illustrates a connection of 26 signal lines. Some implementations will include more signal lines. Other implementations could have fewer signal lines. The basic features of the connector do not change regardless of the number of signal lines. However, an example below provides an example of a grounding improvement for a system with a large number of signals to connect.

PCB 910 represents a first PCB to be connected to PCB 920 as the second PCB. The PCBs are connected end-to-end or edge-to-edge. PCB 910 includes pads 912, which represent pads connected to signal lines, such as TX0, RX0, TX1, RX1, TX2, and RX2. The corresponding signal lines of PCB 920 are not illustrated, but the passthrough natures of the signals will be understood from diagram 900. PCB 920 includes pads 922 to be connected to pads 912 via leads 930 of a connector (not explicitly shown).

PCB 910 includes ground (GND) vias 914, which represent connections of the signal lines to the ground plane of PCB 910. Similarly, PCB 920 includes ground (GND) vias 924, which represent connections of the signal lines to the ground plane of PCB 920. It will be understood that the signal represented in differential signaling, where a signal and its complement are transmitted on parallel wires or signal lines. The differential signal can improve signal integrity in high speed signaling. The use of two ground signal lines between each differential pair can further improve signal integrity. Such a layout is not necessary.

In addition to being ground through the ground vias, in one example, the ground signal lines of leads 930 can be ground to ground (GND) bar 940, which illustrates ground (GND) contacts 942 for the ground signal lines. In accordance with what is described above, ground bar 940 can connect to a conductive cover for the connector, which is then grounded through the mounting screws.

Figure 10A:
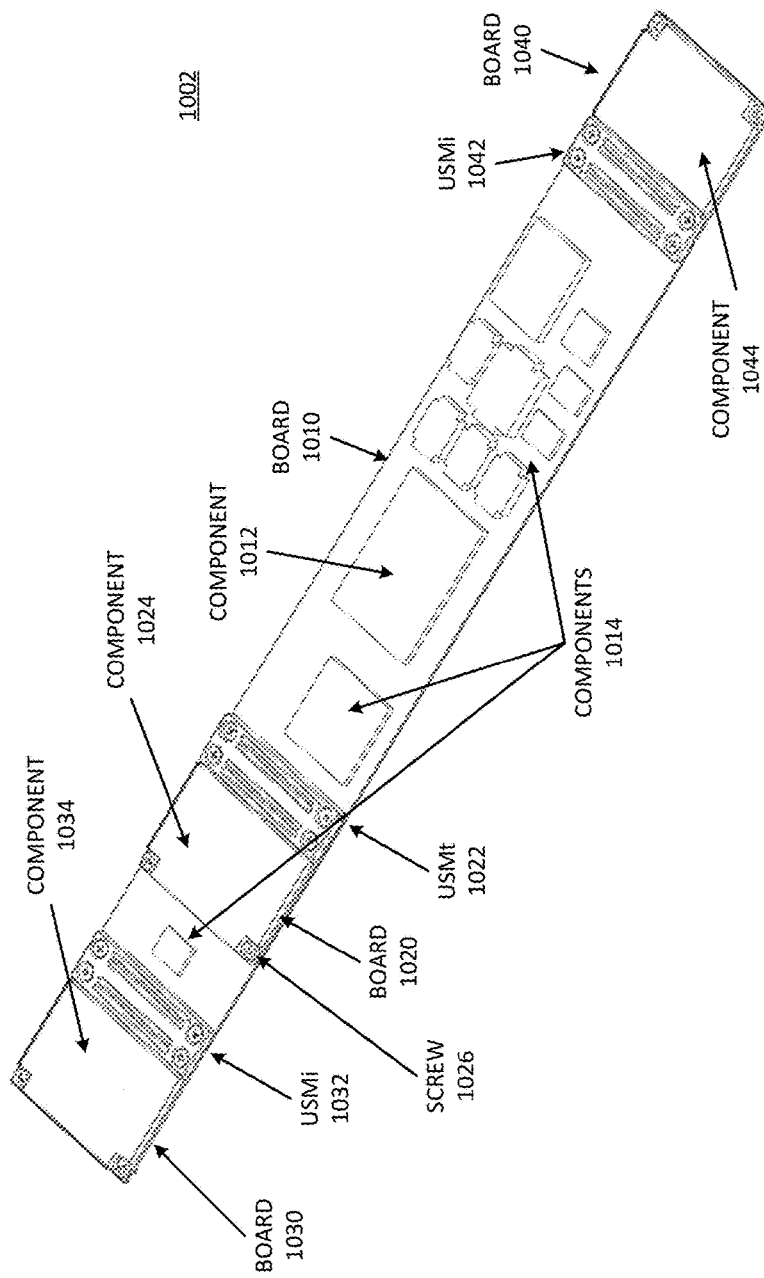
FIG. 10A-10B illustrate an example of a system ruler board with an inline USM connector and a top-mount USM connector.
Figure 10B:
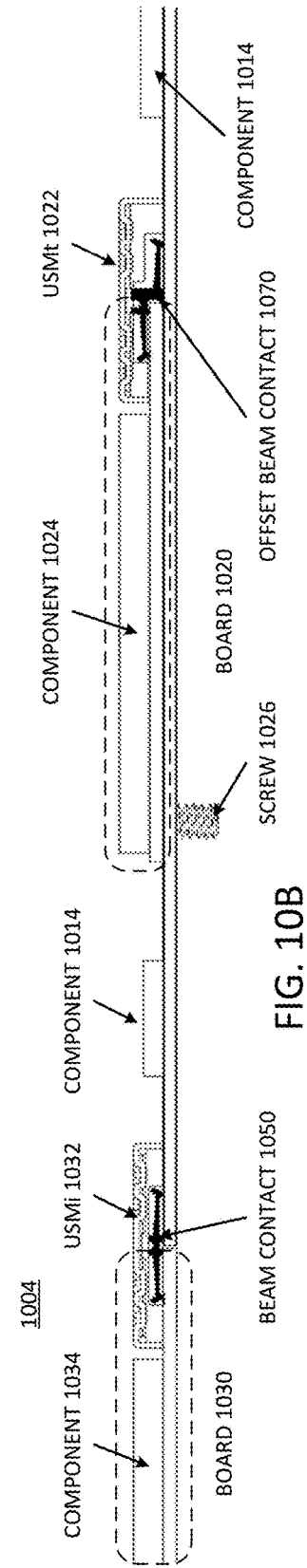

FIG. 10A-10B illustrate an example of a system ruler board with an inline USM connector and a top-mount USM connector. Board 1010 represents a system board as a ruler board configuration, where one dimension is significantly longer than the other. Assuming component 1012 represents a system processor or host processor SOC for board 1010, it can be observed that one dimension of board 1010 is not significantly larger than the dimensions of the processor, and the other dimension of board 1010 is significantly larger.

FIG. 10A illustrates view 1002, which is a perspective view of board 1010 and the components connected on and to it. View 1002 represents the relative dimensions of board 1010. Board 1010 includes components 1014, which are components other than the system processor. There can be any number of components in any configuration for a specific implementation of board 1010.

In one example, the system includes USMi 1042, which represents an inline low profile connector to connect board 1040 to board 1010. Board 1010 includes one or more components 1044 to provide the functionality of the add-in board. In the system of view 1002, board 1040 is connected to one end of board 1010 across the short dimension.

In one example, the system includes USMi 1032, which represents an inline low profile connector to connect board 1030 to the other end of board 1010, opposite the end to which board 1040 is connected. Board 1030 includes one or more components 1034 mounted on the board to provide functionality to board 1010.

In one example, the system includes USMt 1022, which represents a top mount low profile connector to connect board 1020 to board 1010. In one example, board 1020 rests on board 1010 or is in contact with board 1010. In an alternate example, board 1020 could be mounted over the top of board 1030, with a connector USMt 1022 that has a higher vertical offset between the two sides. Board 1020 includes one or more components 1024 mounted on board 1020. In one example, board 1020 is secured to board 1010 via USMt 1022 and screw 1026.

FIG. 10B illustrates view 1004, which is a side view of view 1002, showing just the end of the board 1010 with board 1020 and board 1030 connected to it. In view 1004, it can be seen that board 1020 rests against board 1010 when connected with USMt 1022. In contrast to board 1020 resting against board 1010, board 1030 is inline or co-planar with board 1010, connected with USMi 1032.

The darkened area within USMi 1032 represents a contact or lead for the inline connector. The lead is identified as beam contact 1050. The beam contact refers to the side-view profile of the lead, which illustrates one or more supports in the middle of the lead, and arms extending out to either side of the middle support.

The darkened area within USMt 1022 represents a contact or lead for the top mount connector. The lead is identified as offset beam contact 1070. The offset beam contact has a similar side profile as the straight beam contact, with one of the arms vertically offset relative to the other arm. The vertical offset of the arms will reflect the vertical offset of the top mount connector, and the vertical difference between the surfaces of the two boards to connect. Offset beam contact 1070 could alternatively be referred to as a dual beam contact, referring to the different arms as different beams extending out from the center supports of the contact.

Figure 10C:
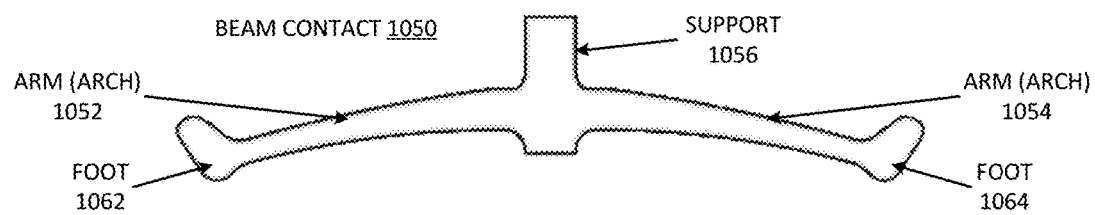
FIG. 10C is an example of a beam contact for an inline USM connector.

FIG. 10C is an example of a beam contact for an inline USM connector. Beam contact 1050 is a closer view of a contact in accordance with the darkened area within USMi 1032 from view 1004. It can be observed that the darkened area in FIG. 10B has two supports in the middle, whereas beam contact 1050 in FIG. 10C illustrates only a single contact. The beam contact or the lead for the inline connector can include either a single center support or multiple center supports.

Beam contact 1050 illustrates support 1056 in the center of the contact, arm 1052 having an arch shape, extending in one direction away from support 1056, and arm 1054 having an arch shape, extending in the other direction away from support 1056. Arm 1052 includes foot 1062, which is the portion of the contact that will rest on the pad on the surface of the first board to connect. Arm 1054 includes foot 1064, which is the portion of the contact that will rest on the pad on the surface of the second board to connect. It will be understood that "first" and "second" boards are relative, and the designations can be reversed.

Arm 1052 and arm 1054 include arch shapes, having a curvature from support 1056 to foot 1062 and from support 1056 to foot 1064, respectively. The curvature allows beam contact 1050 to flex. The flexion provides pressure on foot 1062 and on foot 1064 to maintain the feet in contact with their respective pads. The flex is created by a downward force exerted as the screws secure the connector to the boards.

Figure 10D:
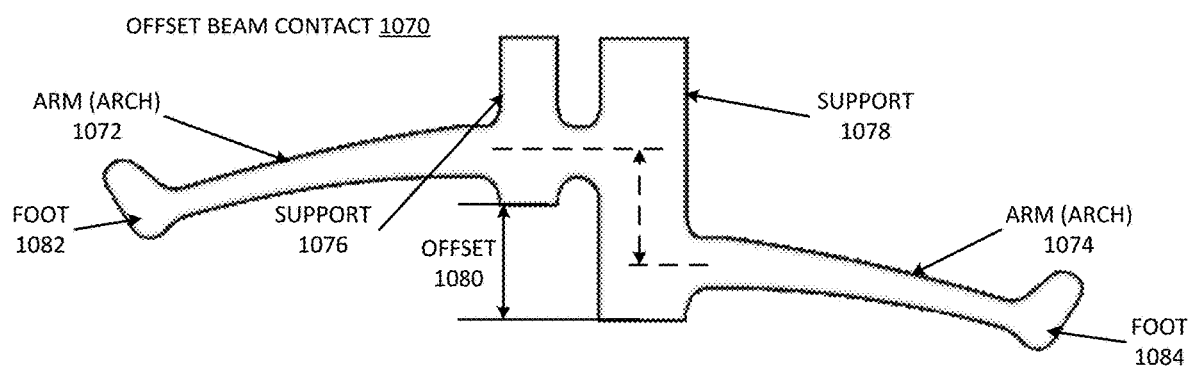
FIG. 10D is an example of a beam contact for a top mount USM connector.

FIG. 10D is an example of a beam contact for a top mount USM connector. Offset beam contact 1070 is a closer view of a contact in accordance with the darkened area within USMt 1022 from view 1004. It can be observed that the darkened area in FIG. 10B has two supports in the middle, as does offset beam contact 1070 in FIG. 10D. The offset beam contact or the lead for the top mount connector can include either a single center support or multiple center supports.

Offset beam contact 1070 illustrates support 1076 in the center of the contact, with arm 1072 having an arch shape, extending away from support 1076. The shorter support 1076 connects to arm 1072, which will connect with the board having the higher vertical position. Offset beam contact 1070 illustrates support 1078 in the center of the contact, with arm 1074 having an arch shape, extending away from support 1078. The longer support 1078 connects to arm 1074, which will connect with the board having the lower vertical position. In one example, support 1078 is thicker than support 1076, which can enable the support to better pass the force from the connector down the additional vertical distance to arm 1074.

Arm 1072 includes foot 1082, which is the portion of the contact that will rest on the pad on the surface of the first board to connect. Arm 1074 includes foot 1084, which is the portion of the contact that will rest on the pad on the surface of the second board to connect. It will be understood that "first" and "second" boards are relative, and the designations can be reversed.

Arm 1072 and arm 1074 include arch shapes, having a curvature from support 1076 to foot 1082 and from support 1078 to foot 1084, respectively. The curvature allows offset beam contact 1070 to flex, and more specifically, to allow each arm to flex. The flexion provides pressure on foot 1082 and on foot 1084 to maintain the feet in contact with their respective pads. The flex is created by a downward force exerted as the screws secure the connector to the boards.

Offset 1080 represents the vertical offset between the boards that will be connected by a connector with offset beam contact 1070. It will be observed by the dashed lines and dashed arrow that offset 1080 for the boards can match the offset for arm 1072 and arm 1074. Maintaining the arms with the same relative shape can maintain the same relative flex properties, with adjustments to the center support or supports to appropriately direct the force of the connector to the beams.

Figure is an example of an add-in board with a top mount USM connector. System 1100 illustrates an example of an add-in board that connects to a system board or to another add-in board with a top mount, low profile connector. Board 1110 represents the add-in board itself, and connector 1130 represents the top mount connector.

Board 1110 includes one or more components 1120 mounted on the board. In one example, the element in system 1100 identified as component 1120 represents a shield or covering for multiple components that are mounted on board 1110. A shield or covering can be a requirement for electromagnetic interference compliance. The presence of such a shield illustrates another advantage to the connectors described, in that the connectors can include a conductive shield or case that is grounded, which will reduce the noise for high speed signaling to and from an add-in board.

Screw hole 1112 in board 1110 represents a hole to receive a mounting screw, which connects to the board and not directly to connector 1130. Screw holes 1132 represent screw holes in connector 1130 to receive screws. The mounting screws for the connector can be referred to as connector screws, specifically to secure the connector on one side to the first board and on the other side to the second board. The second board is not specifically illustrated in system 1100. Screw 1140 represents a screw to secure the connector to add-in board 1110. The screw holes for the screws to the system board, receiver board, or carrier board are not shown in system 1100.

In one example, the features of connector 1130 will be the same or nearly the same as a comparable inline board, except for features that allow the vertical difference between the two sides of the connector. In one example, connector 1130 includes corrugation 1134. The examples of dimensions provided above with respect to connector 600 can provide example of dimensions for connector 1130, with the exception of the z-axis dimension. The z-axis dimension can be different for different configurations of connector 1130, such as what is described in the examples of FIGS. 12-18. In those example, the dimensions of the components are not necessarily all drawn to scale.

System 1100 illustrates offset 1150, which represents the offset between the add-in side of connector 1130 and the receiver board side of connector 1130. The offset in system 1100 is simply the thickness of board 1110. In other configurations, the offset will be higher.

Figure 11A:
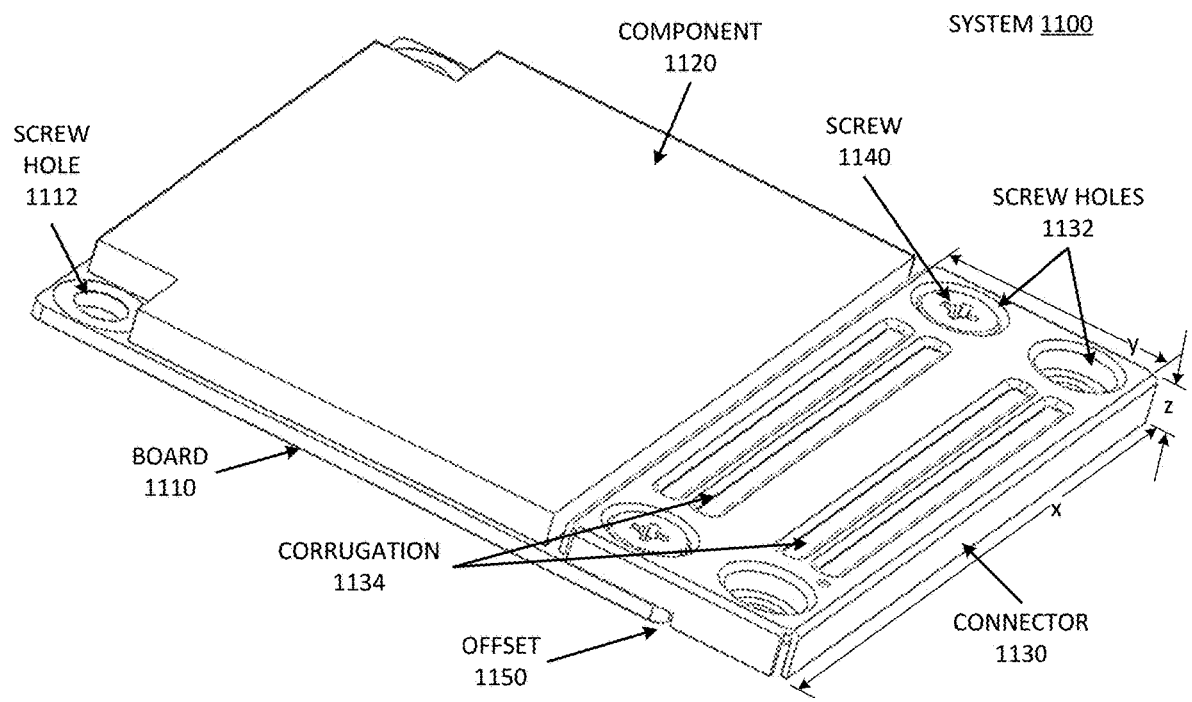
FIG. 11A is an example of an add-in board with a top mount USM connector.
Figure 11B:
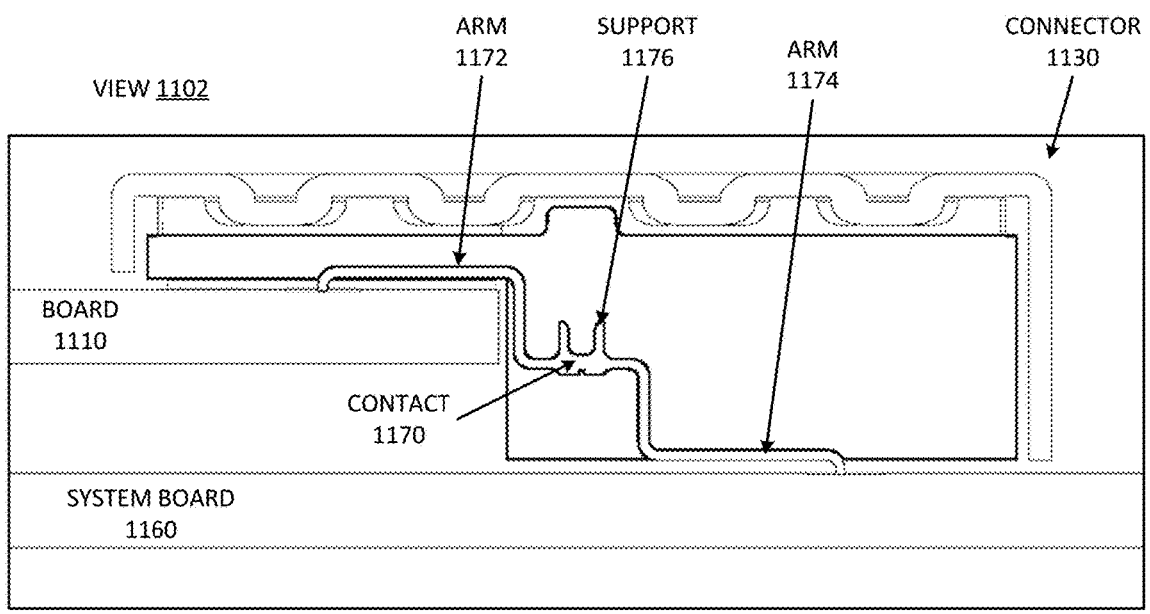
FIG. 11B is an example of a contact for a top mount USM connector.

FIG. 11B is an example of a contact for a top mount USM connector. Offset beam contact 1070 of FIG. 10D provides one example of a USMt contact. View 1102 provides a view of system 1100 with an alternative implementation of a USMt contact. View 1102 illustrates board 1110 above system board 1160. Connector 1130 connects board 1110 to system board 1160.

View 1102 includes contact 1170 to provide electrical contact between pads on board 1110 and pads on system board 1160. In one example, contact 1170 includes arm 1172, extended in a curve up from the middle of connector 1130 to the pads of board 1110. In one example, contact 1170 includes arm 1174, extended in a curve down from the middle of connector 1130 to the pads of system board 1160. In one example, the middle of connector 1130 includes one or more supports 1176. The supports can connect the arms of contact 1170 to the mechanical structure (e.g., the lead frame) of connector 1130.

Figure 12:
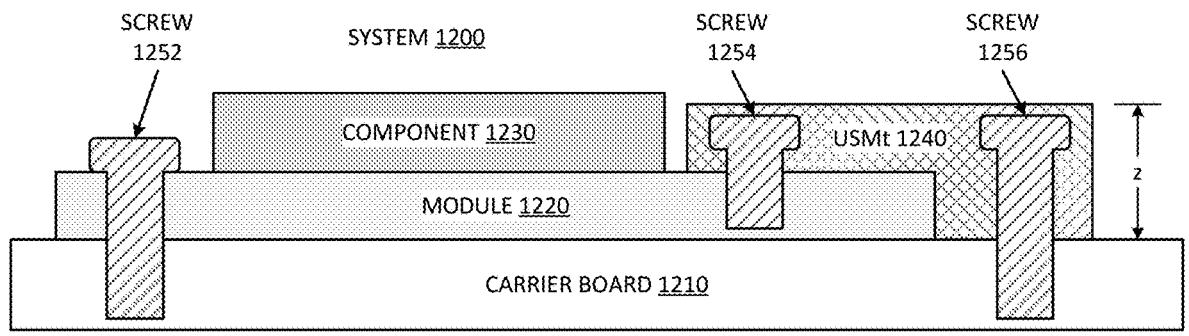
FIG. 12 is an example of a system configuration with a top mount USM connector with an add-in board directly against a system board.

FIG. 12 is an example of a system configuration with a top mount USM connector with an add-in board directly against a system board. System 1200 represents an example of a system with a top mount connector. Carrier board 1210 represents a board to which an add-in board with be connected, such as a system board, a motherboard, or another add-in board.

Module 1220 represents the add-in board, having one or more components 1230 mounted on the module board. USMt 1240 represents a top mount connector to connect module 1220 to carrier board 1210. Screw 1252 represents a screw at the "back" end of module 1220, which is the end of module 1220 opposite USMt 1240. Screw 1252 has a head that secures to the PCB of module 1220, with threading that extends through the board of module 1220 and into carrier board 1210.

Screw 1254 represents a screw that secures USMt 1240 to module 1220. Screw 1256 represents a screw that secures USMt 1240 to carrier board 1210. In one example, screw 1254 has a head that rests within a recess in the connector associated with a screw hole. Screw 1254 extends into module 1220 but not into carrier board 1210. In one example, screw 1256 has a head that rests within a recess in the connector associated with a screw hole.

The height (identified as the z dimension) can depend on the thickness of the board of module 1220. For example, for a 0.6 mm PCB for module 1220, USMt 1240 could have a height, z, of approximately 2.0 mm. As another example, for a 0.8 mm PCB for module 1220, USMt 1240 could have a height, z, of approximately 2.2 mm.

Figure 13:
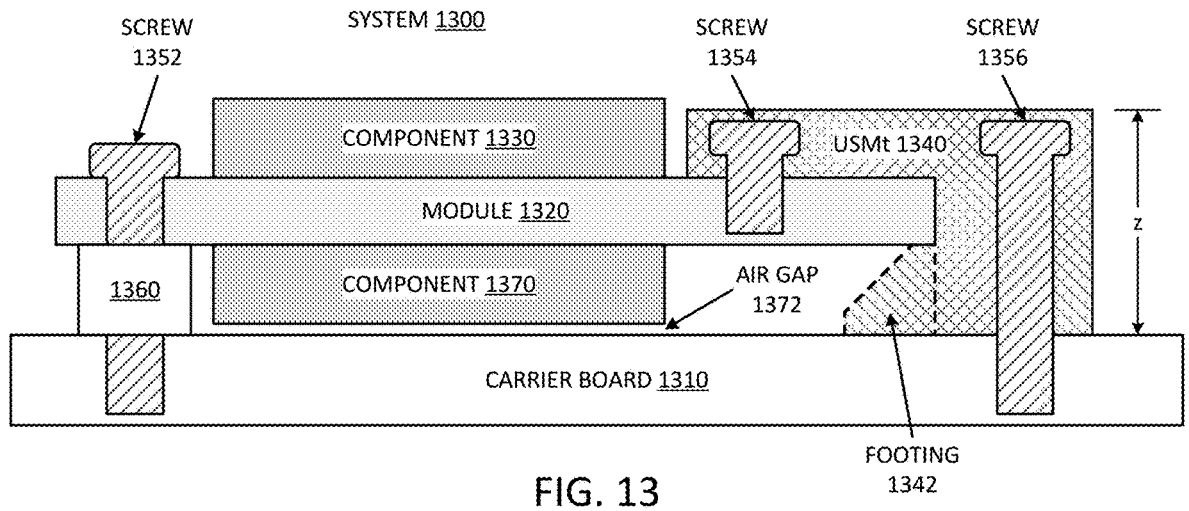
FIG. 13 is an example of a system configuration with a top mount USM connector having a height offset to allow clearance for components on the add-in board between the add-in board and the system board.

FIG. 13 is an example of a system configuration with a top mount USM connector having a height offset to allow clearance for components on the add-in board between the add-in board and the system board. System 1300 represents an example of a system with a top mount connector. Carrier board 1310 represents a board to which an add-in board can be connected, such as a system board, a motherboard, or another add-in board.

Module 1320 represents the add-in board, having one or more components 1330 mounted on the module board on a surface that includes the pads or contacts to which USMt 1340 will connect. USMt 1340 represents a top mount connector to connect module 1320 to carrier board 1310. In one example, module 1320 includes one or more components 1370 on the module board on a surface opposite the surface that includes the pads or contacts. Considering the surface of module 1320 that has the pads to be the "top" surface, the module includes components 1330 on the top surface and includes components 1370 on the bottom surface.

Screw 1352 represents a screw at the "back" end of module 1320, which is the end of module 1320 opposite USMt 1340. Screw 1352 has a head that secures to the PCB of module 1320, with threading that extends through the board of module 1320 and into carrier board 1310. In one example, system 1300 includes spacer or standoff 1360 to bridge the gap between the board of module 1320 and carrier board 1310. The standoff can fit to a screw hole.

Screw 1354 represents a screw that secures USMt 1340 to module 1320. Screw 1356 represents a screw that secures USMt 1340 to carrier board 1310. In one example, screw 1354 has a head that rests within a recess in the connector associated with a screw hole. Screw 1354 extends into module 1320 but not out the other side. In one example, screw 1356 has a head that rests within a recess in the connector associated with a screw hole.

In one example, USMt 1340 includes footing 1342, which could alternatively be referred as a base or support. Footing 1342 represents a structure of USMt 1340 to provide structural support to module 1320 when connecting module 1320 to carrier board 1310. When module 1320 is supported at one end by screw 1352 secured to carrier board 1310 through standoff 1360, and on the other end by USMt 1340, there can be significant stress on the board through screw 1354. Footing 1342 extends USMt 1340 under the end or the edge of module 1320 that interfaces with USMt 1340. With footing 1342, USMt 1340 can contact the surface of module 1320 that has the pads, as well as the opposite surface, as well as the edge of the module board that connects the two surfaces. Footing 1342 can include a ledge or extension that extends under module 1320 to allow a place for the edge of the board to rest or contact, which reduces the force on the board by screw 1354 by transferring force onto the physical contact of the board edge with the connector.

In one example, USMt 1340 has a height sufficient to leave air gap 1372 between component 1370 mounted on module 1320 and carrier board 1310. In one example, instead of leaving an air gap, the space could be occupied by a material that provides electrical isolation and thermal conductivity. Air gap 1372 can be any amount of space that makes sense for a system architecture. In one example, air gap 1372 is approximately 0.3 mm.

The height of USMt 1340 (identified as the z dimension) can depend on the thickness of the board of module 1320 and how much space to leave under the module. For example, for a 0.6 mm PCB for module 1320, USMt 1340 could have a height, z, of approximately 3.3 mm for clearance for components that have a height of approximately 1.0 mm. As another example, for a 0.8 mm PCB for module 1320, USMt 1340 could have a height, z, of approximately 3.5 mm for clearance for components that have a height of approximately 1.0 mm. As another example, for a 0.6 mm PCB for module 1320, USMt 1340 could have a height, z, of approximately 3.8 mm for clearance for components that have a height of approximately 1.5 mm. As another example, for a 0.8 mm PCB for module 1320, USMt 1340 could have a height, z, of approximately 4.0 mm for clearance for components that have a height of approximately 1.5 mm.

Figure 14A:
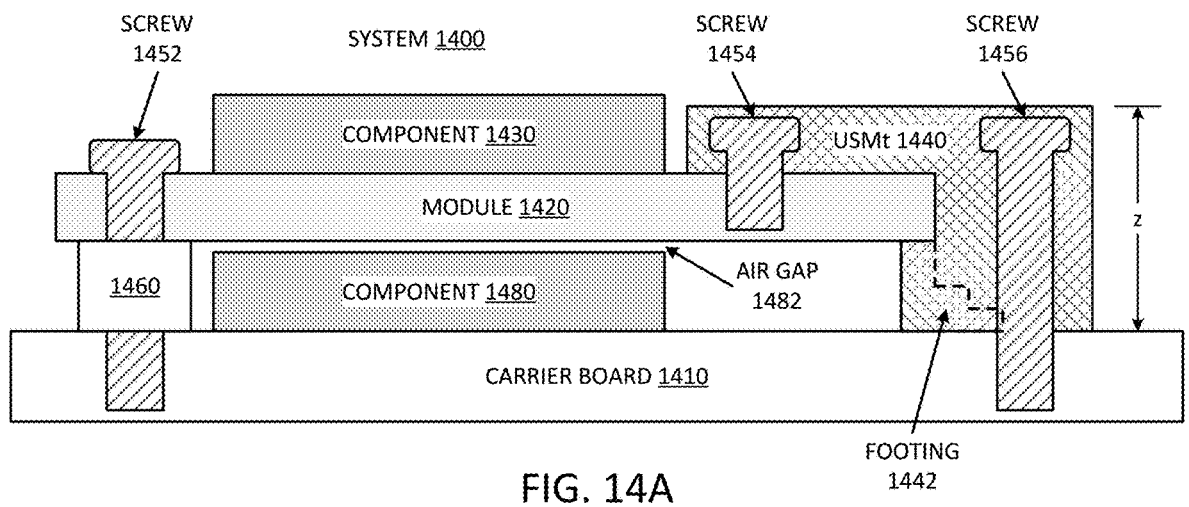
FIG. 14A is an example of a system configuration with a top mount USM connector having a height offset to allow clearance for components on the system board between the add-in board and the system board.

FIG. 14A is an example of a system configuration with a top mount USM connector having a height offset to allow clearance for components on the system board between the add-in board and the system board. System 1400 represents an example of a system with a top mount connector. Carrier board 1410 represents a board to which an add-in board can be connected, such as a system board, a motherboard, or another add-in board.

Module 1420 represents the add-in board, having one or more components 1430 mounted on the module board on a surface that includes the pads or contacts to which USMt 1440 will connect. USMt 1440 represents a top mount connector to connect module 1420 to carrier board 1410. In one example, carrier board 1410 includes one or more components 1480 to be mounted on the carrier board under module 1420.

Screw 1452 represents a screw at the "back" end of module 1420, which is the end of module 1420 opposite USMt 1440. Screw 1452 has a head that secures to the PCB of module 1420, with threading that extends through the board of module 1420 and into carrier board 1410. In one example, system 1400 includes spacer or standoff 1460 to bridge the gap between the board of module 1420 and carrier board 1410.

Screw 1454 represents a screw that secures USMt 1440 to module 1420. Screw 1456 represents a screw that secures USMt 1440 to carrier board 1410. In one example, screw 1454 has a head that rests within a recess in the connector associated with a screw hole. Screw 1454 extends into module 1420 but not out the other side. In one example, screw 1456 has a head that rests within a recess in the connector associated with a screw hole.

In one example, USMt 1440 includes footing 1442, which could alternatively be referred as a base or support. Footing 1442 represents a structure of USMt 1440 to provide structural support to module 1420 when connecting module 1420 to carrier board 1410. When module 1420 is supported at one end by screw 1452 secured to carrier board 1410 through standoff 1460, and on the other end by USMt 1440, there can be significant stress on the board through screw 1454. Footing 1442 extends USMt 1440 under the end or the edge of module 1420 that interfaces with USMt 1440. With footing 1442, USMt 1440 can contact the surface of module 1420 that has the pads, as well as the opposite surface, as well as the edge of the module board that connects the two surfaces. Footing 1442 can include a ledge or extension that extends under module 1420 to allow a place for the edge of the board to rest or contact, which reduces the force on the board by screw 1454 by transferring force onto the physical contact of the board edge with the connector.

In one example, footing 1442 extends in steps within USMt 1440. Footing 1442 can be an alternative footing design to footing 1342 of system 1300. Footing 1442 has a portion under the module board and structure that extends away from the module board toward the system board. Footing 1342 has a portion under the module board and structure that extends under the module board toward the system board. While footing 1342 is illustrated as having a slanted edge and footing 1442 is illustrated as stepped, in alternative versions of the footings, either footing can be slanted and either footing can be stepped.

In one example, USMt 1440 has a height sufficient to leave air gap 1482 between component 1480 mounted on carrier board 1410 and the bottom of module 1420, considering the surface of module 1420 with the pads and component 1430 to be the top of the module. In one example, instead of leaving an air gap, the space could be occupied by a material that provides electrical isolation and thermal conductivity. Air gap 1482 can be any amount of space that makes sense for a system architecture. In one example, air gap 1482 is approximately 0.3 mm.

The height of USMt 1440 (identified as the z dimension) can depend on the thickness of the board of module 1420 and how much space to leave under the module. For example, for a 0.6 mm PCB for module 1420, USMt 1440 could have a height, z, of approximately 4.4 mm, providing clearance for components that have a height of approximately 2.1 mm. As another example, for a 0.8 mm PCB for module 1420, USMt 1440 could have a height, z, of approximately 4.4 mm for clearance for components that have a height of approximately 1.9 mm.

Figure 14B:
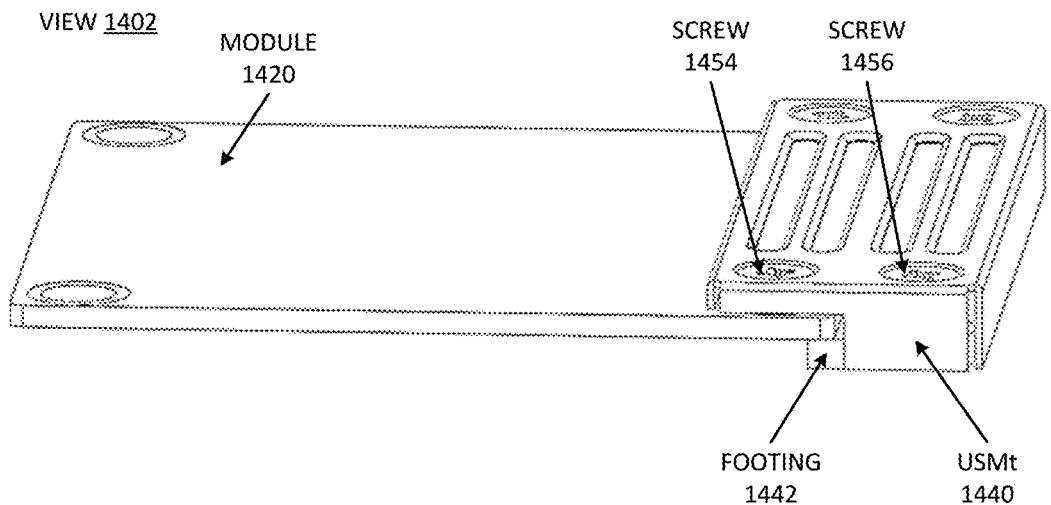
FIG. 14B is a representation of a top mount connector with a stepped footing.

FIG. 14B is a representation of a top mount connector with a stepped footing. View 1402 illustrates module 1420 connected with USMt 1440. Screw 1454 secures module 1420 to USMt 1440. Screw 1456 secures USMt 1440 to a system board. Footing 1442 represents a structure of USMt 1440 that extends under module 1420 to provide additional structural support for module 1420.

Figure 14C:
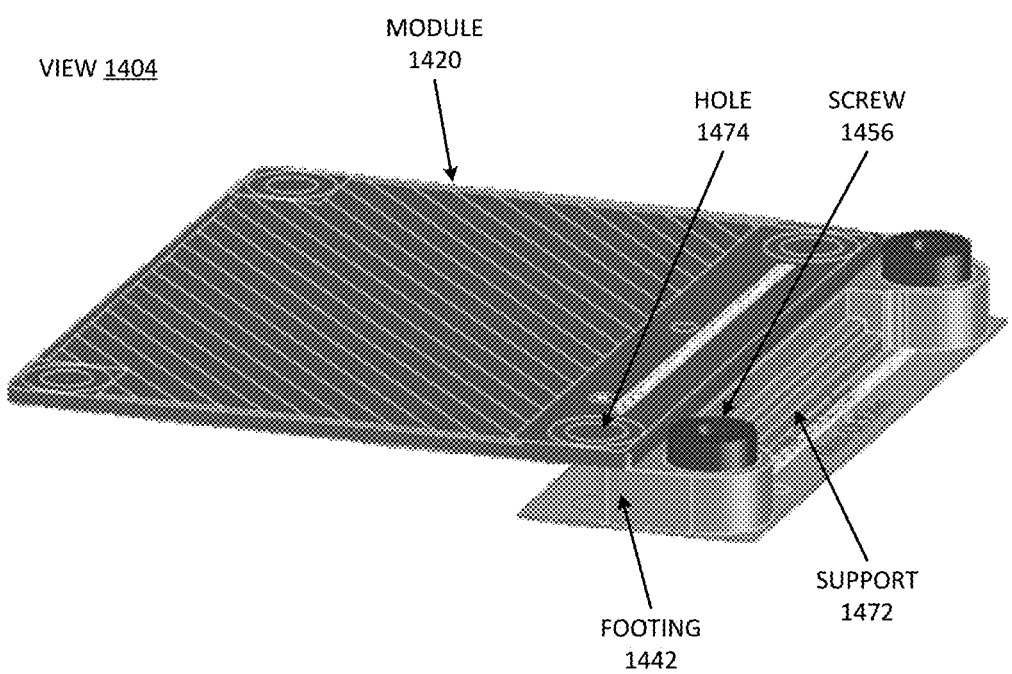
FIG. 14C is a perspective view of the top mount connector of FIG. 14B.

FIG. 14C is a perspective view of the top mount connector of FIG. 14B. View 1404 illustrates module 1420 supported on the internal elements of USMt 1440. The external case of USMt 1440 is removed for view 1404. Hole 1474 represents a hole to receive screw 1454 to secure module 1420 to USMt 1440. View 1404 illustrates screw 1456. View 1404 illustrates footing 1442 extending under module 1420. View 1404 also illustrates support 1472 for footing 1442. In one example, footing 1442 extends under USMt 1440 away from module 1420. In one example, support 1472 includes multiple steps, to provide physical structure from the system board up to the edge or end of module 1420.

FIG. 15 is an example of a system configuration with a top mount USM connector to mount an add-in board above another add-in board directly against a system board with another top mount USM connector. System 1500 represents an example of a system with a top mount connector. System board 1510 represents a board to which an add-in board can be connected, such as a primary system board or a motherboard. System 1500 represents two add-in boards connected to system board 1510.

Module 1520 represents a first add-in board, having one or more components 1522 mounted on the module board. USMt 1540 represents a top mount connector to connect module 1520 to system board 1510. Screw 1562 represents a screw at the "back" end of module 1520, which is the end of module 1520 opposite USMt 1540. Screw 1562 has a head that secures to the PCB of module 1520, with threading that extends through the board of module 1520 and into system board 1510.

Screw 1564 represents a screw that secures USMt 1540 to module 1520. Screw 1566 represents a screw that secures USMt 1540 to system board 1510. In one example, screw 1564 has a head that rests within a recess in the connector associated with a screw hole. Screw 1564 extends into module 1520 but not into system board 1510. In one example, screw 1566 has a head that rests within a recess in the connector associated with a screw hole.

The height of USMt 1540 (identified as the z1 dimension) can depend on the thickness of the board of module 1520. For example, for a 0.6 mm PCB for module 1520, USMt 1540 could have a height, z1, of approximately 2.0 mm. As another example, for a 0.8 mm PCB for module 1520, USMt 1540 could have a height, z1, of approximately 2.2 mm.

Module 1530 represents a second add-in board, having one or more components 1532 mounted on the module board on a surface that includes the pads or contacts to which USMt 1550 will connect. Module 1530 is mounted over the top of module 1520. USMt 1550 represents a top mount connector to connect module 1530 to system board 1510 over module 1520.

Screw 1572 represents a screw at the "back" end of module 1530, which is the end of module 1530 opposite USMt 1550. Screw 1572 has a head that secures to the PCB of module 1530, with threading that extends through the board of module 1530 and into system board 1510. In one example, system 1500 includes spacer or standoff 1512 to bridge the gap between the board of module 1530 and system board 1510.

Screw 1574 represents a screw that secures USMt 1550 to module 1530. Screw 1576 represents a screw that secures USMt 1550 to system board 1510. In one example, screw 1574 has a head that rests within a recess in the connector associated with a screw hole. Screw 1574 extends into module 1530 but not out the other side. In one example, screw 1576 has a head that rests within a recess in the connector associated with a screw hole.

In one example, USMt 1550 includes footing 1552, which could alternatively be referred as a base or support. Footing 1552 represents a structure of USMt 1550 to provide structural support to module 1530 when connecting module 1530 to system board 1510. When module 1530 is supported at one end by screw 1572 secured to system board 1510 through standoff 1512, and on the other end by USMt 1550, there can be significant stress on the board through screw 1574. Footing 1552 extends USMt 1550 under the end or the edge of module 1530 that interfaces with USMt 1550. With footing 1552, USMt 1550 can contact the surface of module 1530 that has the pads, as well as the opposite surface, as well as the edge of the module board that connects the two surfaces. Footing 1552 can include a ledge or extension that extends under module 1530 to allow a place for the edge of the board to rest or contact, which reduces the force on the board by screw 1574 by transferring force onto the physical contact of the board edge with the connector.

In one example, USMt 1550 has a height sufficient to leave air gap 1580 between component 1522 and USMt 1540 and the bottom of module 1530, considering the surface of module 1530 with the pads and component 1532 to be the top of the module. In one example, instead of leaving an air gap, the space could be occupied by a material that provides electrical isolation and thermal conductivity. Air gap 1580 can be any amount of space that makes sense for a system architecture. In one example, air gap 1580 is approximately 0.4 mm.

The height of USMt 1550 (identified as the z2 dimension) can depend on the thickness of the module boards and how much space to leave under module 1530. For example, for a 0.6 mm PCB for module 1530, USMt 1550 could have a height, z2, of approximately 4.4 mm, providing clearance for module 1520 having a board thickness of 0.6 mm and components that have a height of approximately 1.4 mm.

FIG. 16 is an example of a system configuration with a top mount USM connector to mount an add-in board above another add-in board directly against a system board with another top mount USM connector, where both add-in board are secured with a common mounting screw. System 1600 provides an example of system 1500 of FIG. 15, where the two add-in boards share a back-of-the-board screw. Such a configuration could require extending the board dimension of the top add-in board, or be more ideally suited for modules of different size that can naturally take advantage of sharing the screw. Sharing the screw could be beneficial not just for reducing the part count of the system, but for reducing screw holes to allow more board space for signal routing on the system board. The descriptions of system 1600 are provided below for completeness.

System 1600 represents an example of a system with a top mount connector. System board 1610 represents a board to which an add-in board can be connected, such as a primary system board or a motherboard. System 1600 represents two add-in boards connected to system board 1610. Module 1620 represents a first add-in board, having one or more components 1622 mounted on the module board. USMt 1640 represents a top mount connector to connect module 1620 to system board 1610. Module 1620 has no separate screw for the back of the module, but shares screw 1672 with module 1630.

Screw 1664 represents a screw that secures USMt 1640 to module 1620. Screw 1666 represents a screw that secures USMt 1640 to system board 1610. In one example, screw 1664 has a head that rests within a recess in the connector associated with a screw hole. Screw 1664 extends into module 1620 but not into system board 1610. In one example, screw 1666 has a head that rests within a recess in the connector associated with a screw hole.

The height of USMt 1640 (identified as the z1 dimension) can depend on the thickness of the board of module 1620. For example, for a 0.6 mm PCB for module 1620, USMt 1640 could have a height, z1, of approximately 2.0 mm. As another example, for a 0.8 mm PCB for module 1620, USMt 1640 could have a height, z1, of approximately 2.2 mm.

Module 1630 represents a second add-in board, having one or more components 1632 mounted on the module board on a surface that includes the pads or contacts to which USMt 1650 will connect. Module 1630 is mounted over the top of module 1620. USMt 1650 represents a top mount connector to connect module 1630 to system board 1610 over module 1620.

Screw 1672 represents a screw at the "back" end of module 1630, which is the end of module 1630 opposite USMt 1650. Screw 1672 has a head that secures to the PCB of module 1630, with threading that extends through the board of module 1630, through the board of module 1620, and into system board 1610. In one example, system 1600 includes standoff or spacer 1624 to bridge the gap between the board of module 1630 and the board of module 1620.

Screw 1674 represents a screw that secures USMt 1650 to module 1630. Screw 1676 represents a screw that secures USMt 1650 to system board 1610. In one example, screw 1674 has a head that rests within a recess in the connector associated with a screw hole. Screw 1674 extends into module 1630 but not out the other side. In one example, screw 1676 has a head that rests within a recess in the connector associated with a screw hole.

In one example, USMt 1650 includes footing 1652, which could alternatively be referred as a base or support. Footing 1652 represents a structure of USMt 1650 to provide structural support to module 1630 when connecting module 1630 to system board 1610. When module 1630 is supported at one end by screw 1672 secured to system board 1610 through standoff 1624, and on the other end by USMt 1650, there can be significant stress on the board through screw 1674. Footing 1652 extends USMt 1650 under the end or the edge of module 1630 that interfaces with USMt 1650. With footing 1652, USMt 1650 can contact the surface of module 1630 that has the pads, as well as the opposite surface, as well as the edge of the module board that connects the two surfaces. Footing 1652 can include a ledge or extension that extends under module 1630 to allow a place for the edge of the board to rest or contact, which reduces the force on the board by screw 1674 by transferring force onto the physical contact of the board edge with the connector.

In one example, USMt 1650 has a height sufficient to leave air gap 1680 between component 1622 and USMt 1640 and the bottom of module 1630, considering the surface of module 1630 with the pads and component 1632 to be the top of the module. In one example, instead of leaving an air gap, the space could be occupied by a material that provides electrical isolation and thermal conductivity. Air gap 1680 can be any amount of space that makes sense for a system architecture. In one example, air gap 1680 is approximately 0.4 mm.

In one example, the moving of module 1620 back to share screw 1672 with module 1630 can leave room between USMt 1640 and USMt 1650 for one or more components 1622. In one example, component 1622 can have a height of approximately 2.0 mm. There is no requirement for component 1622 to be mounted on system board 1610, but the additional space can allow for the use of the space to mount additional system board components under module 1630.

The height of USMt 1650 (identified as the z2 dimension) can depend on the thickness of the module boards and how much space to leave under module 1630. For example, for a 0.6 mm PCB for module 1630, USMt 1650 could have a height, z2, of approximately 4.4 mm, providing clearance for module 1620 having a board thickness of 0.6 mm and components that have a height of approximately 1.4 mm.

Figure 17:
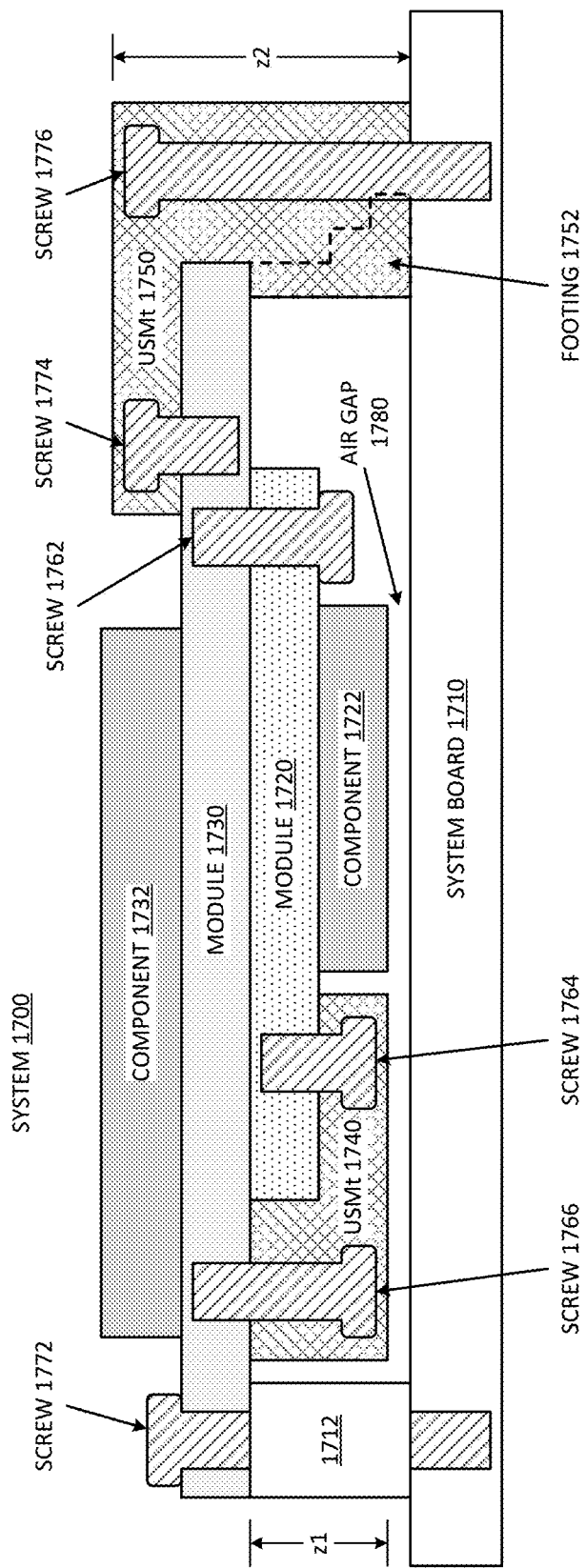
FIG. 17 is an example of a system configuration with an add-in board mounted to another add-in board with a top mount USM connector, which in turn connects to the system board with a top mount USM connector.

FIG. 17 is an example of a system configuration with an add-in board mounted to another add-in board with a top mount USM connector, which in turn connects to the system board with a top mount USM connector. System 1700 represents an example of a system with top mount connectors. System board 1710 represents a board to which an add-in board can be connected, such as a primary system board or a motherboard. System 1700 represents two add-in boards connected to system board 1710.

Module 1720 represents a first add-in board, having one or more components 1722 mounted on the module board.

USMt 1740 represents a top mount connector to connect module 1720 to module 1730, which is connected to system board 1710. Thus, in system 1700, one module board (module 1730) is directly connected to system board 1710 through a USM connector, and another module board (module 1720) is indirectly connected to system board 1710 through module 1730. System 1700 can thus be thought of as a daisy-chain example, with the daisy-chained board being mounted "under" the other module board.

Screw 1762 represents a screw at the "back" end of module 1720, which is the end of module 1720 opposite USMt 1740. Screw 1762 has a head that secures to the PCB of module 1720, with threading that extends through the board of module 1720 and into module 1730 as a carrier board.

Screw 1764 represents a screw that secures USMt 1740 to module 1720. Screw 1766 represents a screw that secures USMt 1740 to module 1730. In one example, screw 1764 has a head that rests within a recess in the connector associated with a screw hole. Screw 1764 extends into module 1720 but not into module 1730. In one example, screw 1766 has a head that rests within a recess in the connector associated with a screw hole.

The height of USMt 1740 (identified as the z1 dimension) can depend on the thickness of the board of module 1720. For example, for a 0.6 mm PCB for module 1720, USMt 1740 could have a height, z1, of approximately 2.0 mm. As another example, for a 0.8 mm PCB for module 1720, USMt 1740 could have a height, z1, of approximately 2.2 mm.

Module 1730 represents a second add-in board, having one or more components 1732 mounted on the module board on a surface that includes the pads or contacts to which USMt 1750 will connect. USMt 1750 represents a top mount connector to connect module 1730, and to connect the combination of module 1730 and module 1720, to system board 1710.

Screw 1772 represents a screw at the "back" end of module 1730, which is the end of module 1730 opposite USMt 1750. Screw 1772 has a head that secures to the PCB of module 1730, with threading that extends through the board of module 1730 and into system board 1710. In one example, system 1700 includes standoff or spacer 1712 to bridge the gap between the board of module 1730 and system board 1710.

Screw 1774 represents a screw that secures USMt 1750 to module 1730. Screw 1776 represents a screw that secures USMt 1750 to system board 1710. In one example, screw 1774 has a head that rests within a recess in the connector associated with a screw hole. Screw 1774 extends into module 1730 but not out the other side. In one example, screw 1776 has a head that rests within a recess in the connector associated with a screw hole.

In one example, USMt 1750 includes footing 1752, which could alternatively be referred as a base or support. Footing 1752 represents a structure of USMt 1750 to provide structural support to module 1730 when connecting module 1730 to system board 1710. The structure and purpose of footing 1752 can be the same or similar to what is described above.

In one example, USMt 1750 has a height sufficient to leave air gap 1780 between component 1722 and system board 1710. In one example, instead of leaving an air gap, the space could be occupied by a material that provides electrical isolation and thermal conductivity. Air gap 1780 can be any amount of space that makes sense for a system architecture. In one example, air gap 1780 is approximately 0.3 mm if module 1720 has a 0.8 mm board with component 1722 having a height of approximately 1.4 mm, or approximately 0.5 mm if module 1720 has a 0.6 mm board with component 1722 having a height of approximately 1.4 mm.

The height of USMt 1750 (identified as the z2 dimension) can depend on the thickness of the module boards and how much space to leave under module 1730. In one example, USMt 1750 has a height, z2, of approximately 4.4 mm, providing clearance for module 1720 and an air gap.

Figure 18:
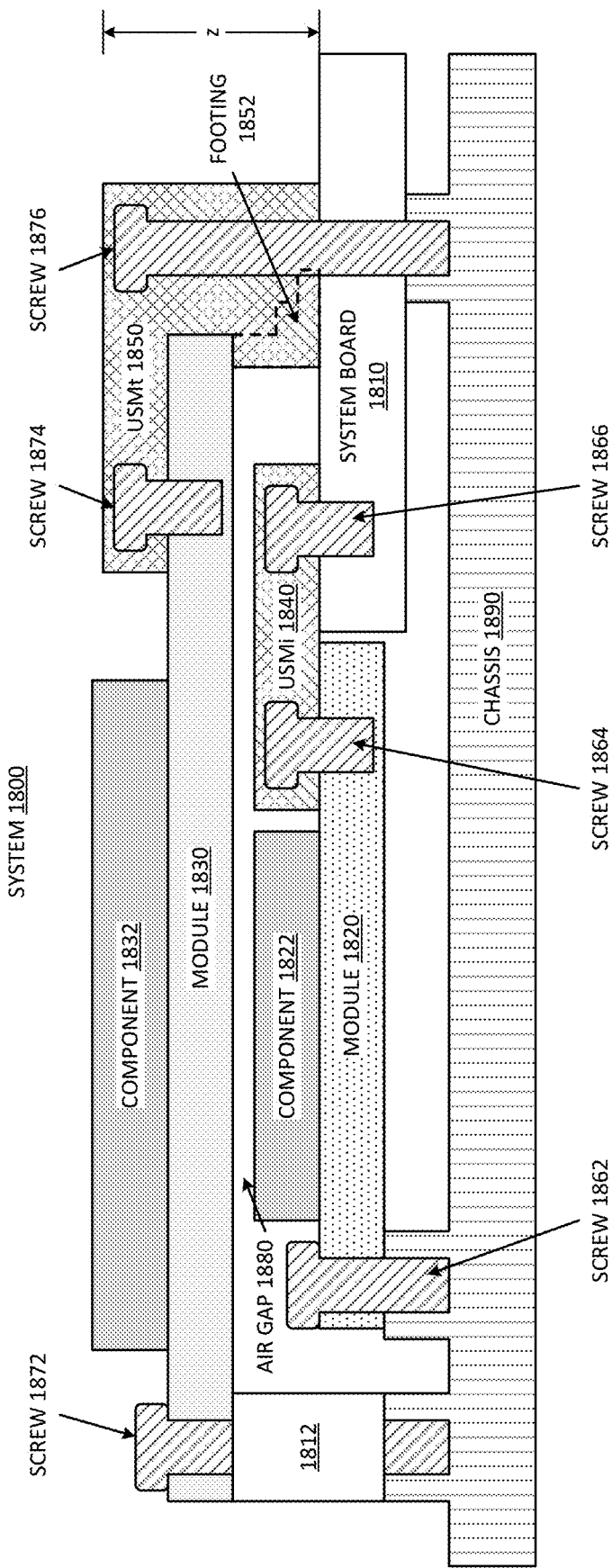
FIG. 18 is an example of a system configuration with a top mount USM connector to mount an add-in board above another add-in board connected to the system board with an inline USM connector.

FIG. 18 is an example of a system configuration with a top mount USM connector to mount an add-in board above another add-in board connected to the system board with an inline USM connector. System 1800 represents an example of a system with a top mount connector and an inline connector. System board 1810 represents a board to which an add-in board can be connected, such as a primary system board or a motherboard. System 1800 represents two add-in boards connected to system board 1810.

Module 1820 represents a first add-in board, having one or more components 1822 mounted on the module board. USMi 1840 represents an inline connector to connect module 1820 to system board 1810. Screw 1862 represents a screw at the "back" end of module 1820, which is the end of module 1820 opposite USMi 1840. Screw 1862 has a head that secures to the PCB of module 1820, with threading that extends through the board of module 1820 and into chassis 1890. Chassis 1890 represents a system case or cover to which the computing components of system 1800 are mounted as a system.

Screw 1864 represents a screw that secures USMi 1840 to module 1820. Screw 1866 represents a screw that secures USMi 1840 to system board 1810. In one example, screw 1864 has a head that rests within a recess in the connector associated with a screw hole. Screw 1864 extends into module 1820 but does not extend out the other side. In one example, screw 1866 has a head that rests within a recess in the connector associated with a screw hole. Screw 1866 extends into system board 1810 but does not extend out the other side.

Module 1830 represents a second add-in board, having one or more components 1832 mounted on the module board on a surface that includes the pads or contacts to which USMt 1850 will connect. Module 1830 is mounted over the top of module 1820. USMt 1850 represents a top mount connector to connect module 1830 to system board 1810 over module 1820.

Screw 1872 represents a screw at the "back" end of module 1830, which is the end of module 1830 opposite USMt 1850. Screw 1872 has a head that secures to the PCB of module 1830, with threading that extends through the board of module 1830 and into chassis 1890. In one example, system 1800 includes spacer or standoff 1812 to bridge the gap between the board of module 1830 and chassis 1890. As an alternative to the use of standoff 1812, chassis 1890 can have an extended standoff portion to reach all the way to module 1830.

Screw 1874 represents a screw that secures USMt 1850 to module 1830. Screw 1876 represents a screw that secures USMt 1850 to system board 1810. In one example, screw 1874 has a head that rests within a recess in the connector associated with a screw hole. Screw 1874 extends into module 1830 but not out the other side. In one example, screw 1876 has a head that rests within a recess in the connector associated with a screw hole.

In one example, USMt 1850 includes footing 1852, which could alternatively be referred as a base or support. Footing 1852 represents a structure of USMt 1850 to provide structural support to module 1830 when connecting module 1830 to system board 1810. The structure and operation of footing 1852 can be in accordance with what is described above.

In one example, USMt 1850 has a height sufficient to leave air gap 1880 between component 1822 and USMi 1840 and the bottom of module 1830, considering the surface of module 1830 with the pads and component 1832 to be the top of the module. In one example, instead of leaving an air gap, the space could be occupied by a material that provides electrical isolation and thermal conductivity. Air gap 1880 can be any amount of space that makes sense for a system architecture. In one example, air gap 1880 is approximately 0.4 mm.

The height of USMt 1850 (identified as the z dimension) can depend on the thickness of the module boards and how much space to leave under module 1830. For example, for a 0.6 mm PCB for module 1830, USMt 1850 could have a height, z, of approximately 3.8 mm, providing clearance for module 1820 having a board thickness of 0.6 mm and components that have a height of approximately 1.4 mm.

In system 1800, module 1820 is represented in the diagram as thinner than system board 1810. In one example, module 1820 and system board 1810 have the same thickness. In one example, module 1820 has a different board thickness than system board 1810. The inline connector can connect boards inline whether the boards are the same thickness or different thickness.

Figure 19A:
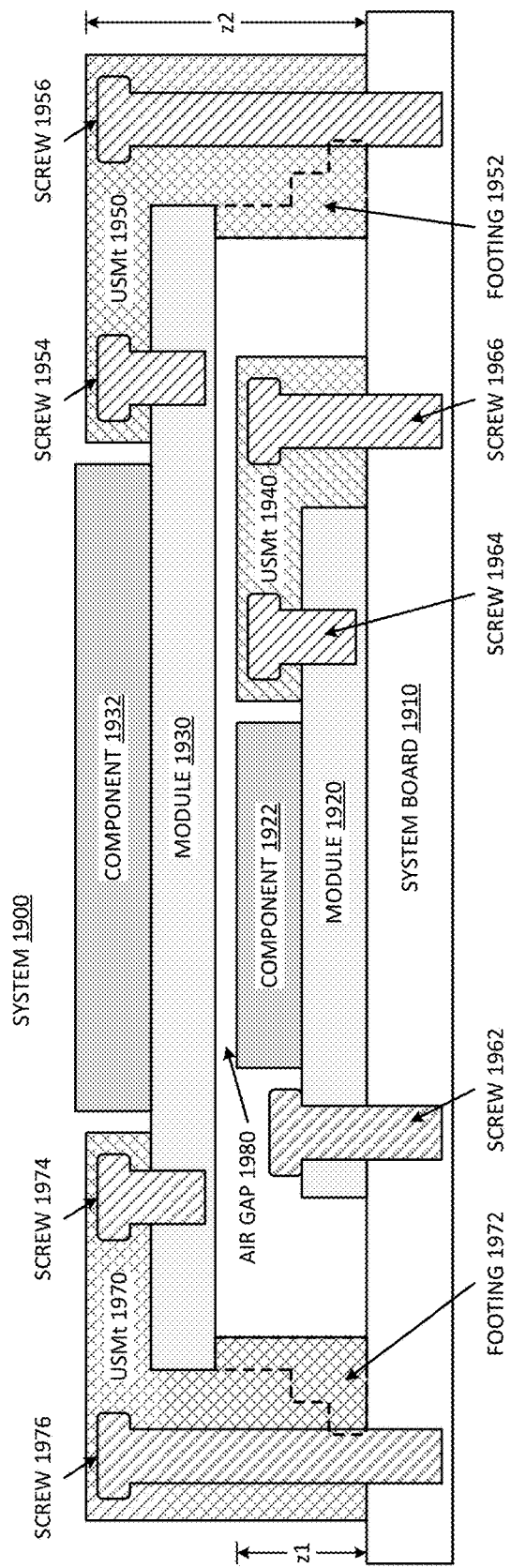
FIGS. 19A-19B illustrate an example of a system configuration with two top mount USM connector to mount an add-in board above another add-in board.
Figure 19B:
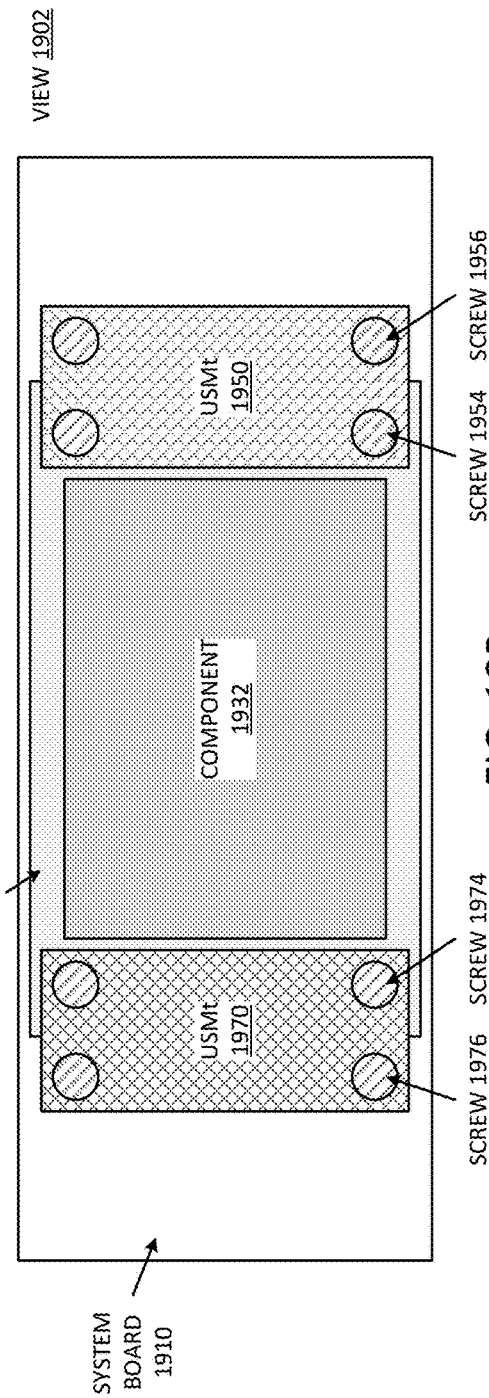

FIGS. 19A-19B illustrate an example of a system configuration with two top mount USM connector to mount an add-in board above another add-in board.

FIG. 19A illustrates a side view of system 1900. System 1900 represents an example of a system with multiple top mount connectors to the same board. System board 1910 represents a board to which an add-in board can be connected, such as a primary system board or a motherboard. System 1900 represents two add-in boards connected to system board 1910.

Module 1920 represents a first add-in board, having one or more components 1922 mounted on the module board. USMt 1940 represents a top mount connector to connect module 1920 to system board 1910. Screw 1962 represents a screw at the "back" end of module 1920, which is the end of module 1920 opposite USMt 1940. Screw 1962 has a head that secures to the PCB of module 1920, with threading that extends through the board of module 1920 and into system board 1910.

Screw 1964 represents a screw that secures USMt 1940 to module 1920. Screw 1966 represents a screw that secures USMt 1940 to system board 1910. In one example, screw 1964 has a head that rests within a recess in the connector associated with a screw hole. Screw 1964 extends into module 1920 but not into system board 1910. In one example, screw 1966 has a head that rests within a recess in the connector associated with a screw hole.

The height of USMt 1940 (identified as the z1 dimension) can depend on the thickness of the board of module 1920. For example, for a 0.6 mm PCB for module 1920, USMt 1940 could have a height, z1, of approximately 2.0 mm. As another example, for a 0.8 mm PCB for module 1920, USMt 1940 could have a height, z1, of approximately 2.2 mm.

Module 1930 represents a second add-in board, having one or more components 1932 mounted on the module board on a surface that includes the pads or contacts to which the USM connectors will connect. Module 1930 is mounted over the top of module 1920. USMt 1950 represents a top mount connector to connect module 1930 to system board 1910 over module 1920 from one side of the module 1920. USMt 1970 represents a top mount connector to connect module 1930 to system board 1910 over module 1920 from the opposite side of module 1920 that USMt 1950 connects. Module 1920 includes pads for both USMt 1950 and for USMt 1970.

Screw 1954 represents a screw that secures USMt 1950 to module 1930. Screw 1956 represents a screw that secures USMt 1950 to system board 1910. In one example, screw 1954 has a head that rests within a recess in the connector associated with a screw hole. Screw 1954 extends into module 1930 but not out the other side. In one example, screw 1966 has a head that rests within a recess in the connector associated with a screw hole.

Screw 1974 represents a screw that secures USMt 1970 to module 1930. Screw 1976 represents a screw that secures USMt 1970 to system board 1910. In one example, screw 1974 has a head that rests within a recess in the connector associated with a screw hole. Screw 1974 extends into module 1930 but not out the other side. In one example, screw 1976 has a head that rests within a recess in the connector associated with a screw hole.

In one example, USMt 1950 includes footing 1952, which could alternatively be referred as a base or support. Footing 1952 represents a structure of USMt 1950 to provide structural support to module 1930 when connecting module 1930 to system board 1910. Footing 1952 extends USMt 1950 under the end or the edge of module 1930 that interfaces with USMt 1950. With footing 1952, USMt 1950 can contact the surface of module 1930 that has the pads, as well as the opposite surface, as well as the edge of the module board that connects the two surfaces. Footing 1952 can include a ledge or extension that extends under module 1930 to allow a place for the edge of the board to rest or contact, which reduces the force on the board by screw 1954 by transferring force onto the physical contact of the board edge with the connector.

In one example, USMt 1970 includes footing 1972, which could alternatively be referred as a base or support. Footing 1972 represents a structure of USMt 1970 to provide structural support to module 1930 when connecting module 1930 to system board 1910. Footing 1972 extends USMt 1970 under the end or the edge of module 1930 that interfaces with USMt 1970. With footing 1972, USMt 1970 can contact the surface of module 1930 that has the pads, as well as the opposite surface, as well as the edge of the module board that connects the two surfaces. Footing 1972 can include a ledge or extension that extends under module 1930 to allow a place for the edge of the board to rest or contact, which reduces the force on the board by screw 1974 by transferring force onto the physical contact of the board edge with the connector.

In one example, USMt 1950 and USMt 1970 have a height sufficient to leave air gap 1980 between component 1922 and USMt 1940 and the bottom of module 1930, considering the surface of module 1930 with the pads and component 1932 to be the top of the module. In one example, instead of leaving an air gap, the space could be occupied by a material that provides electrical isolation and thermal conductivity. Air gap 1980 can be any amount of space that makes sense for a system architecture. In one example, air gap 1980 is approximately 0.4 mm.

The height of USMt 1950 and USMt 1970 (identified as the z2 dimension) can depend on the thickness of the module boards and how much space to leave under module 1930. For example, for a 0.6 mm PCB for module 1930, USMt 1950 and USMt 1970 could have a height, z2, of approximately 4.4 mm, providing clearance for module 1920 having a board thickness of 0.6 mm and components that have a height of approximately 1.4 mm.

FIG. 19B illustrates a top view of system 1900. View 1902 is from the top of system 1900, and the components are not necessarily illustrated to scale. The scale of view 1902 does not match the side view of system 1900 illustrated in FIG. 19A.

View 1902 illustrates one or more components 1932 mounted directly to module 1930, which is in turn mounted to system board 1910 through two top mount connectors. USMt 1970 connects between system board 1910 and module 1930 on one side, USMt 1950 connects between system board 1910 and module 1930 on the other side.

View 1902 illustrates screw 1974 to secure USMt 1970 to module 1930 and screw 1976 to secure USMt 1970 to system board 1910. View 1902 illustrates screw 1954 to secure USMt 1950 to module 1930 and screw 1956 to secure USMt 1950 to system board 1910.

Figure 20:
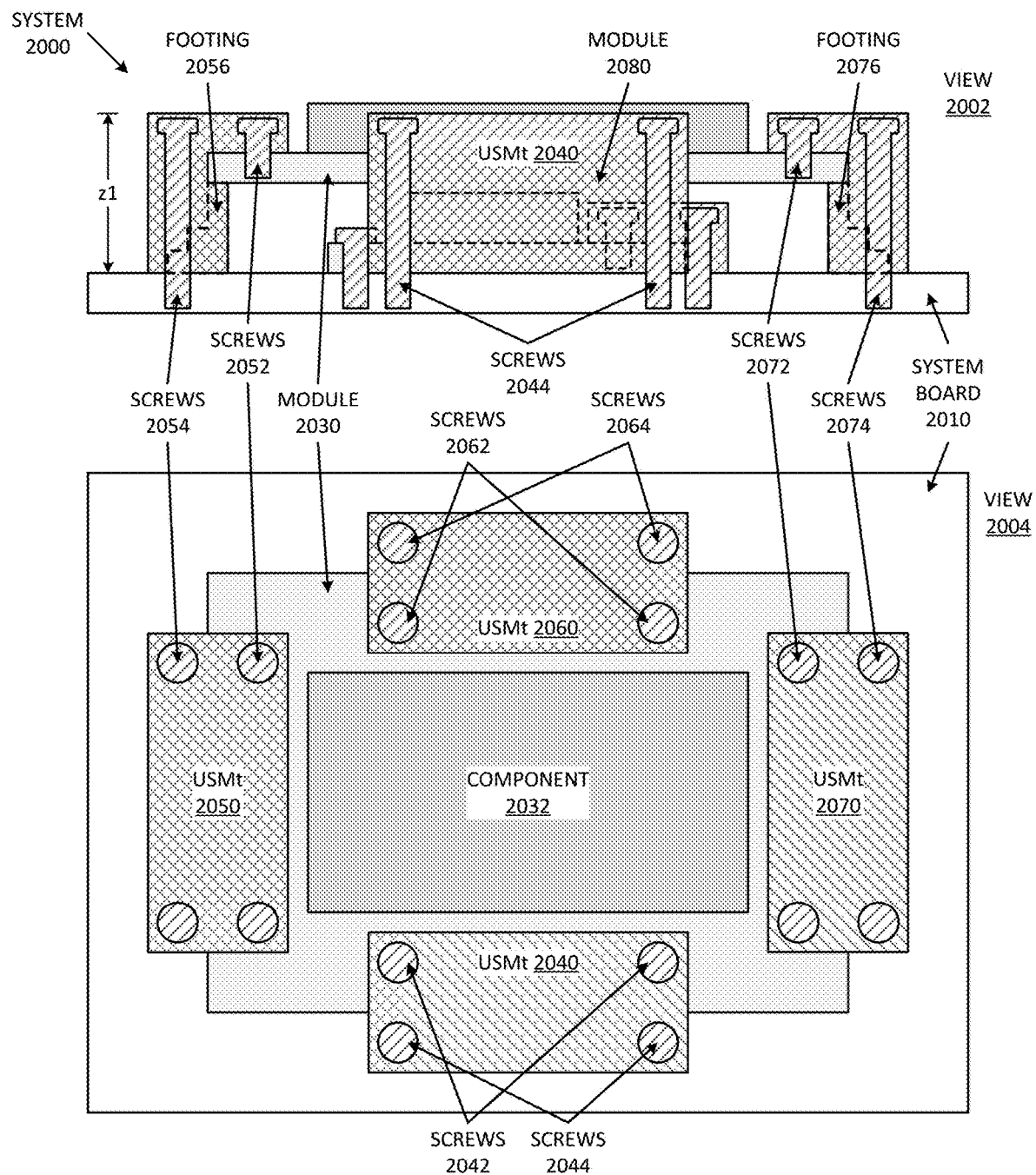
FIG. 20 illustrates an example of a system configuration with four top mount USM connector to mount an add-in board above another add-in board.

FIG. 20 illustrates an example of a system configuration with four top mount USM connector to mount an add-in board above another add-in board. System 2000 represents a system that is similar to system 1900, in which the various elements are not necessarily illustrated to scale. Whereas system 1900 illustrates two connectors to connect the module board to the system board, system 2000 includes a module board connected to the system board via four connectors.

View 2002 illustrates a side view of system 2000. View 2004 illustrates a top view of system 2000. In view 2002, one of the connectors is not visible. View 2004 does not show a module connected under module 2030, which can be partially seen in the side view of view 2002. The dashed lines illustrate module 2080, which is partially obscured behind USMt 2040, and is not shown at all in view 2002, being under module 2030.

System board 2010 represents a board to which an add-in board can be connected, such as a primary system board or a motherboard. System 2000 represents two add-in boards connected to system board 2010. Module 2080 represents a first add-in board, having one or more components mounted on the module board, where the module board is connected to system board 2010 with a USMt connector (the components and USMt connector are not specifically labeled). Module 2080 can be connected to system board 2010 in accordance with any description herein of a top mount connection with a module directly on the carrier board.

Module 2030 represents a second add-in board, having one or more components 2032 mounted on the module board on a surface that includes the pads or contacts to which the USM connectors will connect. Module 2030 is mounted over the top of module 2080.

USMt 2040, USMt 2050, USMt 2060, and USMt 2070 connect module 2080 to system board 2010. Each connector represents a top mount connector to connect a section of pads of module 2030 to system board 2010. USMt 2040 and USMt 2060 are opposite each other on parallel sides of module 2030, and USMt 2050 and USMt 2070 are opposite each on the other parallel sides of module 2030.

Screws 2042 represent screws that secure USMt 2040 to module 2030. Screws 2044 represent screws that secure USMt 2040 to system board 2010. Screws 2052 represent screws that secure USMt 2050 to module 2030. Screws 2054 represent screws that secure USMt 2050 to system board 2010. Screws 2062 represent screws that secure USMt 2060 to module 2030. Screws 2064 represent screws that secure USMt 2060 to system board 2010. Screws 2072 represent screws that secure USMt 2070 to module 2030. Screws 2074 represent screws that secure USMt 2040 to system board 2010.

In one example, the screws the secure the connector to the module board (e.g., screws 2052, screws 2072) have heads that rest within a recess in the connector associated with a screw hole, as seen in view 2002. In one example, the screws that secure the connector to the module board extend into module 2030 but not out the other side. The same descriptions can apply to the screws not seen in view 2002 (i.e., screws 2042, screws 2062) that also secure connectors to the module board.

In one example, the screws the secure the connector to the system board (e.g., screws 2054, screws 2074) have heads that rest within a recess in the connector associated with a screw hole, as seen in view 2002. In one example, the screws that secure the connector to the system board extend through the connector and into system board 2010. They may or may not extend through the system board, for example, to a connection point on the system chassis. The same descriptions can apply to the screws not seen in view 2002 (i.e., screws 2044, screws 2064) that also secure connectors to the system board.

In one example, USMt 2050 includes footing 2056, which could alternatively be referred as a base or support. Footing 2056 represents a structure of USMt 2050 to provide structural support to module 2030 when connecting module 2030 to system board 2010. Footing 2056 extends USMt 2050 under the end or the edge of module 2030 that interfaces with USMt 2050. With footing 2056, USMt 2050 can contact the surface of module 2030 that has the pads, as well as the opposite surface, as well as the edge of the module board that connects the two surfaces. Footing 2056 can include a ledge or extension that extends under module 2030 to allow a place for the edge of the board to rest or contact. Similar descriptions apply to footing 2076 of USMt 2070.

A footing for USMt 2040 and a footing for USMt 2060 are not visible. In one example, both USMt 2040 and USMt 2060 includes respective footings, and the descriptions above can apply to these footings or supports. In one example, when four or more USMt connectors are used to connect one board to another, boards on longer edges of the add-in module can include footings, while USMt connectors on the shorter edges of the add-in module may or may not include footings.

In one example, USMt 2040, USMt 2050, USMt 2060, and USMt 2070 have a height sufficient to leave an air gap module 2030 and module 2080. The air gap can be in accordance with any description of an air gap under modules mounted above other modules.

The height of USMt 2040, USMt 2050, USMt 2060, and USMt 2070 (identified as the z1 dimension) can depend on the thickness of the module boards and how much space to leave under module 2030. For example, for a 0.6 mm PCB for module 2030, USMt 2040, USMt 2050, USMt 2060, and USMt 2070 could have a height, z1, of approximately 4.4 mm, providing clearance for module 1920 having a board thickness of 0.6 mm and components that have a height of approximately 1.4 mm.

Figure 21:
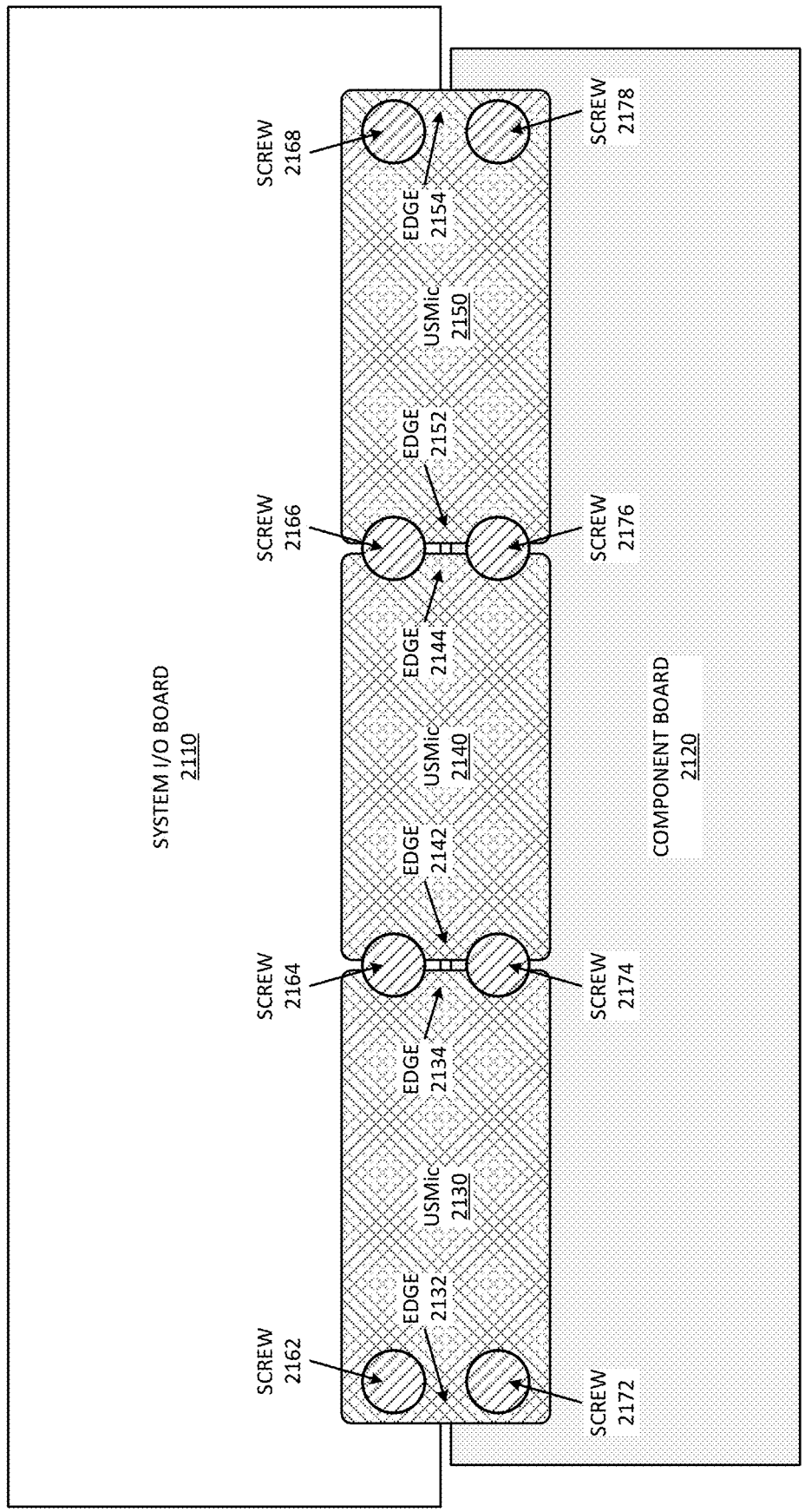
FIG. 21 illustrates an example of a system configuration with inline, chained USM connectors to connect an add-in board to a system board with wider I/O.

FIG. 21 illustrates an example of a system configuration with inline, chained USM connectors to connect an add-in board to a system board with wider I/O. The USM connectors of system 2100 provide example of inline USM connectors in accordance with any description of an inline USM connector herein.

Instead of having only dedicated screw holes on the connectors, the connectors can share one set of screw holes or both sets of screw holes with another USM connector. Such an inline connector can be referred to as a USM inline chained connector, allowing the chaining together of multiple USM connector for wider I/O than is possible with a single connector. The chaining together of multiple USM connectors allows a much larger bandwidth without having to make connectors of different widths.

System 2100 illustrates two types of chained connector or shared-screw-hole connector, or three types of chained connector, depending on the arrangement of alignment holes and alignment posts or other alignment mechanisms. Each example can have the same internal structure as any other inline USM connector described. It will be understood that even reversible connectors could be made reversible if both screw holes on both sides were left open for a sharing configuration.

System I/O board 2110 includes pads to connect to corresponding pads on component board 2120. System I/O board 2110 can be a system board or motherboard. System I/O board 2110 can be a board designed specifically to connect to a wide I/O component board, with other connections (not shown) to a system board.

USMic 2130 represents an inline connector having one edge that has non-shared screw holes, and one edge for shared screw holes. The shared edge is adjacent another connector. More specifically, the shared edge is adjacent the other connector and the two connectors will share screws on the shared edge. The non-shared edge is not adjacent another connector or not adjacent another connector with which it will share screws. USMic 2150 is illustrated as a mirror image of USMic 2130. In one example, depending on the alignment structures used in system 2100, USMic 2150 is designed the same as USMic 2130, and simply spun around 180 degrees to share the screw holes on the other side. In one example, depending on the alignment structures used in system 2100, USMic 2150 and USMic 2130 are separate connectors, designed to share screw holes on opposite sides.

USMic 2130 is illustrated with edge 2132 having screw holes that are not shared. Screw 2162 represents a screw to connect edge 2132 of USMic 2130 to system I/O board 2110. Screw 2172 represents a screw to connect edge 2132 of USMic 2130 to component board 2120. USMic 2130 is illustrated with edge 2134 having screw holes that are shared. Screw 2164 represents a screw to connect edge 2134 of USMic 2130 to system I/O board 2110. Screw 2174 represents a screw to connect edge 2134 of USMic 2130 to component board 2120.

Again, USMic 2150 is oriented to share opposite edges. USMic 2150 is illustrated with edge 2154 having screw holes that are not shared. Screw 2168 represents a screw to connect edge 2154 of USMic 2150 to system I/O board 2110. Screw 2178 represents a screw to connect edge 2154 of USMic 2150 to component board 2120. USMic 2150 is illustrated with edge 2152 having screw holes that are shared. Screw 2166 represents a screw to connect edge 2152 of USMic 2150 to system I/O board 2110. Screw 2176 represents a screw to connect edge 2152 of USMic 2150 to component board 2120.

USMic 2140 is illustrated as having both edges that share screw holes with an adjacent connector. USMic 2140 is illustrated with edge 2142 having screw holes that are shared with edge 2134 of USMic 2130. Screw 2164 thus connects edge 2134 of USMic 2130 and edge 2142 of USMic 2140 to system I/O board 2110. Screw 2174 connects edge 2134 of USMic 2130 and edge 2142 of USMic 2140 to component board 2120. USMic 2140 is illustrated with edge 2144 having screw holes that are shared with edge 2152 of USMic 2150. Screw 2166 thus connects edge 2144 of USMic 2140 and edge 2152 of USMic 2150 to system I/O board 2110. Screw 2176 connects edge 2144 of USMic 2140 and edge 2152 of USMic 2150 to component board 2120.

It will be understood that other connection configurations are possible. Any number of inline chained connectors can be chained together, such as having multiple connectors that share screw holes on both edges. In one example, no connectors that share on both edges are used, having one connector sharing on one edge and not sharing on one edge, and a mirror image connector chained with it.

Figure 22A:
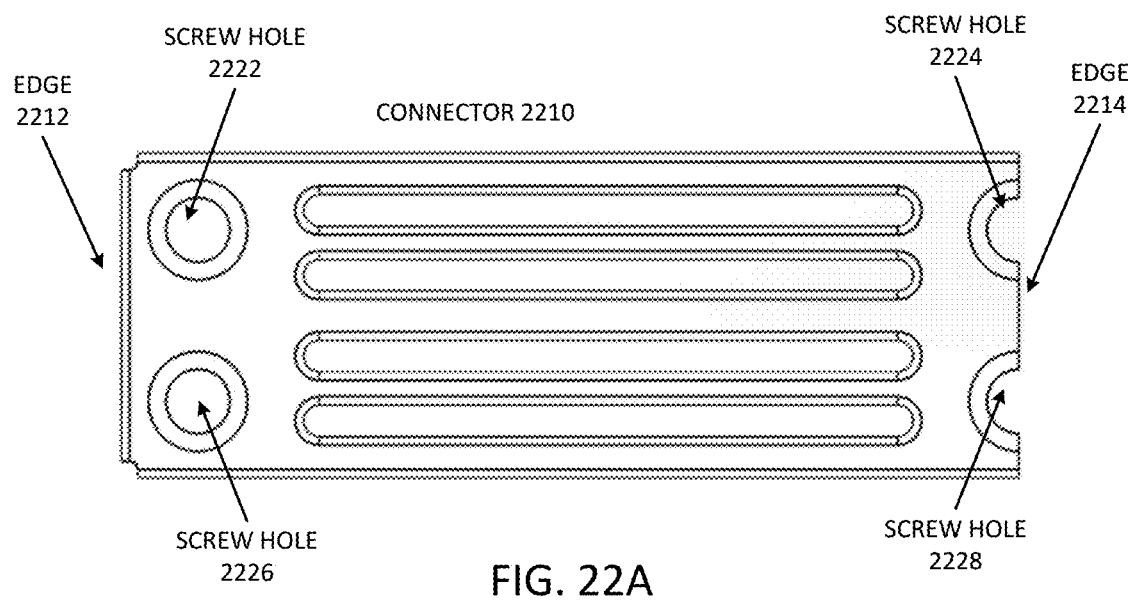
FIG. 22A is an example of a representation of an inline, chained USM connector with one side having shared screw holes.

FIG. 22A is an example of a representation of an inline, chained USM connector with one side having shared screw holes. Connector 2210 provides an example of connector 600, with screw holes on one side being open instead of complete circles. Rather, connector 600 has all screw holes that are complete circles and connector 2210 includes screw holes on one edge that are complete circles and screw holes on the other edge that are open, and are semicircles. The dimensions and sizing for connector 2210 can be the same as for connector 600, adjusting appropriately for having open, shared screw holes on one side.

Thus, connector 2210 includes edge 2212 with screw hole 2222 and screw hole 2226, which are both closed circles. Connector 2210 includes edge 2214 with screw hole 2224 and screw hole 2228, which are both open screw holes, represented as semicircles.

Figure 22B:
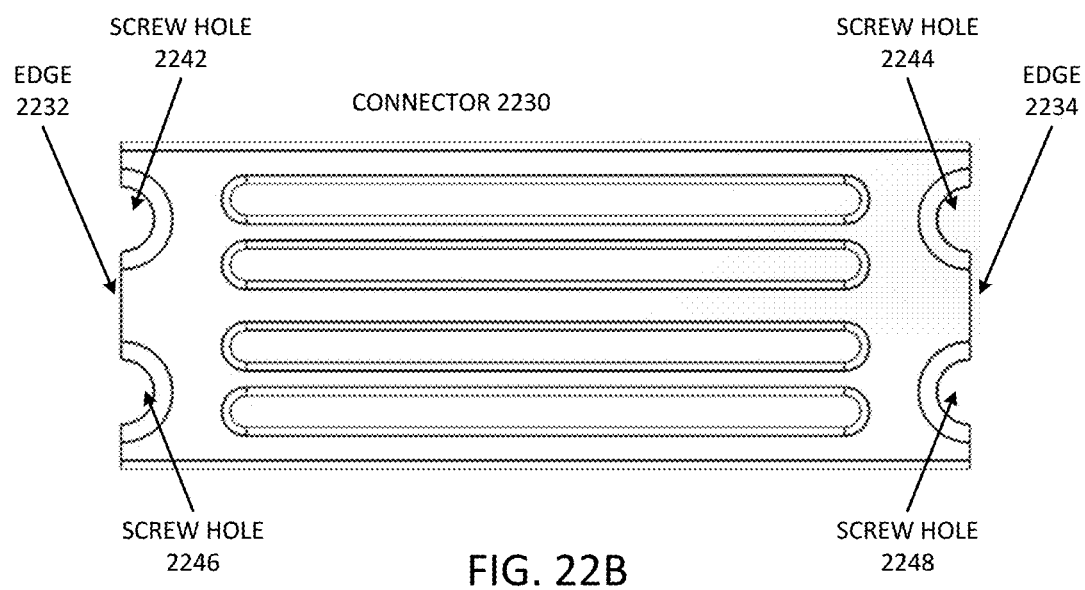
FIG. 22B is an example of a representation of an inline, chained USM connector with both sides having shared screw holes.

FIG. 22B is an example of a representation of an inline, chained USM connector with both sides having shared screw holes. Connector 2230 provides an example of connector 600, with screw holes on both sides being open instead of complete circles. Rather, connector 600 has all screw holes that are complete circles and connector 2230 includes all screw holes that are open, and are semicircles. The dimensions and sizing for connector 2230 can be the same as for connector 600, adjusting appropriately for having open, shared screw holes on both sides.

Thus, connector 2230 includes edge 2232 with screw hole 2242 and screw hole 2246, which are both open, partial circles. Connector 2230 includes edge 2234 with screw hole 2244 and screw hole 2248, which are both open, partial circles, represented as semicircles.

Figure 23:
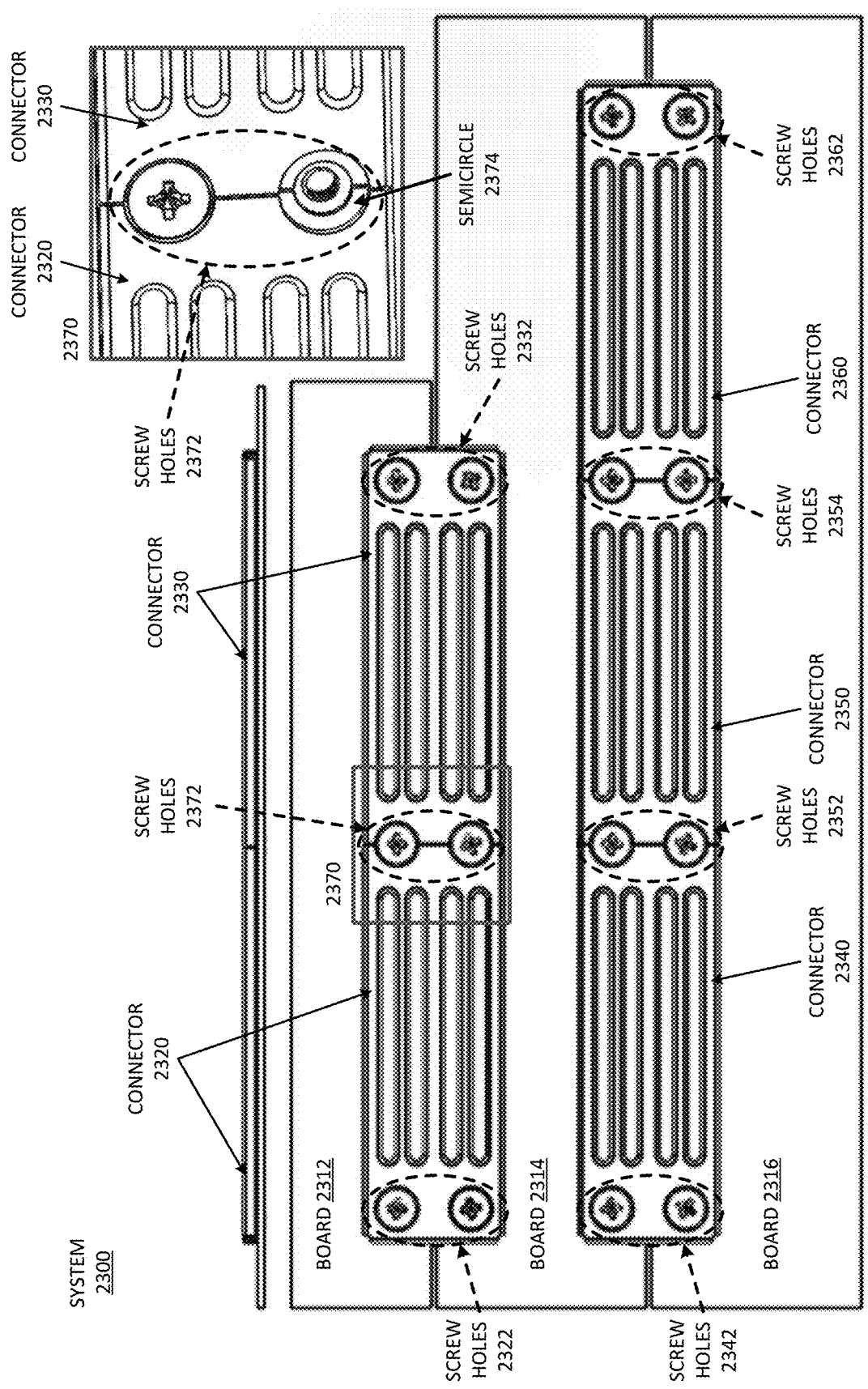
FIG. 23 illustrates an example of a system configuration with inline, chained USM connectors to connect boards together.

FIG. 23 illustrates an example of a system configuration with inline, chained USM connectors to connect boards together. System 2300 illustrates other possible combinations of connections with inline chained connectors. The inline chained connectors can be USMic connectors, and can be inline connectors in accordance with any description above.

System 2300 includes board 2312 connected to board 2314 with connector 2320 and connector 2330 chained together. Board 2314 is also connected to board 2316 with connector 2340, connector 2350, and connector 2360 chained together. System 2300 also includes a representation of a side view of board 2312 with connector 2320 and connector 2330 chained together.

As illustrated, connector 2320 includes screw holes 2322 on a non-shared edge of connector 2320. One of the screws secures the connector to board 2312 and the other secures the connector to board 2314. Similarly, connector 2330 includes screw holes 2332 on a non-shared edge of connector 2330. One of the screws secures the connector to board 2312 and the other secures the connector to board 2314.

Screw holes 2372 are screw holes that are formed by one shared edge of connector 2320 and by one shared edge of connector 2330. Screws in the shared screw holes can be referred to as shared screws, and correspond to shared connector edges. One of the shared screws will secure connector 2320 and connector 2330 to board 2312 and the other screw will secure the connectors to board 2314.

System 2300 includes a close-up view of area 2370. In the close-up view, screw holes 2372 are illustrates with one screw in place and the other screw hole empty. The screw hole having a screw can show how the screw secures both connector 2320 and connector 2330. The screw hole without the screw shows how the two open screw holes of the share edges of the connectors form a complete screw hole. There will be one screw hole in the board corresponding to the shared screw hole of the two connectors.

The alignment mechanisms can ensure proper alignment of the connectors on the board, allowing the share screw to secure both connectors on the shared edge. The close-up view illustrates that the shared edge can have a recessed semicircle 2374, which matches the closed screw hole, except that it is only part of the circle. System 2300 does not illustrate other close-up views, but all shared edges can appear the same or approximately the same as area 2270.

As illustrated, connector 2340 includes screw holes 2342 on a non-shared edge of connector 2340. One of the screws secures the connector to board 2314 and the other secures the connector to board 2316. Similarly, connector 2360 includes screw holes 2362 on a non-shared edge of connector 2360. One of the screws secures the connector to board 2314 and the other secures the connector to board 2316.

Connector 2350 includes only shared edges. Screw holes 2352 are screw holes that are formed by one shared edge of connector 2340 and one shared edge of connector 2350. One of the shared screws will secure connector 2340 and connector 2350 to board 2314 and the other screw will secure the connectors to board 2316.

Screw holes 2354 are screw holes that are formed by one shared edge of connector 2350 and one shared edge of connector 2360. One of the shared screws will secure connector 2350 and connector 2360 to board 2314 and the other screw will secure the connectors to board 2316.

Figure 24:
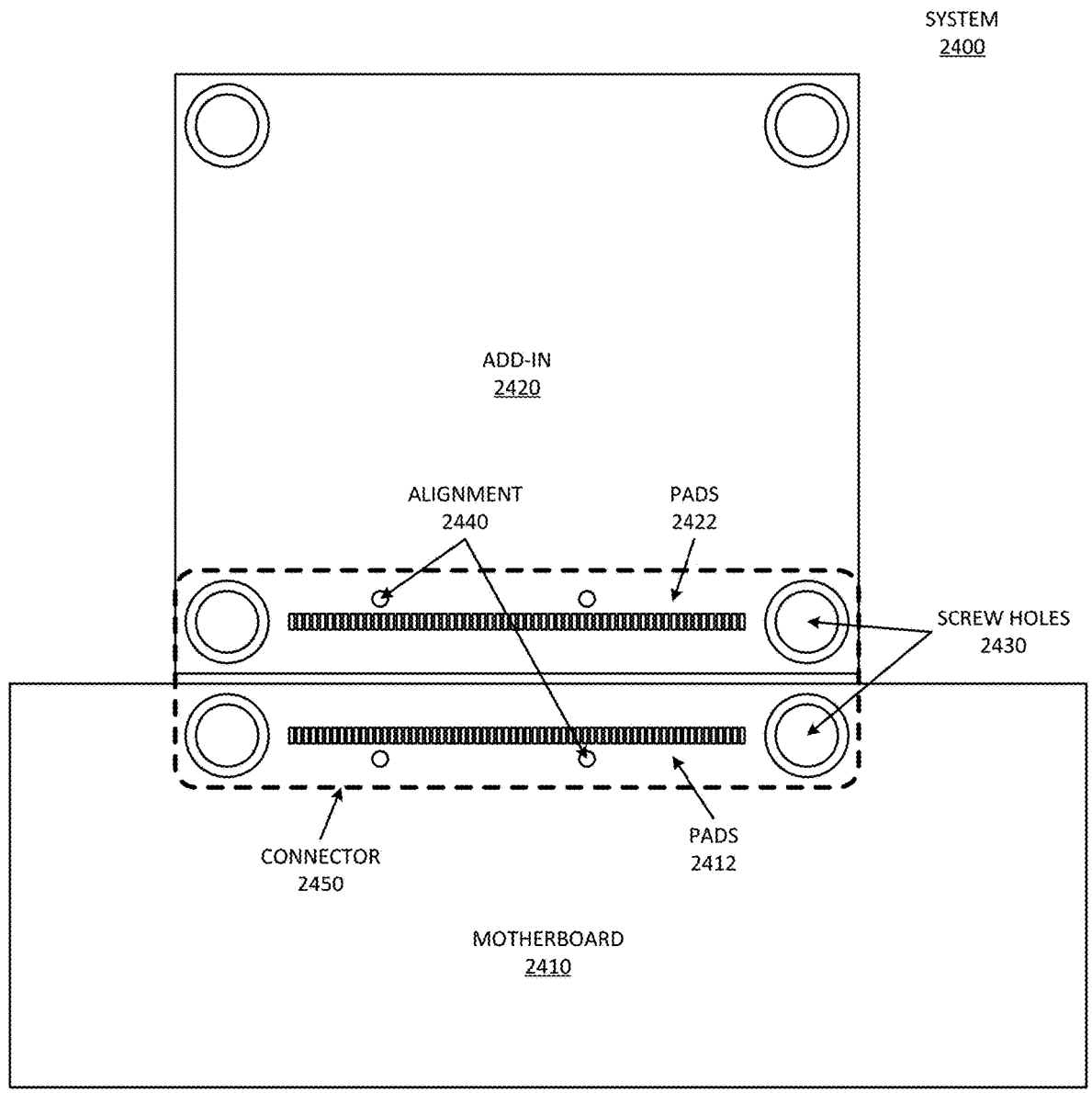
FIG. 24 is a block diagram of an example of board layouts for use with a USM connector.

FIG. 24 is a block diagram of an example of board layouts for use with a USM connector. System 2400 illustrates motherboard 2410 having one row of pads 2412 and add-in 2420 has a corresponding row of pads 2422. Screw holes 2430 receive screws that will secure the boards to each other with connector 2450. Connector 2450 includes leads, alignment features, and a cover in accordance with any example described. Connector 2450 keys to alignment features 2440 in motherboard 2410 and add-in 2420.

Connector 2450 has a generally rectangular outline with electrical leads aligned in a row extending along a long length of the rectangular outline, with a pair of screw holes 2430 on either end of the electrical leads. The leads extend across the short distance of the rectangle to bridge from pads 2412 to pads 2422.

Reference to motherboard 2410 is a non-limiting example. The motherboard can represent any system board. While the configuration of system 2400 illustrates motherboard 2410 having an edge prior to add-in 2420, it will be understood that such a configuration is merely one example. In one example, motherboard 2410 and add-in 2420 will meet edge to edge for use with an inline connector. In one example, add-in 2420 can at least partially overlap motherboard 2410 for use with a top mount connector.

Figure 25:
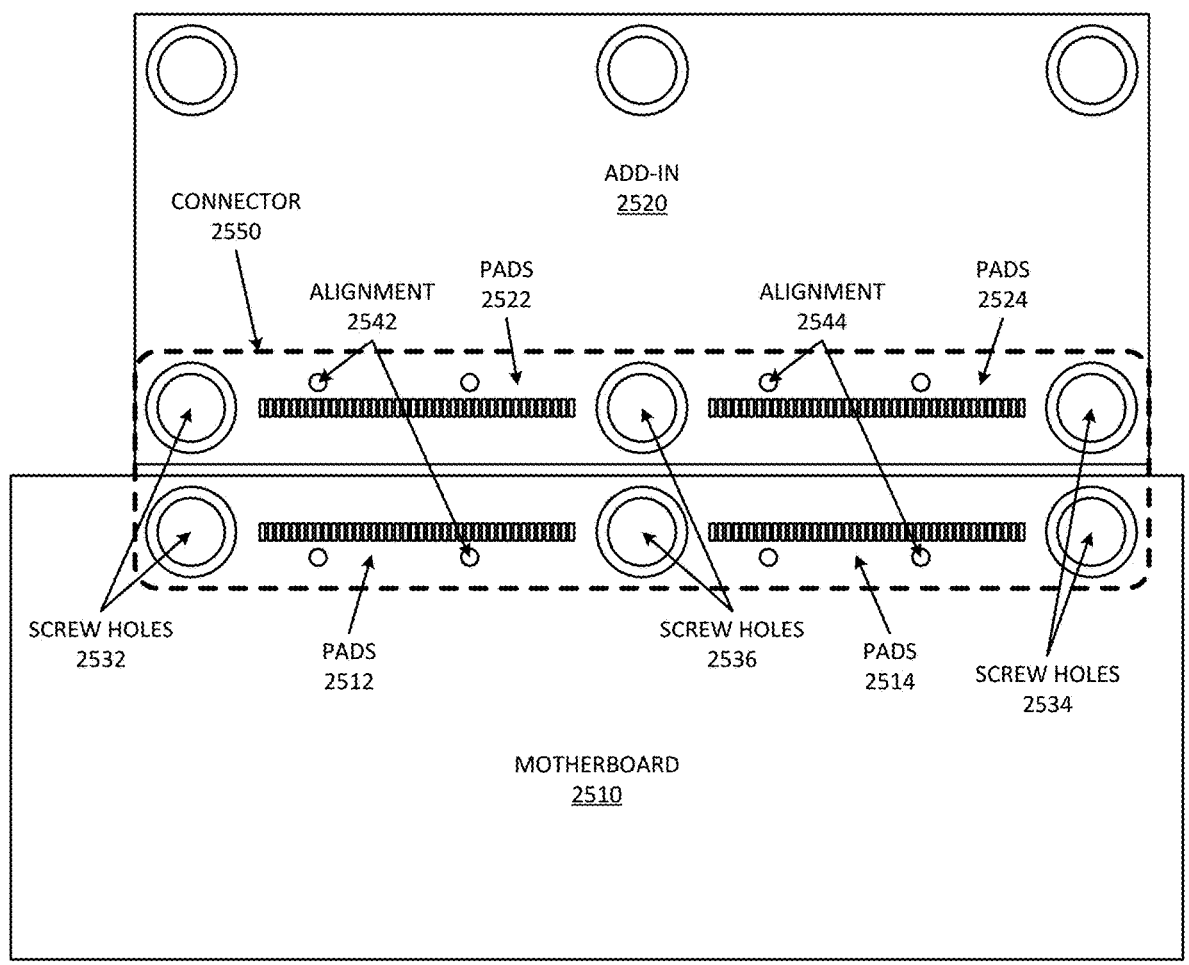
FIG. 25 is a block diagram of an example of board layouts for use with a USM connector that has two groups of connectors.

FIG. 25 is a block diagram of an example of board layouts for use with a USM connector that has two groups of connectors. System 2500 illustrates motherboard 2510 having two rows of pads 2512 and pads 2514 and add-in 2520 has corresponding two rows of pads 2522 and pads 2524. Screw holes 2532, screw holes 2534, and screw holes 2536 receive screws that will secure the boards to each other with connector 2550. Connector 2550 includes two groups of leads, two groups of alignment features, and a cover in accordance with any example described. Connector 2550 keys to alignment features 2542 and alignment features 2544 in motherboard 2510 and add-in 2520.

Connector 2550 has a generally rectangular outline with electrical leads aligned in rows extending along a long length of the rectangular outline, with electrical leads to connect pads 2512 to pads 2522 between a pair of screw holes 2532 and a pair of screw holes 2536. Connector 2550 also includes electrical leads to connect pads 2514 to pads 2524 between a pair of screw holes 2534 and the pair of screw holes 2536. Thus, connector 2550 includes screw holes for screws on either short edge as well as screw holes for screws in the middle of the length of the connector, between the two groups of electrical leads.

Reference to motherboard 2510 is a non-limiting example. The motherboard can represent any system board. While the configuration of system 2500 illustrates motherboard 2510 being edge to edge with add-in 2520, it will be understood that such a configuration is merely one example. In one example, motherboard 2510 and add-in 2520 will meet edge to edge for use with an inline connector. In one example, add-in 2520 can at least partially overlap motherboard 2510 for use with a top mount connector.

Figure 26:
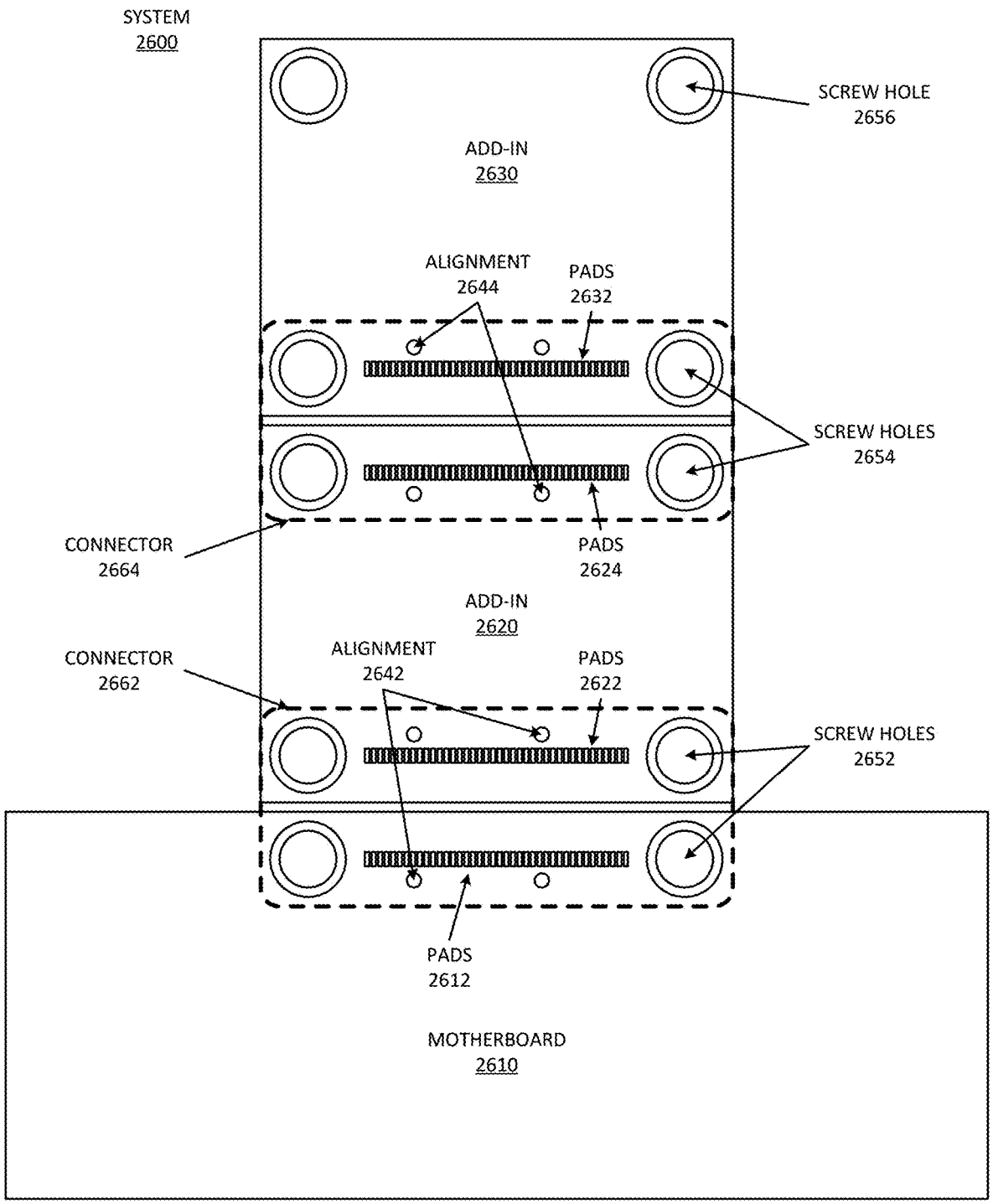
FIG. 26 is a block diagram of an example of board layouts for daisy-chaining add-in boards with USM connectors.

FIG. 26 is a block diagram of an example of board layouts for daisy-chaining add-in boards with USM connectors. System 2600 illustrates a piggyback or daisy-chain configuration. System 2600 illustrates motherboard 2610 having one row of pads 2612 and add-in 2620 having a corresponding row of pads 2622. Screw holes 2652 receive screws that will secure motherboard 2610 to add-in 2620 with connector 2662. Connector 2662 includes leads, alignment features, and a cover in accordance with any example described. Connector 2662 keys to alignment features 2642 in motherboard 2610 and add-in 2620.

System 2600 also includes add-in 2630 having one row of pads 2632 and add-in 2620 having a corresponding row of pads 2624. Screw holes 2654 receive screws that will secure add-in 2620 to add-in 2630 with connector 2664. Connector 2664 includes leads, alignment features, and a cover in accordance with any example described. Connector 2664 keys to alignment features 2644 in add-in 2620 and add-in 2630. In one example, add-in 2630 also includes screw holes 2656 to secure add-in 2630 to a system chassis. When connecting one add-in to another add-in, the two add-in will have surfaces with pads that are generally co-planar with each other, just as the first add-in will be co-planar with the motherboard.

Connector 2662 has a generally rectangular outline with electrical leads aligned in a row extending along a long length of the rectangular outline, with a pair of screw holes 2652 on either end of the electrical leads. The leads extend across the short distance of the rectangle to bridge from pads 2612 to pads 2622.

Connector 2664 has a generally rectangular outline with electrical leads aligned in a row extending along a long length of the rectangular outline, with a pair of screw holes 2654 on either end of the electrical leads. The leads extend across the short distance of the rectangle to bridge from pads 2624 to pads 2632.

Reference to motherboard 2610 is a non-limiting example. The motherboard can represent any system board. While the configuration of system 2600 illustrates motherboard 2610 being edge to edge with add-in 2620, it will be understood that such a configuration is merely one example. In one example, motherboard 2610 and add-in 2620 will meet edge to edge for use with an inline connector. In one example, add-in 2620 can at least partially overlap motherboard 2610 for use with a top mount connector. Similarly, the connection between add-in 2620 and add-in 2630 can be via inline connector or top mount connector.

Figure 27:
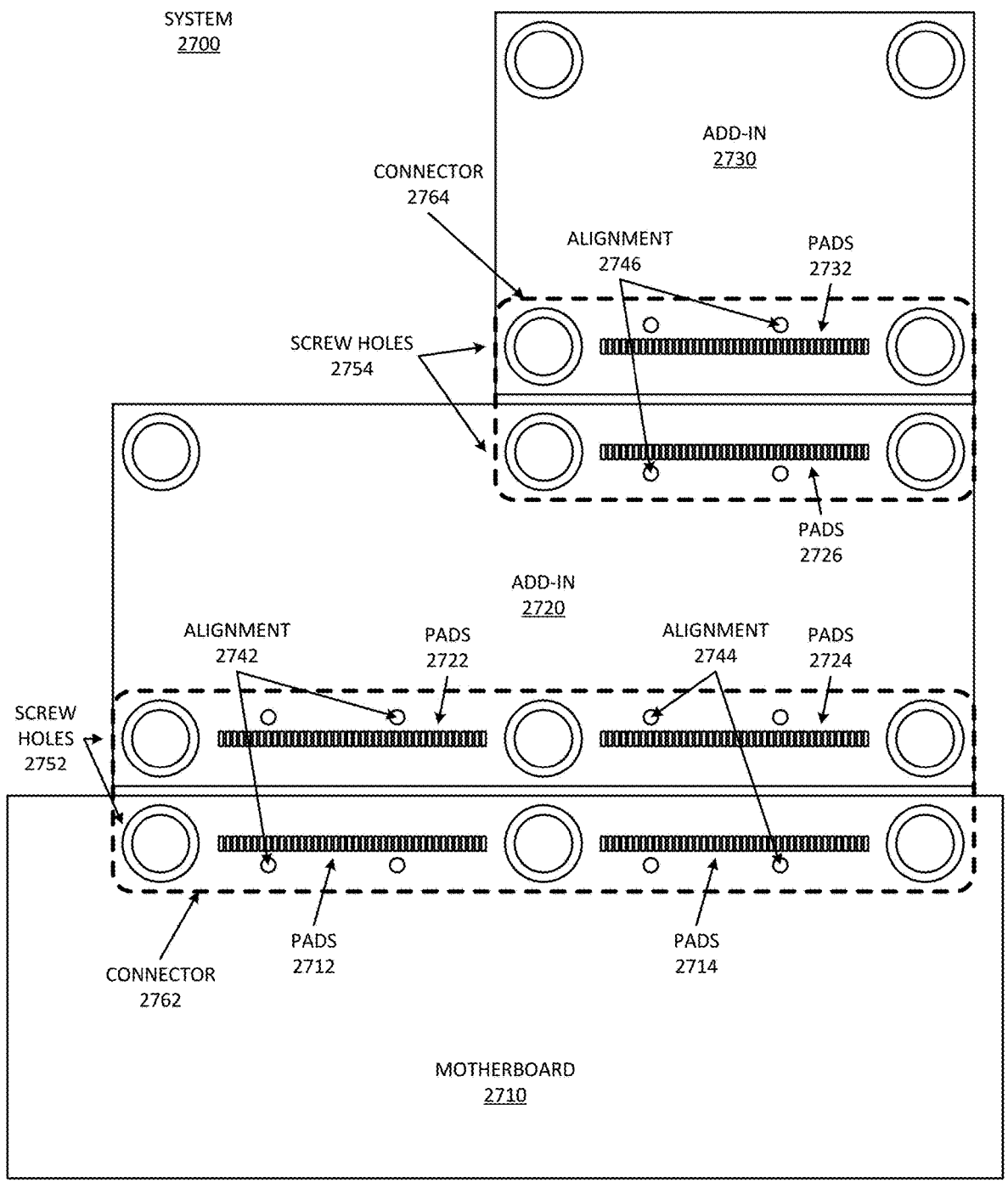
FIG. 27 is a block diagram of an example of board layouts for daisy-chaining add-in boards with USM connectors of different sizes.

FIG. 27 is a block diagram of an example of board layouts for daisy-chaining add-in boards with USM connectors of different sizes. System 2700 illustrates another piggyback or daisy-chain configuration. System 2700 illustrates motherboard 2710 having two rows of pads 2712 and pads 2714 and add-in 2720 has corresponding two rows of pads 2722 and pads 2724. Screw holes 2752 include three pairs of screw holes for corresponding three pairs of screws to secure motherboard 2710 to add-inn 2720 with connector 2762. Connector 2762 includes two groups of leads, two groups of alignment features, and a cover in accordance with any example described. Connector 2762 keys to alignment features 2742 and alignment features 2744 in motherboard 2710 and add-in 2720.

System 2700 also includes add-in 2730 having one row of pads 2732 and add-in 2720 having a corresponding third row of pads 2726. Screw holes 2754 includes two pairs of screw holes to receive two pairs of screws that will secure add-in 2720 to add-in 2730 with connector 2764. Connector 2764 includes leads, alignment features, and a cover in accordance with any example described. Connector 2764 keys to alignment features 2746 in add-in 2720 and add-in 2730. In one example, add-in 2730 also includes screw holes at the other end to secure add-in 2730 to a system chassis.

Connector 2762 has a generally rectangular outline with electrical leads aligned in rows extending along a long length of the rectangular outline, with electrical leads to connect pads 2712 to pads 2722 between a pair of screw holes, one on one short edge and the other in the middle. Connector 2762 also includes electrical leads to connect pads 2714 to pads 2724 between a pair of screw holes, one on the other short edge, and the pair of screw holes in the middle. Thus, connector 2762 includes screw holes for screws on either short edge as well as screw holes for screws in the middle of the length of the connector, between the two groups of electrical leads.

Connector 2764 has a generally rectangular outline with electrical leads aligned in a row extending along a long length of the rectangular outline, with a pair of screw holes 2754 on either end of the electrical leads. The leads extend across the short distance of the rectangle to bridge from pads 2726 to pads 2732.

The configuration of system 2700 is useful to connect add-in 2730 to motherboard 2710 through add-in 2720. In one example, some of the pads connecting add-in 2720 to motherboard 2710 are simply pass-through signal lines to connect to add-in 2730. As illustrated, add-in 2730 includes half as many signal lines as add-in 2720 (e.g., N signal lines for add-in 2730 and 2N signal lines for add-in 2720). The difference in signal lines does not have to be an even multiple, but could be any number difference. In one example, some of the signal lines that connect between add-in 2730 and motherboard 2710 are shared or doubled up with add-in 2720. Thus, the connection between add-in 2720 and motherboard 2710 does not have to include dedicated passthrough signal lines for add-in 2730.

Reference to motherboard 2710 is a non-limiting example. The motherboard can represent any system board. While the configuration of system 2700 illustrates motherboard 2710 being edge to edge with add-in 2720, it will be understood that such a configuration is merely one example. In one example, motherboard 2710 and add-in 2720 will meet edge to edge for use with an inline connector. In one example, add-in 2720 can at least partially overlap motherboard 2710 for use with a top mount connector. Similarly, the connection between add-in 2720 and add-in 2730 can be via inline connector or top mount connector.

Figure 28:
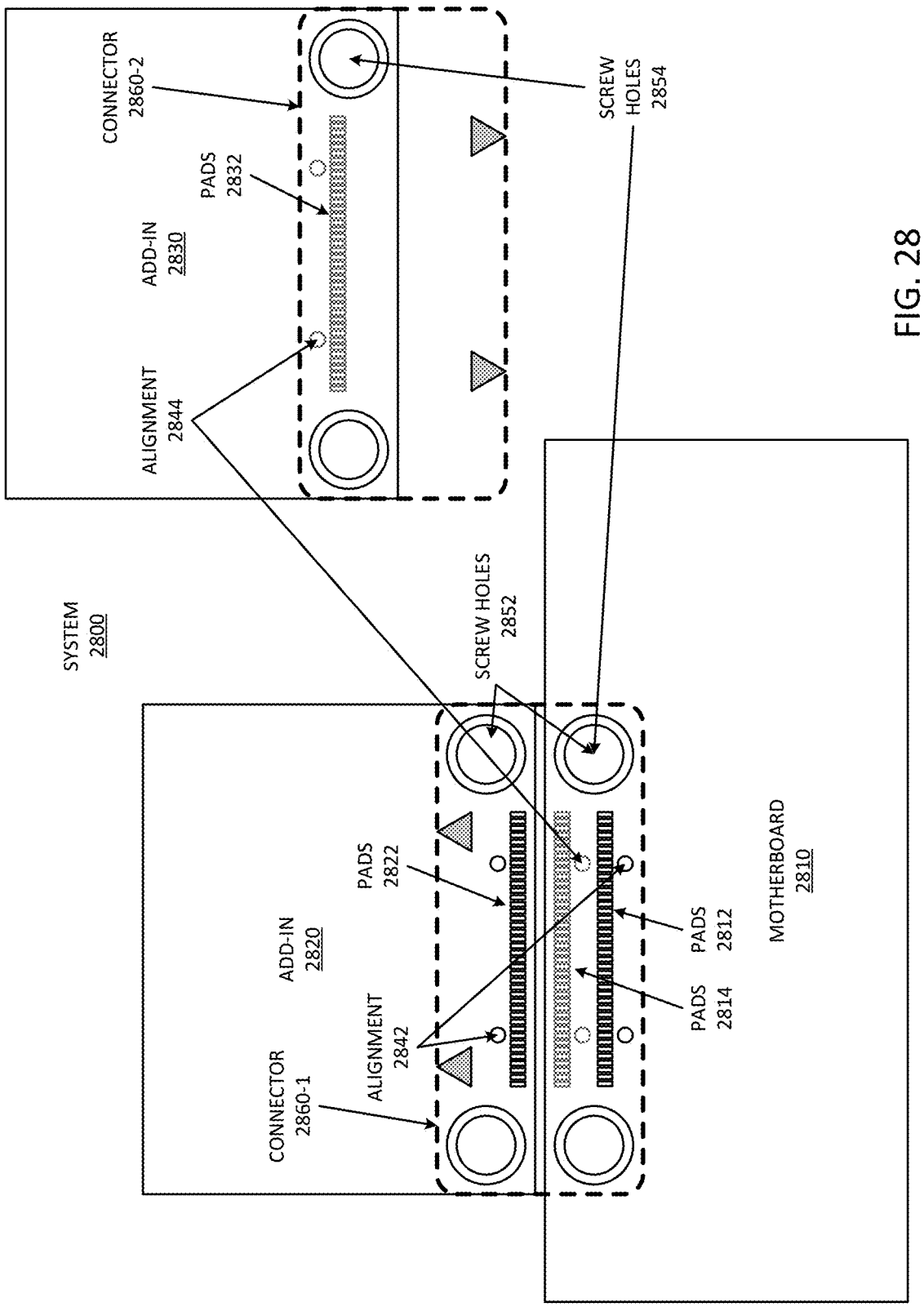
FIG. 28 is a block diagram of an example of board layouts for use with a reversible USM connector.

FIG. 28 is a block diagram of an example of board layouts for use with a reversible USM connector. The reversible connector will be an inline connector. System 2800 illustrates motherboard (or system board) 2810 having two rows of pads 2812 and pads 2814. System 2800 illustrates alternative add-in boards to be used with motherboard 2810.

In one example, system 2800 includes add-in 2820 with a row of pads 2822 that corresponds to pads 2812 of motherboard 2810. Screw holes 2852 receive screws that will secure add-in 2820 to motherboard 2810 with connector 2860-1, which represents connector 2860 in a first orientation. Connector 2860 includes leads, alignment features, and a cover in accordance with any example of a reversible connector described. In the first orientation, connector 2860 keys to alignment features 2842 in motherboard 2810 and add-in 2820.

In one example, system 2800 includes add-in 2830 with row of pads 2832 that corresponds to pads 2814 of motherboard 2810. Screw holes 2854 receive screws that will secure add-in 2830 to motherboard 2810 with connector 2860-2, which represents connector 2860 in a second orientation. In the second orientation, connector 2860 keys to alignment features 2844 in motherboard 2810 and add-in 2830.

Connector 2860 has a generally rectangular outline with electrical leads aligned in a row extending along a long length of the rectangular outline, with a pair of screw holes on either end of the electrical leads. The leads extend across the short distance of the rectangle to bridge from pads on one board to pads on another board. The arrows of connector 2860 illustrate the difference in orientation of connector 2860. In orientation 1, it is observed that the arrows point to the top of the page of system 2800. In orientation 2, the arrows point to the bottom of the page of system 2800, representing that reversing the connector enables switching from connecting to one group of pads (2812) to another group of pads (2814). The add-in boards will include pads in a configuration for a desired connection with motherboard 2810.

Figure 29:
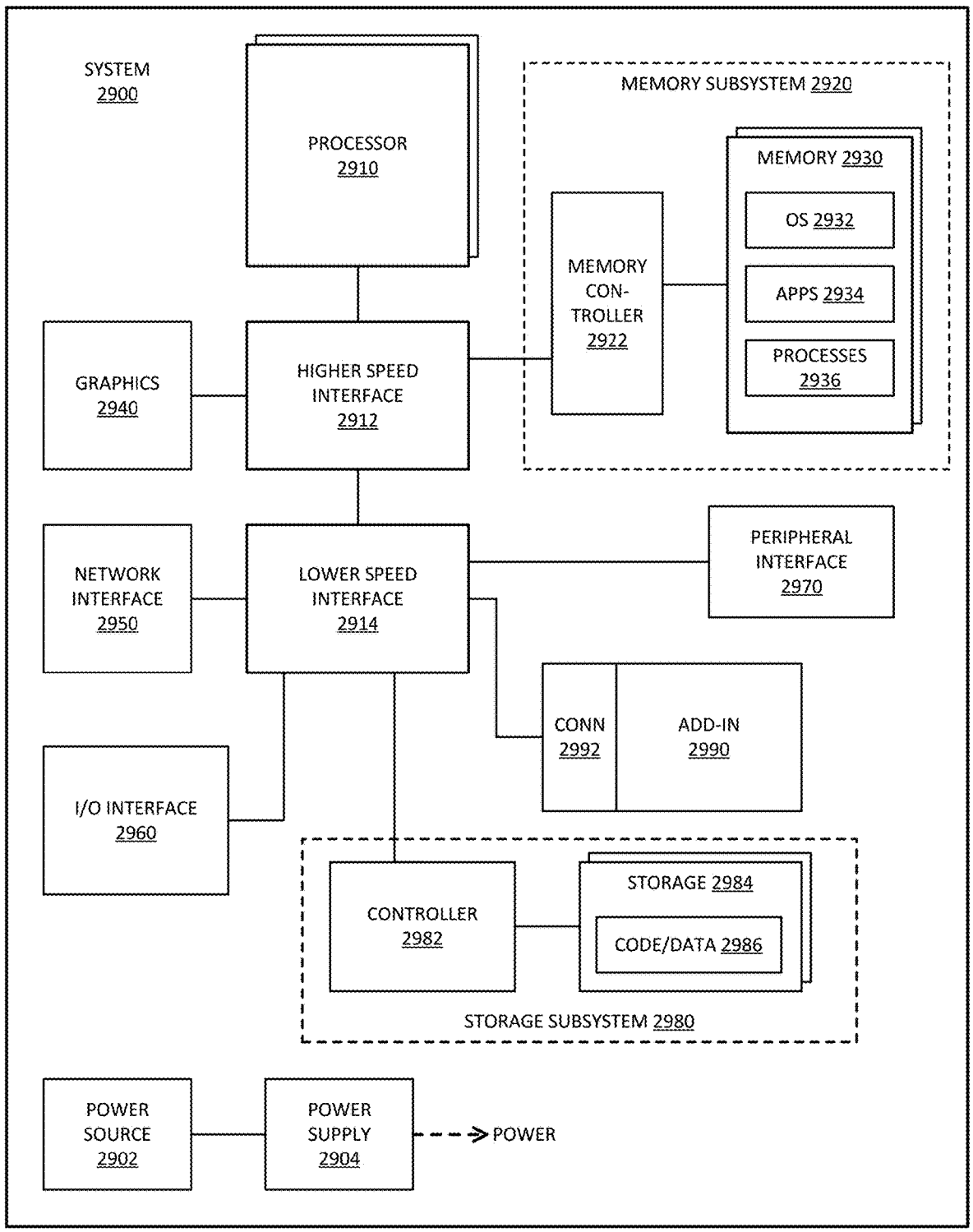
FIG. 29 is a block diagram of an example of a computing system in which an add-in board connected with a USM connector can be implemented.

FIG. 29 is a block diagram of an example of a computing system in which an add-in board connected with a USM connector can be implemented. System 2900 represents a computing device in accordance with any example herein, and can be a laptop computer, a desktop computer, a tablet computer, a server, a gaming or entertainment control system, embedded computing device, or other electronic device. System 2900 provides an example of a system that can implement add-in cards connected to a motherboard or to each other with any example of a low profile connector or USM connector provided.

In one example, system 2900 includes add-in 2990 connected to interface 2914 via connector (CONN) 2992, which represents any example of a low profile connector or USM connector. The low profile connector can include a top mount connector, an inline connector, or a combination of modules with a top mount connector and an inline connector. In one example, add-in 2990 is a wireless communication card, and could thus be an example of a network interface

2950 or I/O interface 2960. In one example, add-in 2990 is an SSD, and could thus be an example of storage subsystem 2980.

System 2900 includes processor 2910 can include any type of microprocessor, central processing unit (CPU), graphics processing unit (GPU), processing core, or other processing hardware, or a combination, to provide processing or execution of instructions for system 2900. Processor 2910 can be a host processor device. Processor 2910 controls the overall operation of system 2900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 2900 includes interface 2912 coupled to processor 2910, which can represent a higher speed interface or a high throughput interface for system components that need higher bandwidth connections, such as memory subsystem 2920 or graphics interface components 2940. Interface 2912 represents an interface circuit, which can be a standalone component or integrated onto a processor die. Interface 2912 can be integrated as a circuit onto the processor die or integrated as a component on a system on a chip. Where present, graphics interface 2940 interfaces to graphics components for providing a visual display to a user of system 2900. Graphics interface 2940 can be a standalone component or integrated onto the processor die or system on a chip. In one example, graphics interface 2940 can drive a high definition (HD) display or ultra high definition (UHD) display that provides an output to a user. In one example, the display can include a touchscreen display. In one example, graphics interface 2940 generates a display based on data stored in memory 2930 or based on operations executed by processor 2910 or both.

Memory subsystem 2920 represents the main memory of system 2900, and provides storage for code to be executed by processor 2910, or data values to be used in executing a routine. Memory subsystem 2920 can include one or more memory devices 2930 such as read-only memory (ROM), flash memory, one or more varieties of random-access memory (RAM) such as DRAM, 3DXP (three-dimensional crosspoint), or other memory devices, or a combination of such devices. Memory 2930 stores and hosts, among other things, operating system (OS) 2932 to provide a software platform for execution of instructions in system 2900. Additionally, applications 2934 can execute on the software platform of OS 2932 from memory 2930. Applications 2934 represent programs that have their own operational logic to perform execution of one or more functions. Processes 2936 represent agents or routines that provide auxiliary functions to OS 2932 or one or more applications 2934 or a combination. OS 2932, applications 2934, and processes 2936 provide software logic to provide functions for system 2900. In one example, memory subsystem 2920 includes memory controller 2922, which is a memory controller to generate and issue commands to memory 2930. It will be understood that memory controller 2922 could be a physical part of processor 2910 or a physical part of interface 2912. For example, memory controller 2922 can be an integrated memory controller, integrated onto a circuit with processor 2910, such as integrated onto the processor die or a system on a chip.

While not specifically illustrated, it will be understood that system 2900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 2900 includes interface 2914, which can be coupled to interface 2912. Interface 2914 can be a lower speed interface than interface 2912. In one example, interface 2914 represents an interface circuit, which can include standalone components and integrated circuitry. In one example, multiple user interface components or peripheral components, or both, couple to interface 2914. Network interface 2950 provides system 2900 the ability to communicate with remote devices (e.g., servers or other computing devices) over one or more networks. Network interface 2950 can include an Ethernet adapter, wireless interconnection components, cellular network interconnection components, USB (universal serial bus), or other wired or wireless standards-based or proprietary interfaces. Network interface 2950 can exchange data with a remote device, which can include sending data stored in memory or receiving data to be stored in memory.

In one example, system 2900 includes one or more input/output (I/O) interface(s) 2960. I/O interface 2960 can include one or more interface components through which a user interacts with system 2900 (e.g., audio, alphanumeric, tactile/touch, or other interfacing). Peripheral interface 2970 can include any hardware interface not specifically mentioned above. Peripherals refer generally to devices that connect dependently to system 2900. A dependent connection is one where system 2900 provides the software platform or hardware platform or both on which operation executes, and with which a user interacts.

In one example, system 2900 includes storage subsystem 2980 to store data in a nonvolatile manner. In one example, in certain system implementations, at least certain components of storage 2980 can overlap with components of memory subsystem 2920. Storage subsystem 2980 includes storage device(s) 2984, which can be or include any conventional medium for storing large amounts of data in a nonvolatile manner, such as one or more magnetic, solid state, 3DXP, or optical based disks, or a combination. Storage 2984 holds code or instructions and data 2986 in a persistent state (i.e., the value is retained despite interruption of power to system 2900). Storage 2984 can be generically considered to be a "memory," although memory 2930 is typically the executing or operating memory to provide instructions to processor 2910. Whereas storage 2984 is nonvolatile, memory 2930 can include volatile memory (i.e., the value or state of the data is indeterminate if power is interrupted to system 2900). In one example, storage subsystem 2980 includes controller 2982 to interface with storage 2984. In one example controller 2982 is a physical part of interface 2914 or processor 2910, or can include circuits or logic in both processor 2910 and interface 2914.

Power source 2902 provides power to the components of system 2900. More specifically, power source 2902 typically interfaces to one or multiple power supplies 2904 in system 2900 to provide power to the components of system 2900. In one example, power supply 2904 includes an AC to DC (alternating current to direct current) adapter to plug into a wall outlet. Such AC power can be renewable energy (e.g., solar power) power source 2902. In one example, power source 2902 includes a DC power source, such as an external AC to DC converter. In one example, power source 2902 or power supply 2904 includes wireless charging hardware to charge via proximity to a charging field. In one example, power source 2902 can include an internal battery or fuel cell source.

Figure 30:
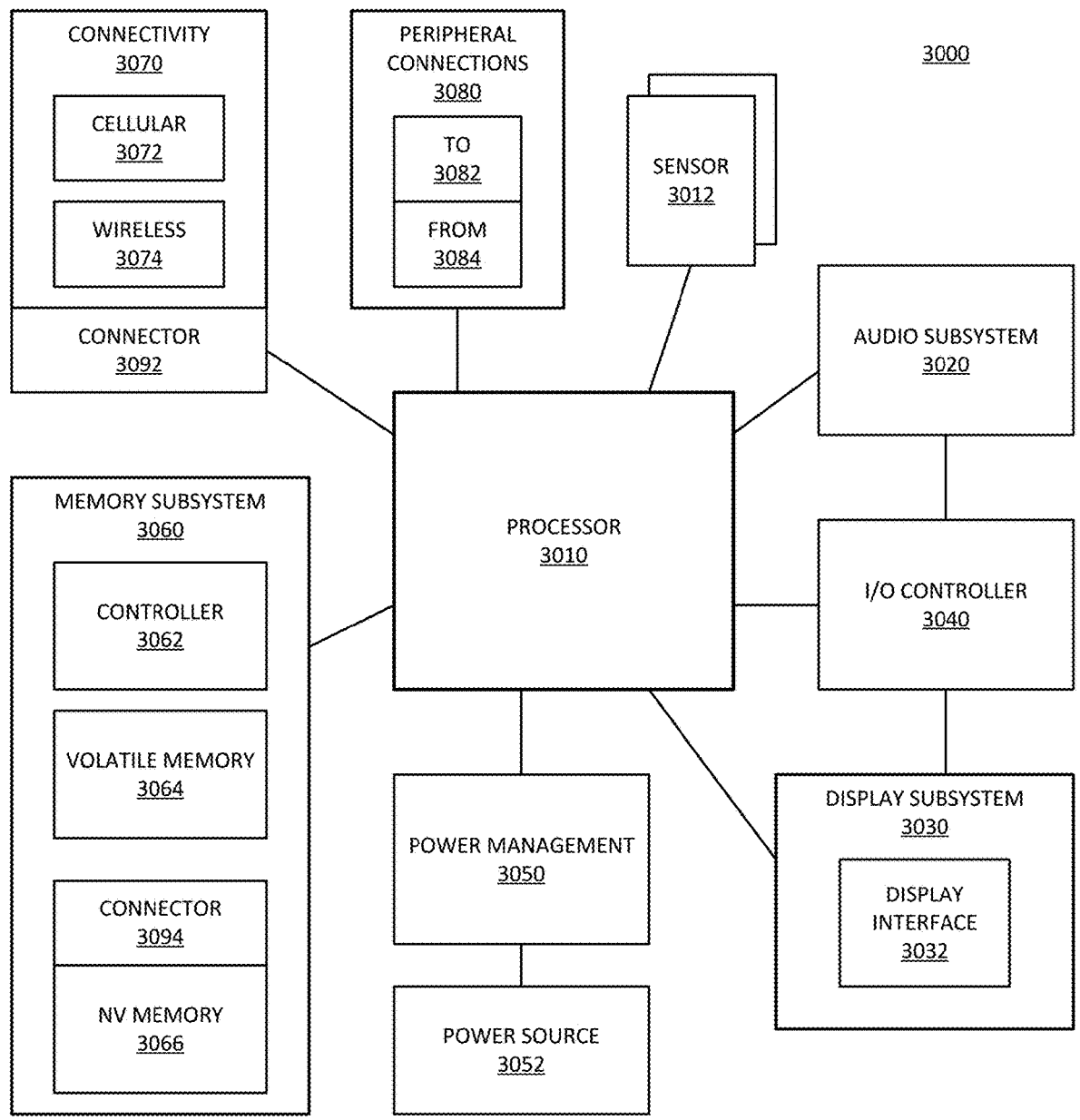
FIG. 30 is a block diagram of an example of a mobile device in which an add-in board connected with a USM connector can be implemented.

FIG. 30 is a block diagram of an example of a mobile device in which an add-in board connected with a USM connector can be implemented. System 3000 represents a mobile computing device, such as a computing tablet, a mobile phone or smartphone, wearable computing device, or other mobile device, or an embedded computing device. It will be understood that certain of the components are shown generally, and not all components of such a device are shown in system 3000. System 3000 provides an example of a system that can implement add-in cards connected to a motherboard or to each other with any example of a low profile connector or USM connector provided.

In one example, system 3000 includes one or more components implemented as add-in modules connected with low profile connectors or USM connectors. The low profile connector can include a top mount connector, an inline connector, or a combination of modules with a top mount connector and an inline connector. In one example, connectivity 3070 represents wireless connectivity for system 3000, and is connected to a processor SOC for processor 3010 via connector 3092. Connector 3092 represents an example of a low profile connector or a USM connector in accordance with any example provided. In one example, one or more peripherals of peripheral connections 3080 are connected with a low profile connector, although the connector is not explicitly shown in system 3000. In one example, memory subsystem 3060 includes nonvolatile (NV) memory 3066, which can be a nonvolatile storage board connected to processor 3010 by low profile connector 3094. Connector 3094 can be an example of a low profile connector in accordance with any example provided.

System 3000 includes processor 3010, which performs the primary processing operations of system 3000. Processor 3010 can be a host processor device. Processor 3010 can include one or more physical devices, such as microprocessors, application processors, microcontrollers, programmable logic devices, or other processing means. The processing operations performed by processor 3010 include the execution of an operating platform or operating system on which applications and device functions are executed. The processing operations include operations related to I/O (input/output) with a human user or with other devices, operations related to power management, operations related to connecting system 3000 to another device, or a combination. The processing operations can also include operations related to audio I/O, display I/O, or other interfacing, or a combination. Processor 3010 can execute data stored in memory. Processor 3010 can write or edit data stored in memory.

In one example, system 3000 includes one or more sensors 3012. Sensors 3012 represent embedded sensors or interfaces to external sensors, or a combination. Sensors 3012 enable system 3000 to monitor or detect one or more conditions of an environment or a device in which system 3000 is implemented. Sensors 3012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 3012 can also include sensors for biometric systems such as fingerprint recognition systems, face detection or recognition systems, or other systems that detect or recognize user features. Sensors 3012 should be understood broadly, and not limiting on the many different types of sensors that could be implemented with system 3000. In one example, one or more sensors 3012 couples to processor 3010 via a frontend circuit integrated with processor 3010. In one example, one or more sensors 3012 couples to processor 3010 via another component of system 3000.

In one example, system 3000 includes audio subsystem 3020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 3000, or connected to system 3000. In one example, a user interacts with system 3000 by providing audio commands that are received and processed by processor 3010.

Display subsystem 3030 represents hardware (e.g., display devices) and software components (e.g., drivers) that provide a visual display for presentation to a user. In one example, the display includes tactile components or touchscreen elements for a user to interact with the computing device. Display subsystem 3030 includes display interface 3032, which includes the particular screen or hardware device used to provide a display to a user. In one example, display interface 3032 includes logic separate from processor 3010 (such as a graphics processor) to perform at least some processing related to the display. In one example, display subsystem 3030 includes a touchscreen device that provides both output and input to a user. In one example, display subsystem 3030 includes a high definition (HD) or ultra-high definition (UHD) display that provides an output to a user. In one example, display subsystem includes or drives a touchscreen display. In one example, display subsystem 3030 generates display information based on data stored in memory or based on operations executed by processor 3010 or both.

I/O controller 3040 represents hardware devices and software components related to interaction with a user. I/O controller 3040 can operate to manage hardware that is part of audio subsystem 3020, or display subsystem 3030, or both. Additionally, I/O controller 3040 illustrates a connection point for additional devices that connect to system 3000 through which a user might interact with the system. For example, devices that can be attached to system 3000 might include microphone devices, speaker or stereo systems, video systems or other display device, keyboard or keypad devices, buttons/switches, or other I/O devices for use with specific applications such as card readers or other devices.

As mentioned above, I/O controller 3040 can interact with audio subsystem 3020 or display subsystem 3030 or both. For example, input through a microphone or other audio device can provide input or commands for one or more applications or functions of system 3000. Additionally, audio output can be provided instead of or in addition to display output. In another example, if display subsystem includes a touchscreen, the display device also acts as an input device, which can be at least partially managed by I/O controller 3040. There can also be additional buttons or switches on system 3000 to provide I/O functions managed by I/O controller 3040.

In one example, I/O controller 3040 manages devices such as accelerometers, cameras, light sensors or other environmental sensors, gyroscopes, global positioning system (GPS), or other hardware that can be included in system 3000, or sensors 3012. The input can be part of direct user interaction, as well as providing environmental input to the system to influence its operations (such as filtering for noise, adjusting displays for brightness detection, applying a flash for a camera, or other features).

In one example, system 3000 includes power management 3050 that manages battery power usage, charging of the battery, and features related to power saving operation. Power management 3050 manages power from power source 3052, which provides power to the components of system 3000. In one example, power source 3052 includes an AC to DC (alternating current to direct current) adapter to plug into a wall outlet. Such AC power can be renewable energy (e.g., solar power, motion based power). In one example, power source 3052 includes only DC power, which can be provided by a DC power source, such as an external AC to DC converter. In one example, power source 3052 includes wireless charging hardware to charge via proximity to a charging field. In one example, power source 3052 can include an internal battery or fuel cell source.

Memory subsystem 3060 includes memory device(s) for storing information in system 3000. Memory subsystem 3060 can include nonvolatile (NV) memory 3066 (state does not change if power to the memory device is interrupted) or volatile memory 3064 (state is indeterminate if power to the memory device is interrupted), or a combination of volatile and nonvolatile memory. Memory subsystem 3060 can store application data, user data, music, photos, documents, or other data, as well as system data (whether long-term or temporary) related to the execution of the applications and functions of system 3000. In one example, memory subsystem 3060 includes controller 3062 (which could also be considered part of the control of system 3000, and could potentially be considered part of processor 3010). Controller 3062 includes a scheduler to generate and issue commands to control access to a controlled memory device, volatile memory 3064 or NV memory 3066. In one example, controller represents more than one controller. In one example, memory subsystem 3060 includes different controllers for volatile memory and nonvolatile memory.

Connectivity 3070 includes hardware devices (e.g., wireless or wired connectors and communication hardware, or a combination of wired and wireless hardware) and software components (e.g., drivers, protocol stacks) to enable system 3000 to communicate with external devices. The external device could be separate devices, such as other computing devices, wireless access points or base stations, as well as peripherals such as headsets, printers, or other devices. In one example, system 3000 exchanges data with an external device for storage in memory or for display on a display device. The exchanged data can include data to be stored in memory, or data already stored in memory, to read, write, or edit data.

Connectivity 3070 can include multiple different types of connectivity. To generalize, system 3000 is illustrated with cellular connectivity 3072 and wireless connectivity 3074. Cellular connectivity 3072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 3074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 3080 include hardware interfaces and connectors, as well as software components (e.g., drivers, protocol stacks) to make peripheral connections. It will be understood that system 3000 could both be a peripheral device ("to" 3082) to other computing devices, as well as have peripheral devices ("from" 3084) connected to it. System 3000 commonly has a "docking" connector to connect to other computing devices for purposes such as managing (e.g., downloading, uploading, changing, synchronizing) content on system 3000. Additionally, a docking connector can allow system 3000 to connect to certain peripherals that allow system 3000 to control content output, for example, to audiovisual or other systems.

In addition to a proprietary docking connector or other proprietary connection hardware, system 3000 can make peripheral connections 3080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a board-to-board connector includes: a lead frame including electrical leads to bridge from first pads on a surface of a first printed circuit board (PCB) to second pads on a surface of a second PCB when the surface of the first PCB and the surface of the second PCB are substantially co-planar; an alignment frame to hold the lead frame, including posts to mate with first alignment holes of the first PCB and with second alignment holes of the second PCB; and an electrically conductive cover to secure over the alignment frame, the cover including openings to receive screws to secure the cover to first screw holes in the first PCB and second screw holes in the second PCB, the cover to electrically couple via the screws to a first ground plane of the first PCB and to a second ground plane of the second PCB.

In one example of the connector, in one example, the electrical leads comprise arch-shaped springs, wherein the electrical leads are to flex to push contact points against the first pads and the second pads when the cover receives the screws. In accordance with any preceding example of the connector, in one example, the lead frame is to bridge from the first pads on the surface of the first PCB to the second pads on the surface of the second PCB, and where the connector does not connect to pads on an opposite surface of the second PCB. In accordance with any preceding example of the connector, in one example, the posts include a first pair of posts to mate with a pair of first alignment holes of the first PCB and a second pair of posts to mate with a pair of second alignment holes of the second PCB, wherein the first pair of posts and the second pair of posts are offset relative to a center of the lead frame. In accordance with any preceding example of the connector, in one example, the cover includes corrugation features orthogonal to the electrical leads. In accordance with any preceding example of the connector, in one example, the cover is to rest against threaded standoffs that fit to first through-hole openings in the first PCB and second through-hole openings in the second PCB to receive the screws. In accordance with any preceding example of the connector, in one example, the cover is to rest against threaded spacers that align with first through-hole openings in the first PCB and with second through-hole openings in the second PCB to receive the screws and allow the screws to secure to threads in a system chassis. In accordance with any preceding example of the connector, in one example, the connector includes: a ground bar to selectively contact electrical leads to be connected to ground pads, the ground bar to physically contact the cover. In accordance with any preceding example of the connector, in one example, the alignment frame comprises a plastic frame having gaps for the ground bar to extend through the plastic frame to physically contact the cover. In accordance with any preceding example of the connector, in one example, the first PCB comprises a system motherboard and wherein the second PCB comprises an add-in board to provide functionality to a host system of the motherboard.

In general with respect to the descriptions herein, in one example a computer system includes: a system board including first pads on a surface of the system board; an add-in board including second pads on a surface of the add-in board, wherein the surface of the add-in board is substantially co-planar with the surface of the system board; a connector to couple the first pads on the surface of the system board to the second pads on the surface of the add-in board, the connector including: a lead frame including electrical leads to bridge from the first pads to the second pads; an alignment frame to hold the lead frame, including posts to mate with first alignment holes of the system board and with second alignment holes of the add-in board; and an electrically conductive cover to secure over the alignment frame; and screws to secure the cover to first screw holes in the system board and second screw holes in the add-in board, the screws to electrically couple the cover to a first ground plane of the system board and to a second ground plane of the add-in board.

In one example of the computer system, in one example, the electrical leads comprise arch-shaped springs, wherein the electrical leads are to flex to push contact points against the first pads and the second pads when the cover receives the screws. In accordance with any preceding example of the computer system, in one example, the posts include a first pair of posts to mate with a pair of first alignment holes of the system board and a second pair of posts to mate with a pair of second alignment holes of the add-in board, wherein the first pair of posts and the second pair of posts are offset relative to a center of the lead frame. In accordance with any preceding example of the computer system, in one example, the cover includes corrugation features orthogonal to the electrical leads. In accordance with any preceding example of the computer system, in one example, the cover is to rest against threaded standoffs that fit to first through-hole openings in the system board and second through-hole openings in the add-in board. In accordance with any preceding example of the computer system, in one example, the connector includes: a ground bar to selectively contact electrical leads to be connected to ground pads, the ground bar to physically contact the cover. In accordance with any preceding example of the computer system, in one example, the alignment frame comprises a plastic frame having gaps for the ground bar to extend through the plastic frame to physically contact the cover. In accordance with any preceding example of the computer system, in one example, the computer system includes: a chassis, wherein the system board is secured to the chassis; and wherein the cover is to rest against spacers that align with first through-hole openings in the system board and with second through-hole openings in the add-in board; wherein screws extend through the cover and though the system board and screws extend through the cover and the add-in board, to secure the cover to the system board and to the add-in board, and secure the system board and the add-in board to the chassis. In accordance with any preceding example of the computer system, in one example, the add-in board comprises a wireless communication board. In accordance with any preceding example of the computer system, in one example, the add-in board comprises a solid state drive (SSD) board. In accordance with any preceding example of the computer system, in one example, the second screw holes in the add-in board comprise screw holes proximate an edge of the add-in board closest to the system board (a "close end"), and further comprising third screw holes on a far end of the add-in board opposite the close end, for screws to secure the far end of the add-in board to a chassis, wherein the system board is secured to the chassis. In accordance with any preceding example of the computer system, in one example, the connector has a generally rectangular outline with the electrical leads aligned in a row extending along a long length of the rectangular outline and each electrical lead bridging across a short length of the rectangular outline, with a first pair of screw holes at one end of the row and a second pair of screw holes at the other end of the row. In accordance with any preceding example of the computer system, in one example, the row comprises two groups of electrical leads, with a third pair of screw holes in a middle of the connector, between the two groups of electrical leads. In accordance with any preceding example of the computer system, in one example, the add-in board comprises a first add-in board and the connector comprises a first connector, and further comprising: the first add-in board including third pads on the surface of the first add-in board; a second add-in board including fourth pads on a surface of the second add-in board, wherein the surface of the second add-in board is substantially co-planar with the surface of the first add-in board; and a second connector to couple the third pads on the surface of the first add-in board to the fourth pads on the surface of the second add-in board. In accordance with any preceding example of the computer system, in one example, the third pads and fourth pads include fewer pads than the first pads and second pads, and wherein the second connector includes fewer electrical leads than the first connector. In accordance with any preceding example of the computer system, in one example, the first connector has a first rectangular outline with 2N electrical leads organized as two groups of electrical leads aligned in a row extending along a long length of the first rectangular outline and each electrical lead bridging across a short length of the first rectangular outline, with screw holes on opposite ends of the row and between the two groups; and wherein the second connector has a second rectangular outline with N electrical leads aligned in a row extending along a long length of the second rectangular outline and each electrical lead bridging across a short length of the second rectangular outline, with screw holes on opposite ends of the row. In accordance with any preceding example of the computer system, in one example, the system board further includes third pads on the surface of the system board and third alignment holes, wherein the first alignment holes correspond to the first pads and the third alignment holes correspond to the third pads; wherein the add-in board further includes fourth pads on the surface of the add-in board and fourth alignment holes, wherein the second alignment holes correspond to the second pads and the fourth alignment holes correspond to the fourth pads; wherein the connector is reversible between a first orientation and a second orientation, wherein in the first orientation, the electrical leads are to bridge from the first pads to the second pads and the posts are to mate with the first alignment holes and with the second alignment holes, and wherein in the second orientation, the electrical leads are to bridge from the third pads to the fourth pads and the posts are to mate with the second alignment holes and with the fourth alignment holes; and wherein the screws align with the first screw holes in the system board and the second screw holes in the add-in board for both orientations. In accordance with any preceding example of the computer system, in one example, the add-in board comprises an inline add-in board, the connector comprises an inline connector, and further comprising: the system board including third pads on the first surface of the system board; a top-mount add-on board including fourth pads on a surface of the top-mount add-on board, wherein the surface of the top-mount add-on board does not face the first surface of the system board, and wherein the surface of the top-mount add-on board is not co-planar with the first surface of the system board; and a top-mount connector to couple the fourth pads to the third pads. In accordance with any preceding example of the computer system, in one example, the computer system includes: a host processor device mounted on the system board; a display communicatively coupled to a host processor of the system board; a network interface communicatively coupled to a host processor of the system board; or a battery to power the computer system. In accordance with any preceding example of the computer system, in one example, the system board comprises a computer motherboard. In accordance with any preceding example of the computer system, in one example, the system board comprises a ruler board.

In general with respect to the descriptions herein, in one example a board-to-board connector includes: a lead frame including electrical leads to bridge from first pads on a first surface of a first printed circuit board (PCB) to second pads on a second surface of a second PCB, wherein the second surface does not face the first surface, and wherein the second PCB does not include pads for the connector on a surface that faces the first surface; an alignment frame to hold the lead frame, including posts to mate with first alignment holes of the first PCB and with second alignment holes of the second PCB; and an electrically conductive case to secure over the alignment frame, the case including openings to receive screws to secure the case to first screw holes in the first PCB and second screw holes in the second PCB, the case to electrically couple via the screws to a first ground plane of the first PCB and to a second ground plane of the second PCB.

In one example of the connector, in one example, the electrical leads comprise two arch-shaped arms offset vertically from each other on a center post of the lead frame, with a first arch-shaped arm to contact the first pads and a second arch-shaped arm to contact the second pads. In accordance with any preceding example of the connector, in one example, the posts include a first pair of posts to mate with a pair of first alignment holes of the first PCB and a second pair of posts to mate with a pair of second alignment holes of the second PCB, wherein the first pair of posts and the second pair of posts are offset relative to a center of the lead frame. In accordance with any preceding example of the connector, in one example, the case includes corrugation features orthogonal to the electrical leads. In accordance with any preceding example of the connector, in one example, the connector includes: a ground bar to selectively contact electrical leads to be connected to ground pads, the ground bar to physically contact the case. In accordance with any preceding example of the connector, in one example, the alignment frame comprises a plastic frame having gaps for the ground bar to extend through the plastic frame to physically contact the case. In accordance with any preceding example of the connector, in one example, the first PCB comprises a primary system board and wherein the second PCB comprises an add-in board to provide functionality to a host system of the primary system board. In accordance with any preceding example of the connector, in one example, the system board comprises a computer system motherboard. In accordance with any preceding example of the connector, in one example, the system board comprises a ruler board. In accordance with any preceding example of the connector, in one example, the first PCB comprises a first add-in board and wherein the second PCB comprises a second add-in board.

In general with respect to the descriptions herein, in one example a computer system includes: a system board including first pads on a first surface of the system board; an add-in board including second pads on a second surface of the add-in board, wherein the second surface of the add-in board does not face the first surface of the system board; and a connector to couple the first pads to the second pads, the connector including: a lead frame including electrical leads to bridge from the first pads to the second pads; an alignment frame to hold the lead frame, including posts to mate with first alignment holes of the system board and with second alignment holes of the add-in board; and an electrically conductive case to secure over the alignment frame; and screws to secure the case to first screw holes in the system board and second screw holes in the add-in board, the screws to electrically couple the case to a first ground plane of the system board and to a second ground plane of the add-in board.

In an example of the connector, in one example, the electrical leads comprise two arch-shaped arms offset vertically from each other on a center post of the lead frame, with first arch-shaped arms to flex to push contact points against the first pads and second arch-shaped arms to push contact points against the second pads when the case receives the screws. In accordance with any preceding example of the connector, in one example, the posts include a first pair of posts to mate with a pair of first alignment holes of the system board and a second pair of posts to mate with a pair of second alignment holes of the add-in board, wherein the first pair of posts and the second pair of posts are offset relative to a center of the lead frame. In accordance with any preceding example of the connector, in one example, the case includes corrugation features orthogonal to the electrical leads. In accordance with any preceding example of the connector, in one example, connector further comprising: a ground bar to selectively contact electrical leads to be connected to ground pads, the ground bar to physically contact the case. In accordance with any preceding example of the connector, in one example, the alignment frame comprises a plastic frame having gaps for the ground bar to extend through the plastic frame to physically contact the case. In accordance with any preceding example of the connector, in one example, the add-in board comprises a wireless communication board. In accordance with any preceding example of the connector, in one example, the add-in board comprises a solid state drive (SSD) board. In accordance with any preceding example of the connector, in one example, the connector is to contact the first pads to the second pads when the add-in board is on the first surface of the system board. In accordance with any preceding example of the connector, in one example, the screws comprise connector screws and the add-in board is to connect to the system board on an edge opposite the connector via mounting screws to connect the add-in board to the system board through standoffs. In accordance with any preceding example of the connector, in one example, the connector includes a footing to contact the second surface of the add-in board, an opposite surface of the add-in board opposite the second surface, and an edge of the add-in board connecting the second surface to the opposite surface. In accordance with any preceding example of the connector, in one example, the connector has a height to provide an air gap between components mounted between the first surface of the system board and a surface of the add-in board opposite the second surface. In accordance with any preceding example of the connector, in one example, the components are mounted to the first surface of the system board, wherein the air gap is between the components and the surface of the add-in board opposite the second surface. In accordance with any preceding example of the connector, in one example, the components are mounted to the surface of the add-in board opposite the second surface, wherein the air gap is between the components and the first surface of the system board. In accordance with any preceding example of the connector, in one example, the add-in board comprises a top-mount add-in board, the connector comprises a top-mount connector, and further comprising: the system board including third pads on the first surface of the system board; an inline add-in board including fourth pads on the first surface of the inline add-in board, wherein a surface of the inline add-in board is substantially co-planar with the first surface of the system board, and wherein the top-mount add-in board is mounted over the inline add-in board; and an inline connector to couple the fourth pads to the third pads. In accordance with any preceding example of the connector, in one example, the computer system includes one or more of: a host processor device mounted on the system board; a display communicatively coupled to a host processor of the system board; a network interface communicatively coupled to a host processor of the system board; or a battery to power the computer system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A board-to-board connector, comprising:
  a lead frame including electrical leads to bridge from first pads on a surface of a first printed circuit board (PCB) to second pads on a surface of a second PCB when the surface of the first PCB and the surface of the second PCB are substantially co-planar;
  an alignment frame to hold the lead frame, including posts to mate with first alignment holes of the first PCB and with second alignment holes of the second PCB; and
  an electrically conductive cover to secure over the alignment frame, the cover including openings to receive screws to secure the cover to first screw holes in the first PCB and second screw holes in the second PCB, the cover to electrically couple via the screws to a first ground plane of the first PCB and to a second ground plane of the second PCB.

2. The connector of claim 1, wherein the electrical leads comprise arch-shaped springs, wherein the electrical leads are to flex to push contact points against the first pads and the second pads when the cover receives the screws.

3. The connector of claim 1, wherein the lead frame is to bridge from the first pads on the surface of the first PCB to the second pads on the surface of the second PCB, and where the connector does not connect to pads on an opposite surface of the second PCB.

4. The connector of claim 1, wherein the posts include a first pair of posts to mate with a pair of first alignment holes of the first PCB and a second pair of posts to mate with a pair of second alignment holes of the second PCB, wherein the first pair of posts and the second pair of posts are offset relative to a center of the lead frame.

5. The connector of claim 1, wherein the cover includes corrugation features orthogonal to the electrical leads.

6. The connector of claim 1, wherein the cover is to rest against threaded standoffs that fit to first through-hole openings in the first PCB and second through-hole openings in the second PCB to receive the screws.

7. The connector of claim 1, wherein the cover is to rest against threaded spacers that align with first through-hole openings in the first PCB and with second through-hole openings in the second PCB to receive the screws and allow the screws to secure to threads in a system chassis.

8. The connector of claim 1, further comprising:
a ground bar to selectively contact electrical leads to be connected to ground pads, the ground bar to physically contact the cover.

9. The connector of claim 8, wherein the alignment frame comprises a plastic frame having gaps for the ground bar to extend through the plastic frame to physically contact the cover.

10. The connector of claim 1, wherein the first PCB comprises a system motherboard and wherein the second PCB comprises an add-in board to provide functionality to a host system of the motherboard.

11. A computer system comprising:
a system board including first pads on a surface of the system board;
an add-in board including second pads on a surface of the add-in board, wherein the surface of the add-in board is substantially co-planar with the surface of the system board;
a connector to couple the first pads on the surface of the system board to the second pads on the surface of the add-in board, the connector including:
  a lead frame including electrical leads to bridge from the first pads to the second pads;
  an alignment frame to hold the lead frame, including posts to mate with first alignment holes of the system board and with second alignment holes of the add-in board; and
  an electrically conductive cover to secure over the alignment frame; and
screws to secure the cover to first screw holes in the system board and second screw holes in the add-in board, the screws to electrically couple the cover to a first ground plane of the system board and to a second ground plane of the add-in board.

12. The computer system of claim 11, wherein the electrical leads comprise arch-shaped springs, wherein the electrical leads are to flex to push contact points against the first pads and the second pads when the cover receives the screws.

13. The computer system of claim 11, wherein the posts include a first pair of posts to mate with a pair of first alignment holes of the system board and a second pair of posts to mate with a pair of second alignment holes of the add-in board, wherein the first pair of posts and the second pair of posts are offset relative to a center of the lead frame.

14. The computer system of claim 11, wherein the cover includes corrugation features orthogonal to the electrical leads.

15. The computer system of claim 11, wherein the cover is to rest against threaded standoffs that fit to first through-hole openings in the system board and second through-hole openings in the add-in board.

16. The computer system of claim 11, the connector further comprising:
a ground bar to selectively contact electrical leads to be connected to ground pads, the ground bar to physically contact the cover.

17. The computer system of claim 16, wherein the alignment frame comprises a plastic frame having gaps for the ground bar to extend through the plastic frame to physically contact the cover.

18. The computer system of claim 11, further comprising:
a chassis, wherein the system board is secured to the chassis; and
wherein the cover is to rest against spacers that align with first through-hole openings in the system board and with second through-hole openings in the add-in board;
wherein screws extend through the cover and though the system board and screws extend through the cover and the add-in board, to secure the cover to the system board and to the add-in board, and secure the system board and the add-in board to the chassis.

19. The computer system of claim 11, wherein the add-in board comprises a wireless communication board.

20. The computer system of claim 11, wherein the add-in board comprises a solid state drive (SSD) board.

21. The computer system of claim 11, wherein the second screw holes in the add-in board comprise screw holes proximate an edge of the add-in board closest to the system board (a "close end"), and further comprising third screw holes on a far end of the add-in board opposite the close end, for screws to secure the far end of the add-in board to a chassis, wherein the system board is secured to the chassis.

22. The computer system of claim 11, wherein the connector has a generally rectangular outline with the electrical leads aligned in a row extending along a long length of the rectangular outline and each electrical lead bridging across a short length of the rectangular outline, with a first pair of screw holes at one end of the row and a second pair of screw holes at the other end of the row.

23. The computer system of claim 22, wherein the row comprises two groups of electrical leads, with a third pair of screw holes in a middle of the connector, between the two groups of electrical leads.

24. The computer system of claim 11, wherein the add-in board comprises a first add-in board and the connector comprises a first connector, and further comprising:
the first add-in board including third pads on the surface of the first add-in board;
a second add-in board including fourth pads on a surface of the second add-in board, wherein the surface of the second add-in board is substantially co-planar with the surface of the first add-in board; and
a second connector to couple the third pads on the surface of the first add-in board to the fourth pads on the surface of the second add-in board.

25. The computer system of claim 24, wherein the third pads and fourth pads include fewer pads than the first pads and second pads, and wherein the second connector includes fewer electrical leads than the first connector.

26. The computer system of claim 25,
wherein the first connector has a first rectangular outline with 2N electrical leads organized as two groups of electrical leads aligned in a row extending along a long length of the first rectangular outline and each electrical lead bridging across a short length of the first rectangular outline, with screw holes on opposite ends of the row and between the two groups; and
wherein the second connector has a second rectangular outline with N electrical leads aligned in a row extending along a long length of the second rectangular outline and each electrical lead bridging across a short length of the second rectangular outline, with screw holes on opposite ends of the row.

27. The computer system of claim 11,
wherein the system board further includes third pads on the surface of the system board and third alignment holes, wherein the first alignment holes correspond to the first pads and the third alignment holes correspond to the third pads;

wherein the add-in board further includes fourth pads on the surface of the add-in board and fourth alignment holes, wherein the second alignment holes correspond to the second pads and the fourth alignment holes correspond to the fourth pads;

wherein the connector is reversible between a first orientation and a second orientation, wherein in the first orientation, the electrical leads are to bridge from the first pads to the second pads and the posts are to mate with the first alignment holes and with the second alignment holes, and wherein in the second orientation, the electrical leads are to bridge from the third pads to the fourth pads and the posts are to mate with the second alignment holes and with the fourth alignment holes; and wherein the screws align with the first screw holes in the system board and the second screw holes in the add-in board for both orientations.

28. The computer system of claim 11, wherein the add-in board comprises an inline add-in board, the connector comprises an inline connector, and further comprising:
the system board including third pads on the first surface of the system board;
a top-mount add-on board including fourth pads on a surface of the top-mount add-on board, wherein the surface of the top-mount add-on board does not face the first surface of the system board, and wherein the surface of the top-mount add-on board is not co-planar with the first surface of the system board; and
a top-mount connector to couple the fourth pads to the third pads.

29. The computer system of claim 11, further comprising one or more of:
a host processor device mounted on the system board;
a display communicatively coupled to a host processor of the system board;
a network interface communicatively coupled to a host processor of the system board; or
a battery to power the computer system.

30. The computer system of claim 11, wherein the system board comprises a computer motherboard.

31. The computer system of claim 11, wherein the system board comprises a ruler board.

* * * * *